(12) United States Patent
Yanai

(10) Patent No.: US 8,542,229 B2
(45) Date of Patent: *Sep. 24, 2013

(54) IDENTIFICATION METHOD OF DATA POINT DISTRIBUTION AREA ON COORDINATE PLANE AND RECORDING MEDIUM

(75) Inventor: Hirokazu Yanai, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 220 days.

This patent is subject to a terminal disclaimer.

(21) Appl. No.: 13/079,876

(22) Filed: Apr. 5, 2011

(65) Prior Publication Data

US 2011/0264404 A1 Oct. 27, 2011

(30) Foreign Application Priority Data

Apr. 27, 2010 (JP) ................. 2010-102018

(51) Int. Cl.
*G06T 17/00* (2006.01)
*G01B 5/26* (2006.01)
*G06K 9/00* (2006.01)

(52) U.S. Cl.
USPC ............ 345/420; 702/156; 382/145; 382/149

(58) Field of Classification Search
USPC .......................................... 345/440; 702/150
See application file for complete search history.

(56) References Cited

U.S. PATENT DOCUMENTS

| 5,240,866 | A | 8/1993 | Friedman et al. |
| 6,876,445 | B2 | 4/2005 | Shibuya et al. |
| 7,557,803 | B2 * | 7/2009 | Furukawa et al. ............ 345/420 |
| 2009/0000995 | A1 | 1/2009 | Yanai |
| 2010/0110078 | A1 * | 5/2010 | Yanai ............................ 345/440 |

FOREIGN PATENT DOCUMENTS

| JP | 6-61314 | 3/1994 |
| JP | 4038356 | 11/2007 |
| JP | 2009-10303 | 1/2009 |
| JP | 2010-108236 | 5/2010 |

* cited by examiner

*Primary Examiner* — Ulka Chauhan
*Assistant Examiner* — Andrew J Gill
(74) *Attorney, Agent, or Firm* — Cooper & Dunham LLP

(57) ABSTRACT

A disclosed identification method of identifying a data point distribution area on a coordinate plane includes selecting a data point as a first representative point, setting the first representative point as an initial reference point, setting a direction passing through the initial reference point as an initial representative point selection direction, selecting an initial data point direction having a smallest angle relative to the initial representative point selection direction in a predetermined rotation direction when viewed from the initial representative point selection direction, selecting a data point corresponding to the initial data point direction as a second representative point of the data point distribution area, and determining whether there is an overlapping area where a distribution representative point area overlaps a determination area.

19 Claims, 34 Drawing Sheets

IDENTIFICATION METHOD OF DATA POINT DISTRIBUTION AREA ON COORDINATE PLANE AND RECORDING MEDIUM

CROSS-REFERENCE TO RELATED APPLICATIONS

The present application claims priority under 35 U.S.C §119 based on Japanese Patent Application No. 2010-102018 filed Apr. 27, 2010, the entire contents of which are hereby incorporated herein by reference.

BACKGROUND OF THE INVENTION

1. Field of the Invention

The present invention relates to an identification method of determining whether a data point distribution area is distributed in a specific determination area and a recording medium storing a program causing a computer to execute the identification method.

2. Description of the Related Art

Semiconductor devices (a.k.a chips) are manufactured through various processes. Various defects during the various processes may cause the degradation of the quality and the decrease of the yield rate of the semiconductor devices. In this regard, to improve and stabilize the yield rate, the pattern defect inspection and the particle (contamination) inspection are conducted after a predetermined process to check the existence of the defects.

Further, in each process, after the pattern is formed, the electric characteristic test (wafer test) is performed on each chip on the wafer to detect the defects.

Of the information obtained as a result of inspection or test, there is information indicating defects on the wafer and a distribution of defective chips. In the following, the defects on the wafer or the distribution of defective chips is called "defect distribution".

The defect distribution may be classified into two types: in one type, the defect distribution is substantially uniformly distributed across the wafer without being concentrated on a specific area on the wafer; and in the other type, the defect distribution is unevenly distributed and may be concentrated on a specific area on the wafer. The defects in the former type where the defects are evenly distributed may be called random defects. On the other hand, the defects in the latter type where the defects are concentrated on a part of the wafer may be called clustering defects.

The defect distribution in which the defects are concentrated (hereinafter "concentrated defect distribution") is mainly caused by the problems in the manufacturing processes, manufacturing apparatuses and the like. Because of this feature, by investigating the manufacturing processes, the manufacturing apparatuses, and the like, the cause of the lowering of the yield rate may be detected.

As one example of using the information, a status of the defect distribution on a wafer is analyzed first, and based on the analysis, the cause of the defects in the manufacturing processes, manufacturing apparatuses, and the like is estimated (see, for example, Patent Documents 1 and 2).

Patent document 1 describes a method of specifying a cause of defect by grouping (classifying) the wafer based on a status of the clustered defect distribution and then determining whether the status is similar to a known pattern of the defect distribution.

Patent document 2 describes a method of classifying the categories of the defects based on the distribution status of the defect into repetitive defects, congestion defects, liner defects, ring/lump defects, random defects and the like.

Generally, the position of the chip is expressed using the X axis and the Y axis. To express the information of data group indicating the chip positions on a wafer, those data are expressed on the XY rectangular coordinate plane.

As described above, the concentrated defect distribution in the manufacturing process of manufacturing the semiconductor devices may be caused by the problems on the manufacturing apparatus and the like. Therefore, when the concentrated defect distribution is detected, a defective process may be estimated by collecting the information of lots of the wafers having a similar status of the defect distribution and then investigating the relevant recorded data indicating, for example, which processing apparatus was used and when the process was performed in the manufacturing processes.

In this case, whether the defective distribution is similar to the known pattern of the defect distribution is determined depending on whether the defective distribution exists on a specific area on a wafer (coordinate plane).

In the methods of Patent Documents 1 and 2, the position of the defective distribution is specified by processing data indicating the positions of the defects and defective chips. However, all of the data points of the defective distribution have respective data (e.g., positional information). Namely, under a status where all the data points included in the data point distribution area on the coordinate plane have the respective data, it is determined whether the data point distribution area is distributed on a specified determination area set on the coordinate plane.

Patent Document 1: Japanese Patent Application Publication No. 06-61314

Patent Document 2: Japanese Patent No. 4038356

SUMMARY OF THE INVENTION

According to one aspect of the present invention, while the information amount expressing the data point distribution area on the coordinate plane is decreased, it is determined whether the data point distribution area is distributed on a specified determination area set on the coordinate plane.

According to another aspect of the present invention, there is provided an identification method of identifying a data point distribution area on a coordinate plane. The identification method includes: a representative point selection first step of selecting any one of data points as a first representative point of a data point distribution area on a coordinate plane where data of a data group to be determined are expressed as points, the data group to be determined including plural data including two variables as a pair; a representative point selection second step of selecting one of a clockwise direction and a counterclockwise direction as a selection rotation direction, setting the first representative point as an initial reference point, setting any one of directions passing through the initial reference point as an initial representative point selection direction, from among a plurality of initial data point directions passing through the initial reference point and extending toward the data points, selecting the initial data point direction having a smallest angle relative to the initial representative point selection direction in the selection rotation direction when viewed from the initial representative point selection direction, and selecting a data point corresponding to the initial data point direction as a second representative point of the data point distribution area; a representative point selection third step of repeating processes including: selecting a last representative point as a next reference point, the last representative point being either the second representative point or a representative point selected in this representative point selection third step and being selected last, setting a reference point as a last reference point, the reference point being used in selecting the last representative point, selecting any one of the directions extending in a range between a first direction and a second direction as a next representative point selection direction, the first direction passing through the next reference point and extending toward the last reference point, the second direction being rotated from the first direction in the selection rotation direction by an angle of 180 degrees, from among a plurality of next data point directions passing through the next reference point and extending toward the data points other than the last representative point, selecting the next data point direction having a smallest angle relative to the next representative point selection direction in the selection rotation direction when viewed from the next representative point selection direction, and selecting a next data point corresponding to the next data point direction as a next representative point of the data point distribution area; and a determination step of determining whether there is an overlapping area where a distribution representative point area overlaps a determination area, the distribution representative point area being defined by connecting the representative points with lines, the determination area being a specific area set on the coordinate plane, and determining, when determining that there is the overlapping area, that the data group to be determined is a relevant data group.

BRIEF DESCRIPTION OF THE DRAWINGS

Other objects, features, and advantages of the present invention will become more apparent from the following description when read in conjunction with the accompanying drawings, in which.

DETAILED DESCRIPTION OF THE PREFERRED EMBODIMENTS

First, an embodiment of the present invention is described with reference to result data of pattern defects.

Figure 1:
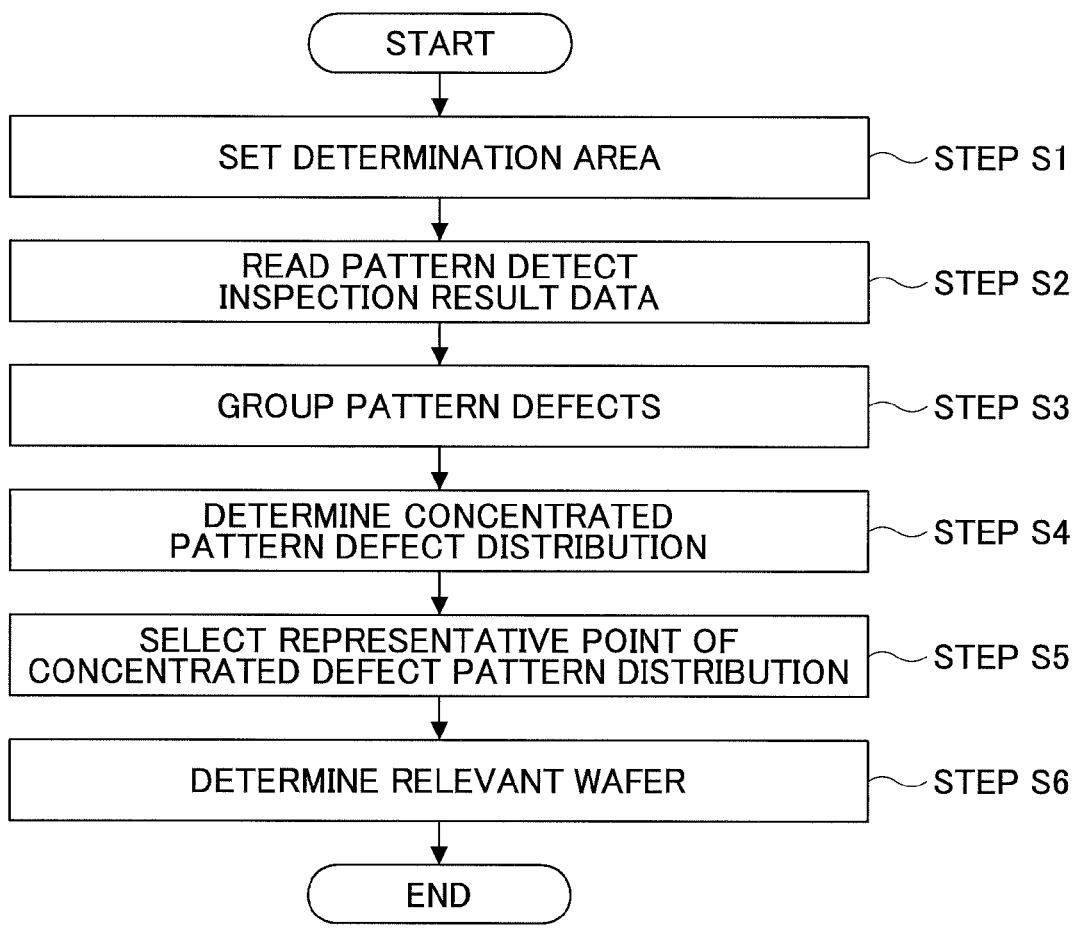
FIG. 1 is a flowchart illustrating a processing a method according to an embodiment of the present invention.
Figure 2:
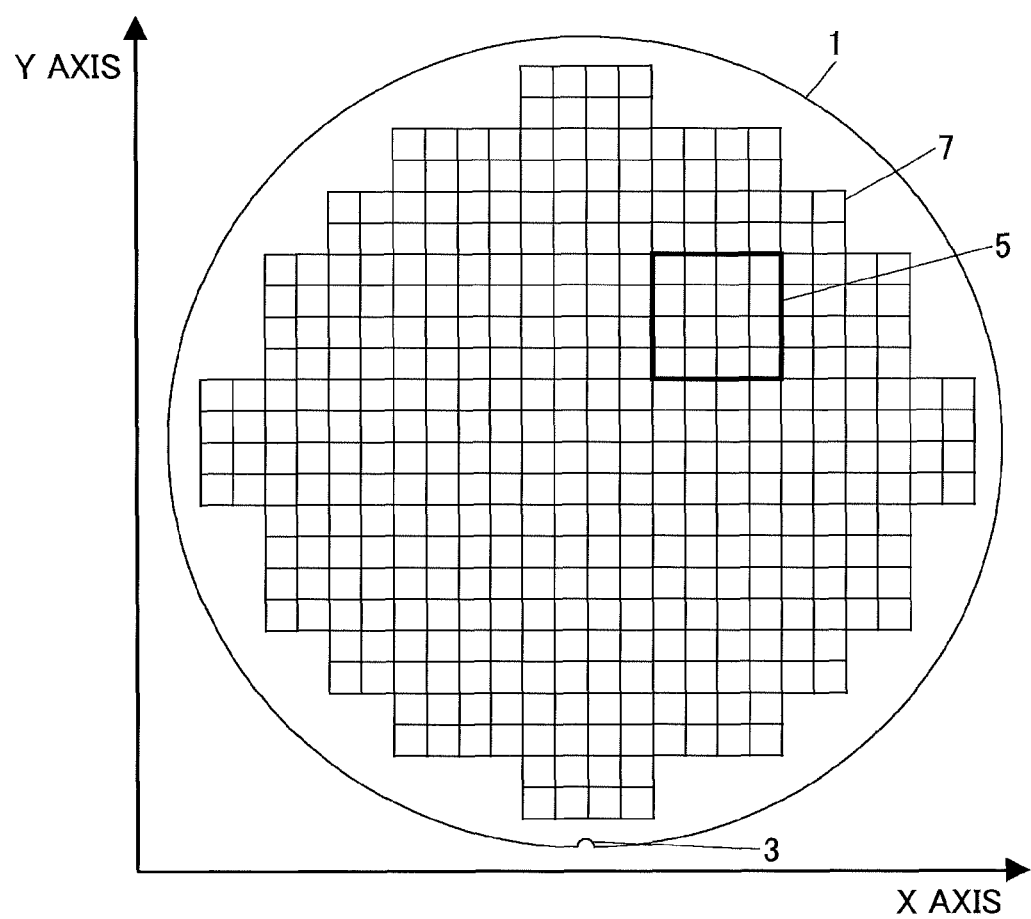
FIG. 2 is a drawing illustrating a determination area set on a wafer.
Figure 3:
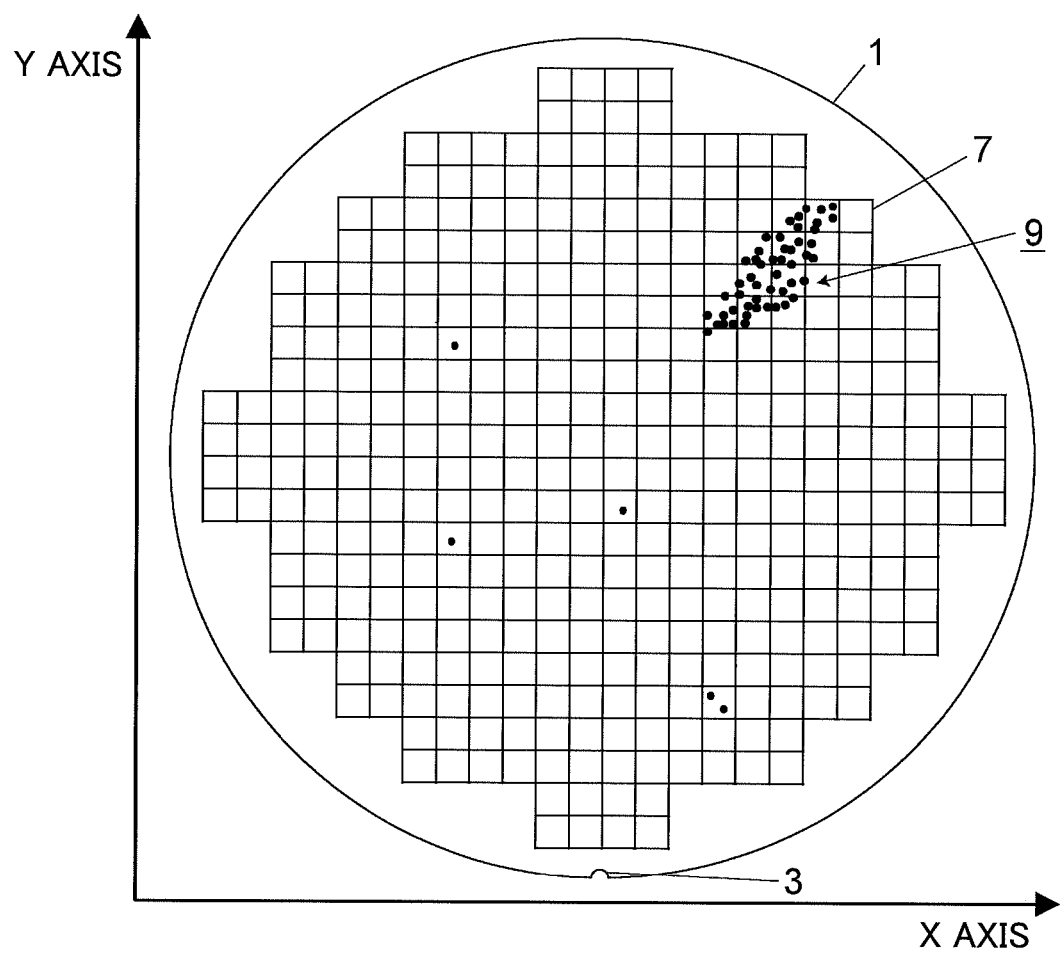
FIG. 3 is a drawing illustrating pattern defect positions on the wafer.
Figure 4:
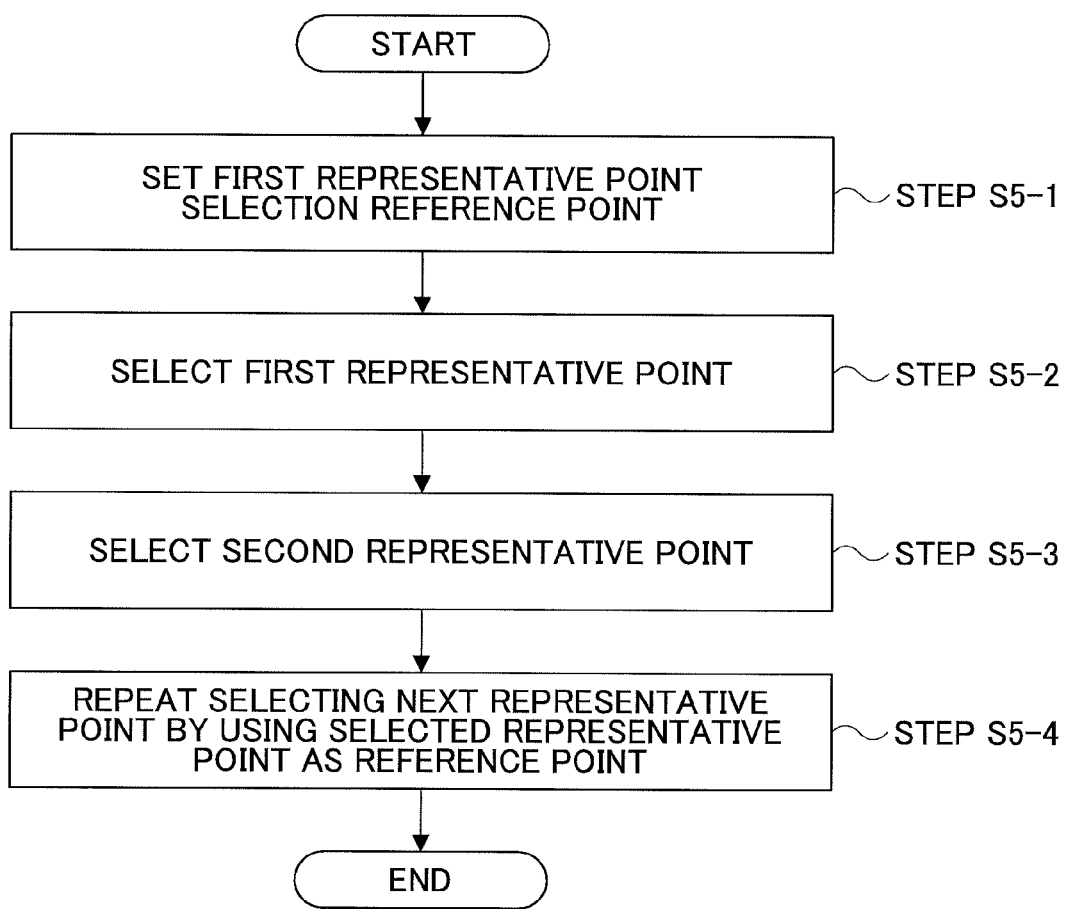
FIG. 4 is a flowchart illustrating a representative point selection step for the concentrated pattern defect distribution.
Figure 5:
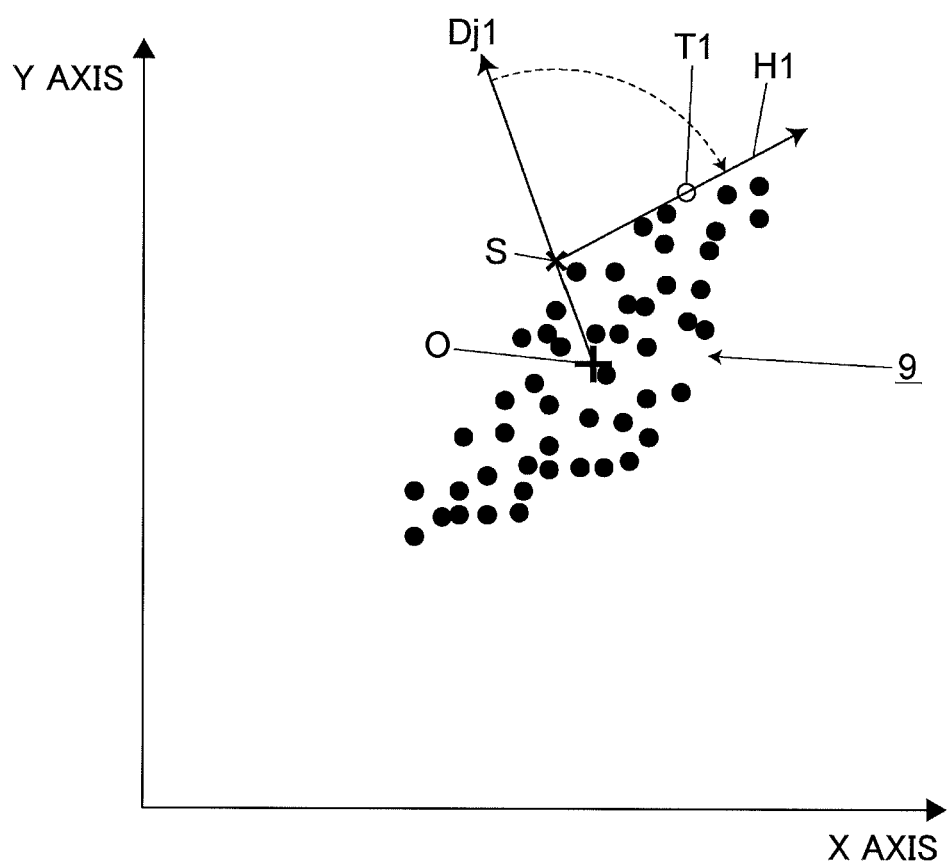
FIG. 5 is a coordinate plane diagram of an enlarged concentrated pattern defect distribution of FIG. 3 and illustrates a process of obtaining a first representative point.
Figure 6:
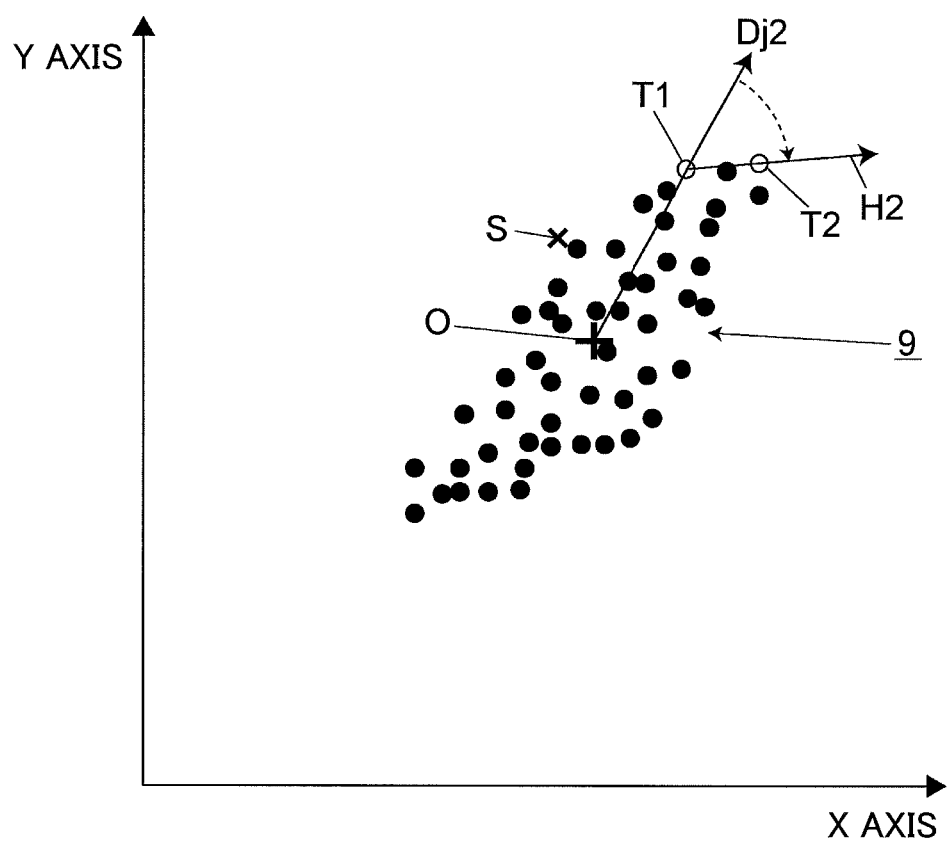
FIG. 6 is the coordinate plane diagram illustrating a process of obtaining a next representative point using the first representative point as a next reference point.
Figure 7:
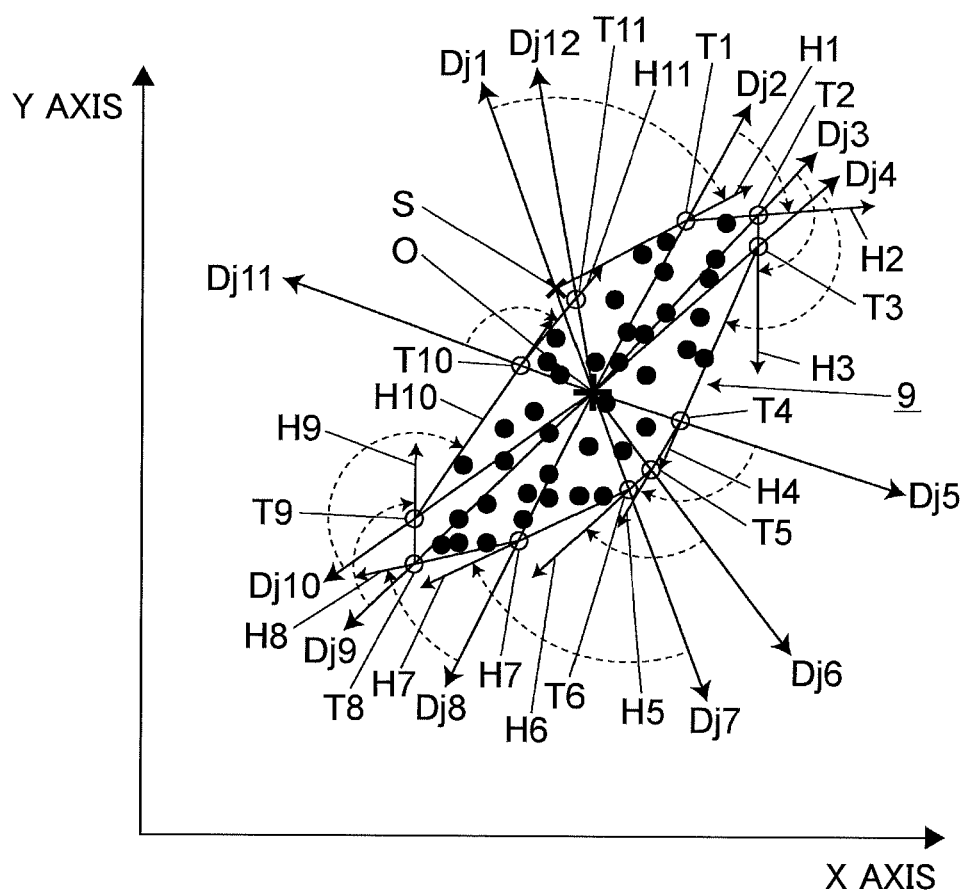
FIG. 7 is the coordinate plane diagram illustrating a first representative point selection reference point, data point directions, representative points, and determination directions having been used to obtained the last representative points.
Figure 8:
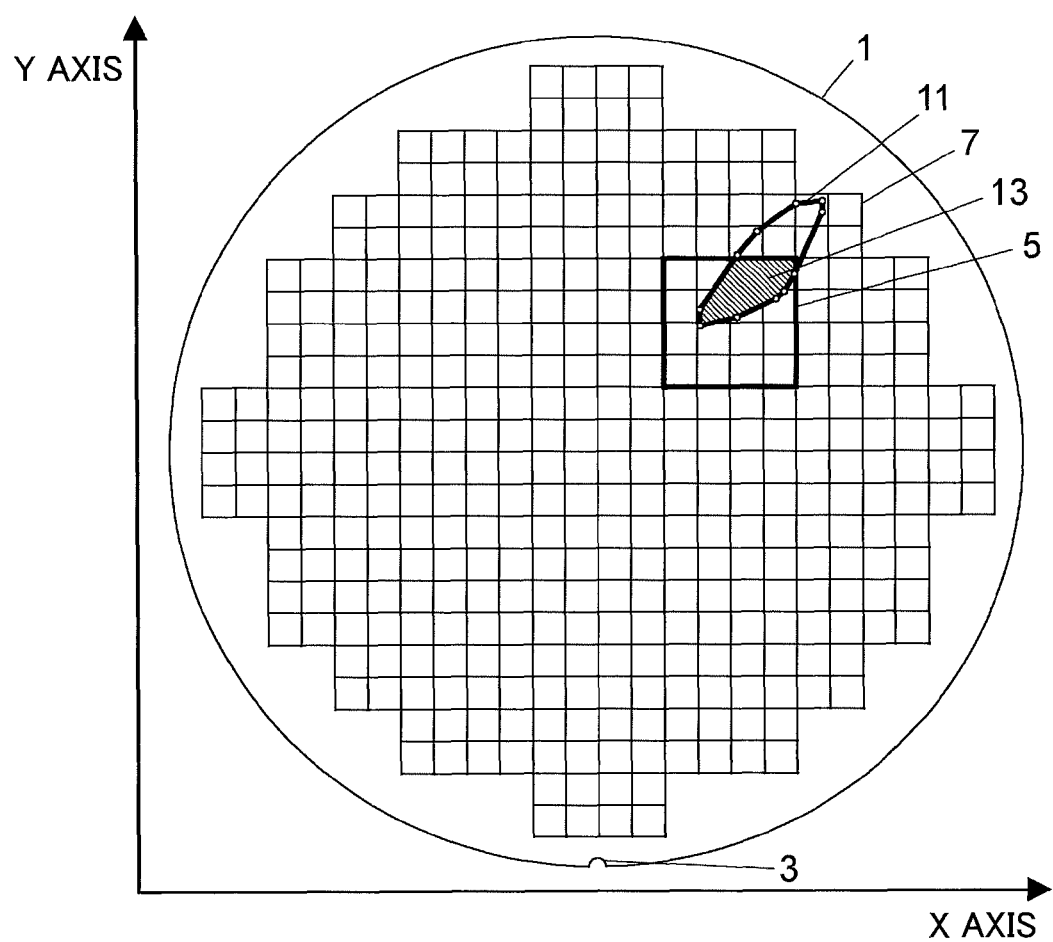
FIG. 8 is a drawing where the determination area and a concentrated pattern defect distribution representative point area are displayed so as to be overlapped with each other on the same coordinate plane.

FIG. 1 is a flowchart illustrating a method according to an embodiment of the present invention. FIG. 2 illustrates a determination area set on a wafer. FIG. 3 illustrates pattern defect positions on the wafer. FIG. 4 is a flowchart illustrating a distribution representative point selection step of a concentrated pattern defect distribution. FIG. 5 is an enlarged view of a pattern defect group and further illustrates a process of obtaining a first representative point. FIG. 6 illustrates a process of obtaining the next representative point using the first representative point as the next reference point. FIG. 7 illustrates a reference point used for selecting the first representative point (hereinafter, the reference point is referred to as "a first representative point selection reference point"), data point directions, representative points, and determination directions until the last representative point is determined. FIG. 8 is a drawing where the determination area and a concentrated pattern defect distribution representative point area are displayed so as to be overlapped with each other on the same coordinate plane. This embodiment is described with reference to FIGS. 1 through 8.

Step S1: A determination area 5 is set on the coordinate plane of pattern defect inspection result data. Herein, it is assumed that the determination area 5 is set on a part of the upper right-hand side when a wafer 1 is set in a manner such that a notch 3 of the wafer 1 is arranged on the lower side as illustrated in FIG. 2. The notch 3 refers to a mark on the wafer 1 so that the crystal orientation of the silicon can be recognized. The wafer 1 includes chips 7 arranged in a matrix manner.

Step S2: Next, pattern defect inspection result data associated with target wafer information (i.e., information of the wafer to be determined (inspected)) are read from an inspection apparatus or a database storing the pattern defect inspection result data. The pattern defect inspection result data include positional coordinate information of pattern defects. FIG. 3 illustrates pattern defect positions on the wafer 1. In FIG. 3, the pattern defects are expressed as dots.

Step S3: Next, the pattern defects are grouped. To that end, for example, mutual distances between the data points representing the pattern defects are obtained (calculated). Then, the data points having the mutual distance less than a predetermined threshold value are determined to be included in the same group. However, a method of grouping the data points is not limited to this method, and any other appropriate method may be alternatively used for the grouping.

Step S4: Next, the concentrated pattern defect distribution is selected (determined) from the groups of the pattern defects. To that end, for each of the groups of the pattern defect, it is determined whether the number of the pattern defects is equal to or greater than, for example, five. In this case, when determining that the number of the pattern defects is equal to or greater than five, the pattern defect group is determined to be the concentrated pattern defect distribution. In this case of FIG. 3, the pattern defect group on the upper right-hand side on the wafer of FIG. 3 is determined to be the concentrated pattern defect distribution 9. In this embodiment, the data points included in the concentrated pattern defect distribution 9 are a data group to be determined. However, in this case, all pattern defect data may be treated as the data group to be determined, or only the pattern defect data in a specific area may be treated as the data group to be determined. Further, in this embodiment, the data points included in the concentrated pattern defect distribution 9 are candidates to be selected as the representative points of the data point distribution area.

Step S5: Next, the representative points of the concentrated pattern defect distribution 9 are determined (selected). To that end, plural data points representing the contour (outline) of the distribution area of the concentrated pattern defect distribution 9 are determined (selected) to be the representative points of the concentrated pattern defect distribution 9. With reference to FIGS. 4 through 7, a step of selecting the representative points of the distribution area (hereinafter "a representative point selection step") is described.

Step S5-1: Any point on the coordinate plane is set (selected) as a reference point for selecting a first representative point S (hereinafter "a first representative point selection reference point S") (first representative point selection reference point setting step). Then, any other point having a coordinate value different from that of the first representative point selection reference point S is set (selected) as a determination center point O (determination center point setting step).

The determination center point O is disposed within an area defined by connecting all the points in the concentrated pattern defect distribution 9 to each other (i.e., each of the points in the concentrated pattern defect distribution 9 is connected to any other points in the concentrated pattern defect distribution 9). In this embodiment, the determination center point O is located at the gravity center of the distribution area of the data points. Herein, the gravity center of the distribution area of the data points refers to a point having a pair of values (as a coordinate value) determined by separately averaging for each of the pair of values of plural of the data points (e.g., if there are data points A1(x1,y1), A2(x1, Y2), ..., An(Xn, Yn), the point Ag(Xg,Yg) is obtained by averaging as Ag((x1+X2+ ... +Xn)/n, (y1+y2+ ... +yn)/n)).

Further, the first representative point selection reference point S may be located at a point as long as the coordinate value of the first representative point selection reference point S is different from the coordinate value of the determination center point O. In this embodiment, the first representative point selection reference point S is located at the position as illustrated in FIG. 5.

Step S5-2: As illustrated in FIG. 5, a direction extending from the determination center point O to the first representative point selection reference point S is set as an initial determination direction Dj1. In this embodiment, the initial determination direction Dj1 denotes a direction to be used for selecting the first representative point (hereinafter "the first representative point selection direction"). One of the clockwise direction or the counterclockwise direction is selected as a first representative point selection rotation direction. Herein, the clockwise direction is selected as the first representative point selection rotation direction. From among plural first representative point selection data point directions extending from the first representative point selection reference point S to the respective data points, the first representative point selection data point direction H1 having the smallest angle relative to the first representative point selection direction Dj1 in the clockwise direction when viewed from the first representative point selection direction Dj1 is determined, and the first representative point T1 corresponding to the first representative point selection data point direction H1 is selected (determined) (first representative point selecting step). The first representative point selection reference point setting step and the first representative point selecting step constitute a representative point selection first step.

In FIG. 5, from among the plural first representative point selection data point directions, only the first representative point selection data point direction H1 is illustrated where the determination direction Dj1 first overlaps the data point when the determination direction Dj1 which is the first representative point selection direction as well is rotated in the clockwise direction from the initial determination direction Dj1 around the first representative point selection reference point S. For explanatory purposes, FIG. 5 illustrates where the initial determination direction Dj1 is rotated. However, in a practical process, it may not be necessary to actually rotate the determination direction Dj1. This is because when an angle is defined between the first representative point selection data point direction and the first representative point selection direction Dj1, the first representative point selection data point direction being rotated in the clockwise direction from the first representative point selection direction Dj1, the angle may be obtained by using a trigonometric function. Therefore, from among plural of the angles obtained for the respective first representative point selection data point directions, the smallest angle is obtained, and then, the data point corresponding to the smallest angle is selected as the first representative point T1.

As described above, in the embodiments and figures described herein, for explanatory purposes, the representative point selection directions are rotated around the respective reference points. However, as described above, it may not be necessary to actually rotate the representative point selection directions in the respective practical processes. In the relevant steps, the angles defined between the representative point selection data point directions and the respective representative point selection directions, the representative point selection data point directions being rotated from the respective representative point selection directions, may be obtained by using a trigonometric function.

Step S5-3: Next, as illustrated in FIG. 6, a direction extending from the determination center point O to the first representative point T1 is set as a determination direction Dj2. In this embodiment, the determination direction Dj2 denotes a direction to be used for selecting the second representative point (hereinafter "second (or initial) representative point selection direction"). One of the clockwise direction or the counterclockwise direction is selected as the second representative point selection rotation direction. Herein, the rotational direction of the second representative point selection rotation direction may be the same as the rotational direction of the first representative point selection rotation direction or opposite to the rotational direction of the first representative point selection rotation direction. In this embodiment, it is assumed that the second representative point selection rotation direction is the same as that of the first representative point selection rotation direction. The first representative point T1 is set as an initial reference point.

From among plural of the second representative point selection data point directions extending from the initial reference point T1 to the respective data points, the second representative point selection data point direction H2 having the smallest angle relative to the second representative point selection direction Dj2 in the clockwise direction when viewed from the second representative point selection direction Dj2 is determined, and the second representative point T2 corresponding to the second representative point selection data point direction H2 is selected (determined) (representative point selection second step).

Step S5-4: Next, as illustrated in FIG. 7, a direction extending from the determination center point O to the second representative point T2 is set as a determination direction Dj3. In this embodiment, the determination direction Dj3 denotes a direction to be used for selecting the third representative point (hereinafter "third (or next) representative point selection direction"). The clockwise direction is selected as the next representative point selection rotation direction. The second representative point T2 obtained in step 5-3 is set as the next reference point.

From among plural of the third representative point selection data point directions extending from the next reference point T2 to the respective data points, the third representative point selection data point direction H3 having the smallest angle relative to the third representative point selection direction Dj3 in the clockwise direction when viewed from the third representative point selection direction Dj3 is determined, and the third representative point T3 corresponding to the third representative point selection data point direction H3 is selected (determined) (third representative point selecting step).

After that, sequentially, a direction extending from the determination center point O to the last selected representative point (hereinafter last representative point) is set as the determination direction and the representative point selection direction. The last representative point is set as the next reference point.

From among plural of the representative point selection data point directions extending from the next reference point to the respective data points, the representative point selection data point direction having the smallest angle relative to the representative point selection direction in the clockwise direction when viewed from the representative point selection direction is determined, and the data point corresponding to the representative point selection data point direction is selected (determined) as the representative point. This selection process of selecting the representative points is continuously repeated until the determination direction sequentially obtained is rotated from the initial determination direction in the clockwise direction by an angle of 360 degrees or more or until the same data point is selected as the representative point again. In this embodiment, after the third representative point T3 is selected, the determination directions which are the representative point selection directions Dj4 through Dj11 are used, so that the respective representative points T4 through T11 are selected.

After the representative point T11 is selected, a direction extending from the determination center point O to the representative point T11 is obtained as the determination direction Dj12. As illustrated in FIG. 7, the determination direction Dj12 is disposed at the clockwise direction side of the initial determination direction Dj1 when viewed from the last determination direction Dj11. Therefore, it is determined that the determination direction is rotated from the initial determination direction in the clockwise direction by an angle of 360 degrees or more, and the selection process of selecting the representative points is terminated (representative point selection third step).

Further, in the above description with reference to FIG. 3, a case is described where the number of the concentrated pattern defect distributions 9 is one. However, in step S4, when determining that plural concentrated pattern defect distributions 9 are detected for the pattern defect inspection data of the wafer information, the representative point selection step of step S5 is performed on each of the plural concentrated pattern defect distributions 9.

Referring back to FIG. 1, the method in the flowchart of FIG. 1 is further described.

Step S6: It is determined whether there is an overlapping area 13 where a concentrated pattern defect distribution representative point area 11 overlaps the determination area 5, the concentrated pattern defect distribution representative point area 11 being formed by sequentially connecting the representative points of the concentrated pattern defect distribution 9 using lines (see FIG. 8). In this case, the concentrated pattern defect distribution representative point area 11 is defined by sequentially connecting eleven representative points T1 through T11 with lines in a manner such that the lines are not crossed over each other. For example, such a concentrated pattern defect distribution representative point area 11 may be defined by connecting from the representative point as the start point to the next representative point of the adjacent area with a line and connecting in the same manner in the clockwise or counterclockwise direction. In FIG. 8, a case is described where the lines between the representative points are straight lines. However, the present invention is not limited to this configuration. For example, by using the "DrawClosedCurve" method of Visual Basic (trademark of Microsoft Corp.) or the like, the representative points of the concentrated pattern defect distribution representative point area 11 may be connected with smooth curves passing through the representative points. This alternative connecting method may also applied to the other embodiments described below.

As illustrated in FIG. 8, the concentrated pattern defect distribution representative point area 11 overlaps the determination area 5 forming the overlapping area 13. Accordingly, the concentrated pattern defect distribution 9 is determined to be the data group to be obtained (hereinafter may be referred to as a "relevant data group"). Further, the wafer information corresponding to the pattern defect inspection result data including the concentrated pattern defect distribution 9 is determined to be the wafer information having the pattern defect distribution to be obtained (hereinafter may be referred to as a "relevant wafer information") (determination step).

Further, in a case where, in step S4, it is determined that there are plural concentrated pattern defect distributions in one wafer information, and when, in step S5, the selection process of selecting the representative points for each of the concentrated pattern defect distributions, the distribution representative point area is defined for each of the concentrated pattern defect distributions, and it is determined whether there is the overlapped area where the distribution representative point area overlaps the determination area for each of the distribution representative point areas.

In this embodiment, the concentrated pattern defect distribution representative point area 11 is expressed by using eleven representative points. Because of this feature, the information amount expressing the concentrated pattern defect distribution representative point area 11 is less than the information amount expressing the concentrated pattern defect distribution 9. Namely, in this embodiment, it may be determined whether the concentrated pattern defect distribution 9 is distributed in the specific determination area 5 while the information amount expressing the concentrated pattern defect distribution 9 is reduced by replacing the concentrated pattern defect distribution 9 with the concentrated pattern defect distribution representative point area 11.

In the embodiment described with reference to the flowchart of FIG. 1, whenever the determination step S6 is executed, the pattern defect data point group is formed (step S3), the concentrated pattern defect distribution is determined (step S4), and the representative points of the concentrated pattern defect distribution are selected (step S5).

However, when those processes are performed on the stored data and the processes are performed using the same references, it may be more reasonable to perform the representative point selection process on the data points (data group to be determined) when the data are collected, the data points being included in the concentrated pattern defect distribution, so that the representative point information is associated with the wafer information (identification information of data group to be determined) and stored in the database as the data. Such an embodiment is described with reference to FIG. 9.

Figure 9:
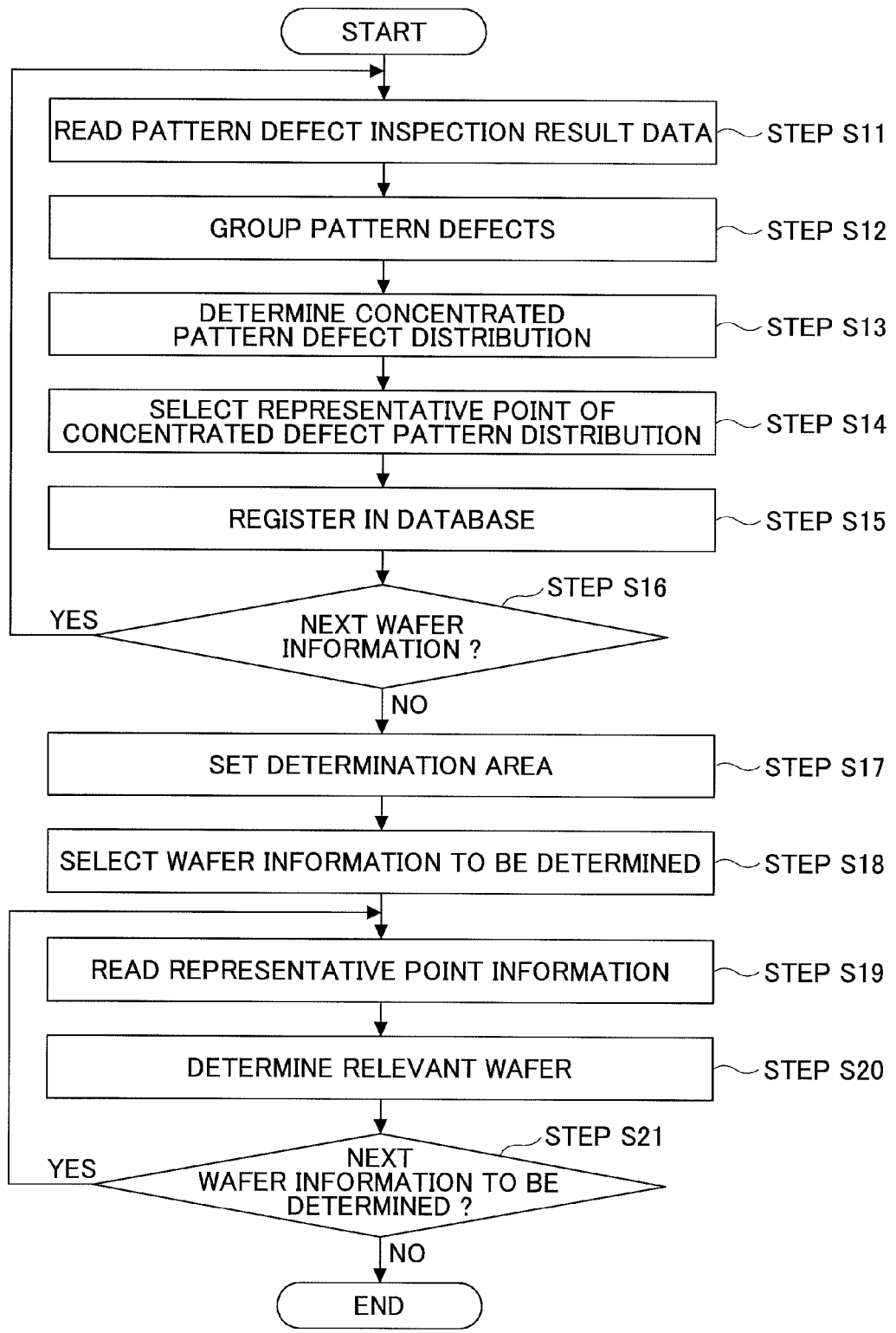
FIG. 9 is a flowchart illustrating a processing method according to another embodiment of the present invention.

FIG. 9 is a flowchart illustrating a method according to another embodiment of the present invention. In this embodiment, the steps already described with reference to the flowchart of FIG. 1 may be described in a simple manner.

Steps S11 through S14: Similar to steps S2 through S5 of FIG. 1, the pattern defect inspection result data associated with the wafer information is read (step S11); the pattern defects are grouped (step S12); it is determined whether the pattern defect is the concentrated pattern defect distribution (step S13); and the representative points of the concentrated pattern defect distribution are selected, the representative points representing the contour of the concentrated pattern defect distribution (step S14).

Step S15: the representative point information acquired in step S14 is associated with the wafer information and registered in the database. In this case, the distribution range of the concentrated pattern defect distribution and characteristic information may also be associated with the wafer information and registered in the database, the characteristic information including at least one of an area (size), a roundness rate, and a distribution density of the distribution representative point area defined by sequentially connecting the representative points with lines in a manner such that the lines are not crossed over each other. Further, there are various information to be associated with the wafer information, the various information including a lot number, a manufacturing method, a product type name, a process name, an inspection completion date, and the like for identifying the wafer. Further, when the wafer test is completed, as the wafer test result information, the information such as the determination test result (PASS or FAIL) of the chips, and the test category corresponding to the FAIL test result may also be associated with the wafer information.

Step S16: It is determined whether next wafer information exists. When determining that the next wafer information exists (YES in step 16), the process goes back to step S11 and the processes of steps S11 through S15 are performed on the next wafer information. On the other hand, when determining that there is no wafer information (NO in step 16), the process goes to step S17.

Step S17: The determination area is set on the coordinate plane.

Step S18: From among the wafer information registered in the database, the wafer information to be determined is selected as the wafer information to be determined. For example, the wafer information to be determined having the representative points of the concentrated pattern defect distribution located in the determination area set in step S17 is selected. Otherwise, if the characteristic information is associated and registered with the wafer information in step S15, the wafer information to be determined may be selected based on the characteristic information. Otherwise, the wafer information to be determined may be selected based on the information indicating the lot number, the product type name, the inspection execution date or the like.

Step S19: The representative point information of the wafer information selected in step S18 is read.

Step S20: Similar to step S6 of FIG. 1, it is determined whether there is the overlapping area where the concentrated pattern defect distribution representative point area overlaps the determination area. When determining that there is the overlapping area, the concentrated pattern defect distribution representative point area is determined to be the wafer information having the pattern defect inspection result data including the pattern defect distribution to be obtained (the relevant wafer information) (determination step).

Step S21: It is determined whether any of the wafer information to be determined selected in step S18 is remaining. When determining that any of the wafer information to be determined selected in step S18 is remaining (YES in step S21), the process goes back to step S19 to perform the processes of steps S19 and S20 on the next wafer information to be determined. On the other hand, when determining that none of the wafer information to be determined selected in step S18 is remaining (NO in step S21), the process ends.

In step S15, the representative point information may be associated with the wafer information to be determined and registered in database. By doing this, it may become possible to skip the distribution representative point selection step of steps S11 through S14 by reading the representative point information from the database to perform the wafer determination (in step S20). As a result, the processing time may be reduced.

Further, the information amount of the representative points of the concentrated pattern defect distribution is less than the information amount of all defect data points included in the concentrated pattern defect distribution 9. Therefore, it may become possible to reduce the reading time and the processing time.

In the above embodiments, in steps S6 and S20 where the wafer is determined, the determination may be made depending on whether the area (size) of the concentrated pattern defect distribution representative point area 11 is equal to or greater than a predetermined defect distribution representative point area threshold value. In this case, in steps S6 and S20, when determining that the area of the concentrated pattern defect distribution representative point area 11 is less than a predetermined defect distribution representative point area threshold value, it may be determined that the concentrated pattern defect distribution representative point area 11 is not the wafer information to be determined (relevant wafer information). By doing this, it may become possible to remove the wafer information having the concentrated pattern defect distribution representative point area 11 having the size less than the size of the concentrated pattern defect distribution representative point area 11 of the wafer information to be obtained. Therefore, it may become possible to improve the determination accuracy of the wafer information to be obtained.

This determination process of the area of the distribution representative point area may be performed before or after the determination process of determining the existence of the overlapping area. When the determination process of the area of the distribution representative point area is performed before the determination process of determining the existence of the overlapping area, it may become possible not to perform the determination process of determining the existence of the overlapping area for the distribution representative point area that has a small area and that has to be removed.

Further, in steps 6 and 20 where the wafer to be obtained (wafer having the relevant wafer information) is determined, it may be further determined whether the area of the overlapping area 13 is equal to or greater than a predetermined overlapping area threshold value. In steps 6 and 20, when determining that the area of the overlapping area 13 is equal to or greater than the predetermined overlapping area threshold value, it may be determined that the concentrated pattern defect distribution representative point area 11 is the wafer information to be determined (relevant wafer information). By doing this, it may become possible to improve the determination accuracy of the relevant wafer information.

Further, in step 6 and 20 where the wafer is determined, it may be further determined whether a ratio of the area of the overlapping area 13 to the area of the determination area 5 is equal to or greater than a predetermined first ratio threshold value. In steps 6 and 20, when determining that the ratio is equal to or greater than the first ratio threshold value, it may be determined that the concentrated pattern defect distribution representative point area 11 is the wafer information to be determined (relevant wafer information). By doing this, it may become possible to improve the determination accuracy of the wafer information.

Figure 10:
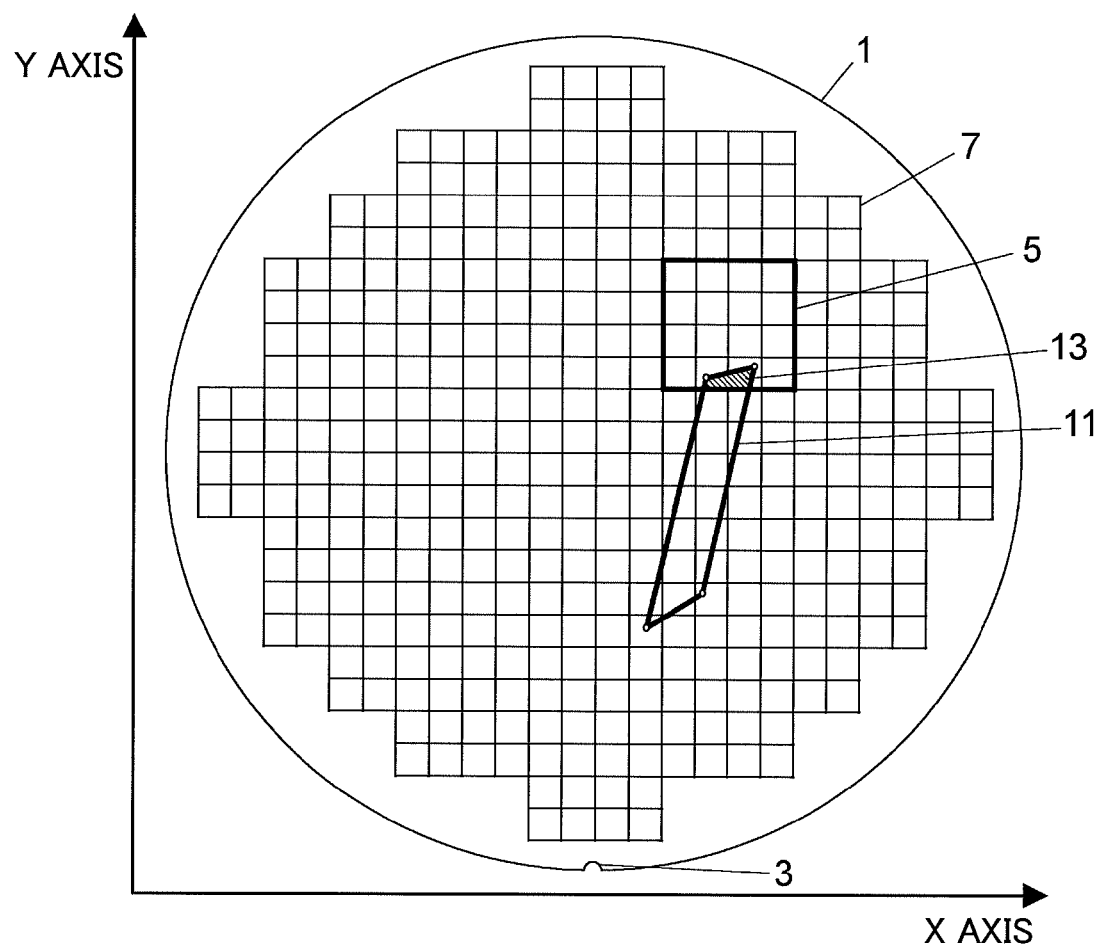
FIG. 10 is a drawing illustrating another example of the positional relationship between the determination area and the concentrated pattern defect distribution representative point area.

For example, as illustrated in FIG. 10, the determination area 5 overlaps the concentrated pattern defect distribution representative point area 11. However, when ratio of the area of the overlapping area 13 to the area of the determination area 5 is less than, for example, 50%, it may be determined that the concentrated pattern defect distribution representative point area 11 is not the wafer information to be determined (relevant wafer information). By doing this, it may become possible to improve the determination accuracy of the wafer information.

Further, in steps 6 and 20 where the wafer is determined, it may be further determined whether a ratio of the area of the overlapping area 13 to the area of the concentrated pattern defect distribution representative point area 11 is equal to or greater than a predetermined second ratio threshold value. In steps 6 and 20, when determining that the ratio is equal to or greater than the second ratio threshold value, it may be determined that the concentrated pattern defect distribution representative point area 11 is the wafer information to be determined (relevant wafer information).

Figure 11:
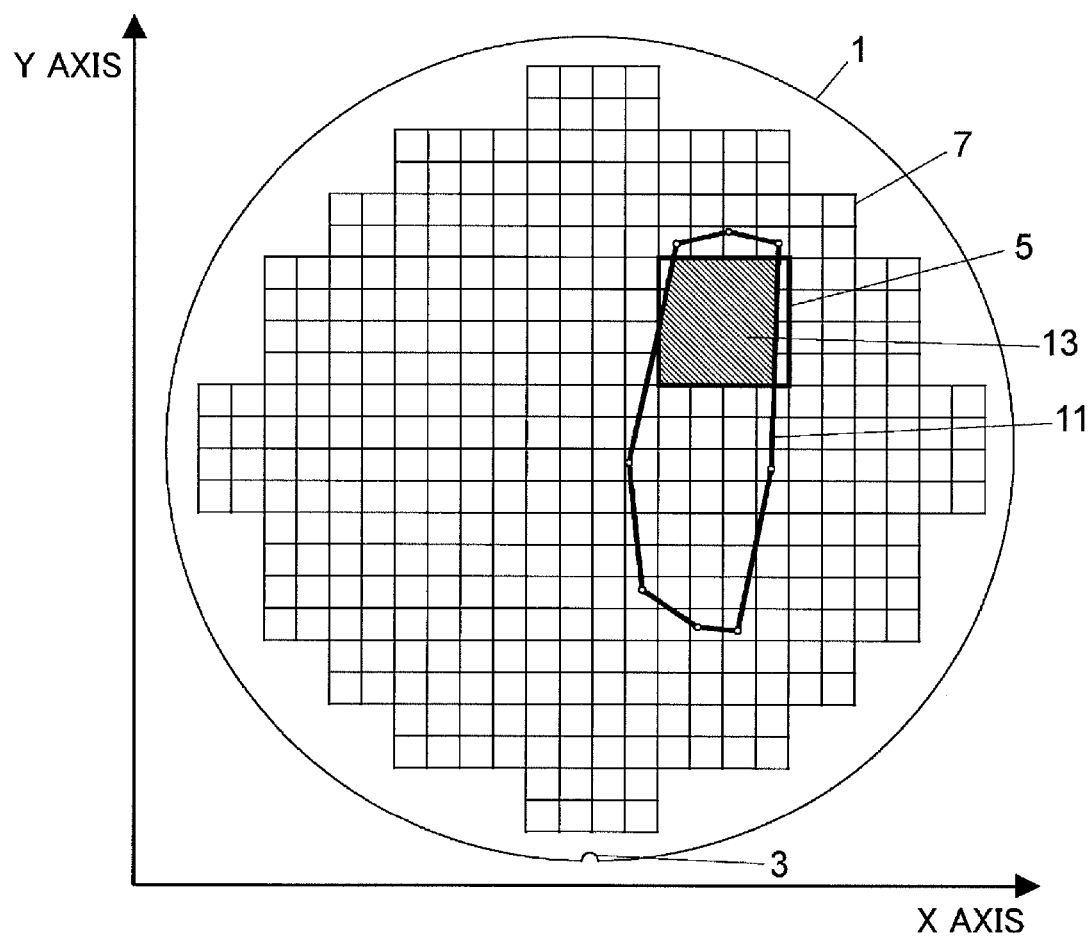
FIG. 11 is a drawing illustrating still another example of the positional relationship between the determination area and the concentrated pattern defect distribution representative point area.

For example, as illustrated in FIG. 11, the determination area 5 overlaps the concentrated pattern defect distribution representative point area 11. However, when the ratio of the area of the overlapping area 13 to the area of the concentrated pattern defect distribution representative point area 11 is less than, for example, 50%, it may be determined that the wafer information corresponding to the concentrated pattern defect distribution representative point area 11 is not the wafer information to be determined (relevant wafer information). By doing this, it may become possible to improve the determination accuracy of the wafer information.

Further, in a state of FIG. 10, the ratio of the area of the overlapping area 13 to the area of the concentrated pattern defect distribution representative point area 11 is less than, for example, 50%. Therefore, it may be determined that the wafer information corresponding to the concentrated pattern defect distribution representative point area 11 is not the wafer information to be determined (relevant wafer information).

Further, in step 18 of FIG. 9, from among the wafer information to be determined registered in the database, when the wafer information that is to be determined is selected, it may become possible to reduce the processing time when compared with a case where all the wafer information to be determined registered in the database is processed. However, the present invention is not limited to this configuration. Namely, all the wafer information to be determined registered in the database may be read.

In step S18, when the wafer information to be determined is selected, the wafer information to be determined having the representative points of the concentrated pattern defect distribution located in the determination area set in step S17, the wafer information to be determined having a relationship between the determination area 5 and the representative points (white circles) as illustrated in FIG. 8 may be selected.

Figure 12:
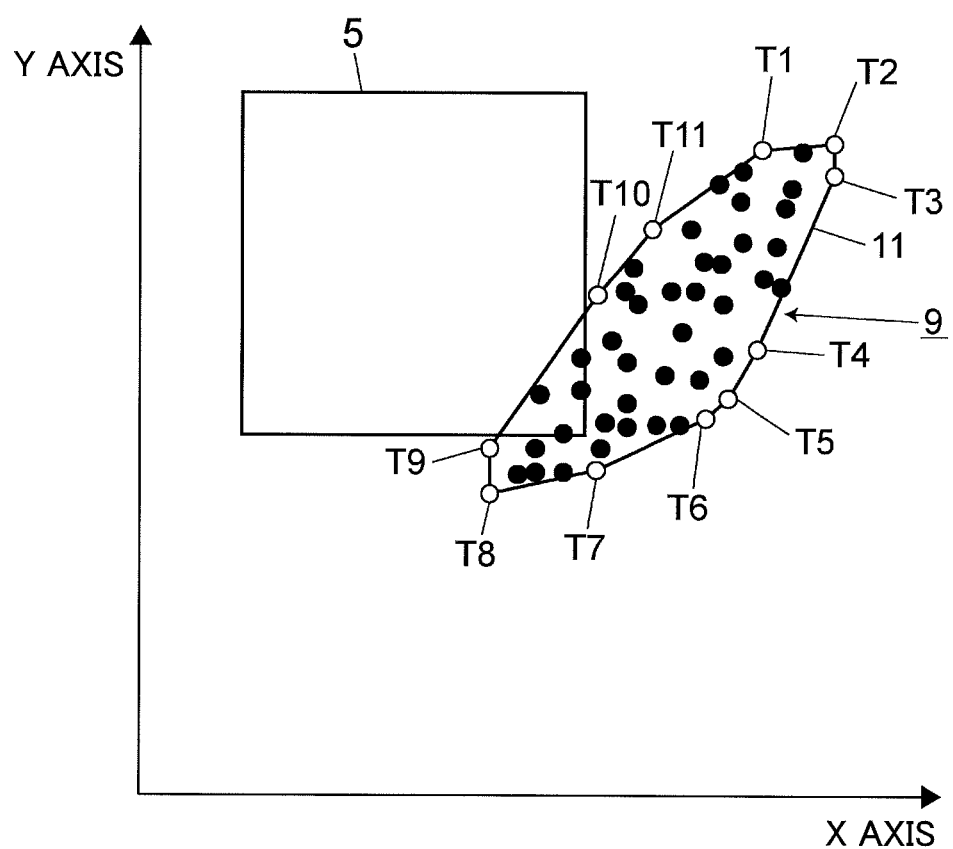
FIG. 12 is a drawing illustrating still another example of the positional relationship between the determination area and the concentrated pattern defect distribution representative point area.

However, depending on the disposed position of the determination area 5, for example, as illustrated in FIG. 12, there may be a case where the pattern defect data points (black circles) are disposed in the determination area 5, but none of the representative points (white circles) is disposed in the determination area 5. In the case of the positional relationship between the determination area 5 and the representative points as illustrated in FIG. 12, the wafer information to be determined having the representative points may not be selected in step S18.

If this is not desirable, in step S15, it may be possible to associate and register the characteristic information including the distribution range of the concentrated defect distribution and at least one of the area, the roundness rate, and the data point distribution density of the distributed representative point area with the wafer information to be determined. Further, in step S18, the wafer information to be determined may be selected based on the characteristic information. Specific examples of the characteristic information are described below.

For example, the wafer information to be determined is associated with the distribution range of the concentrated defect distribution.

Figure 13:
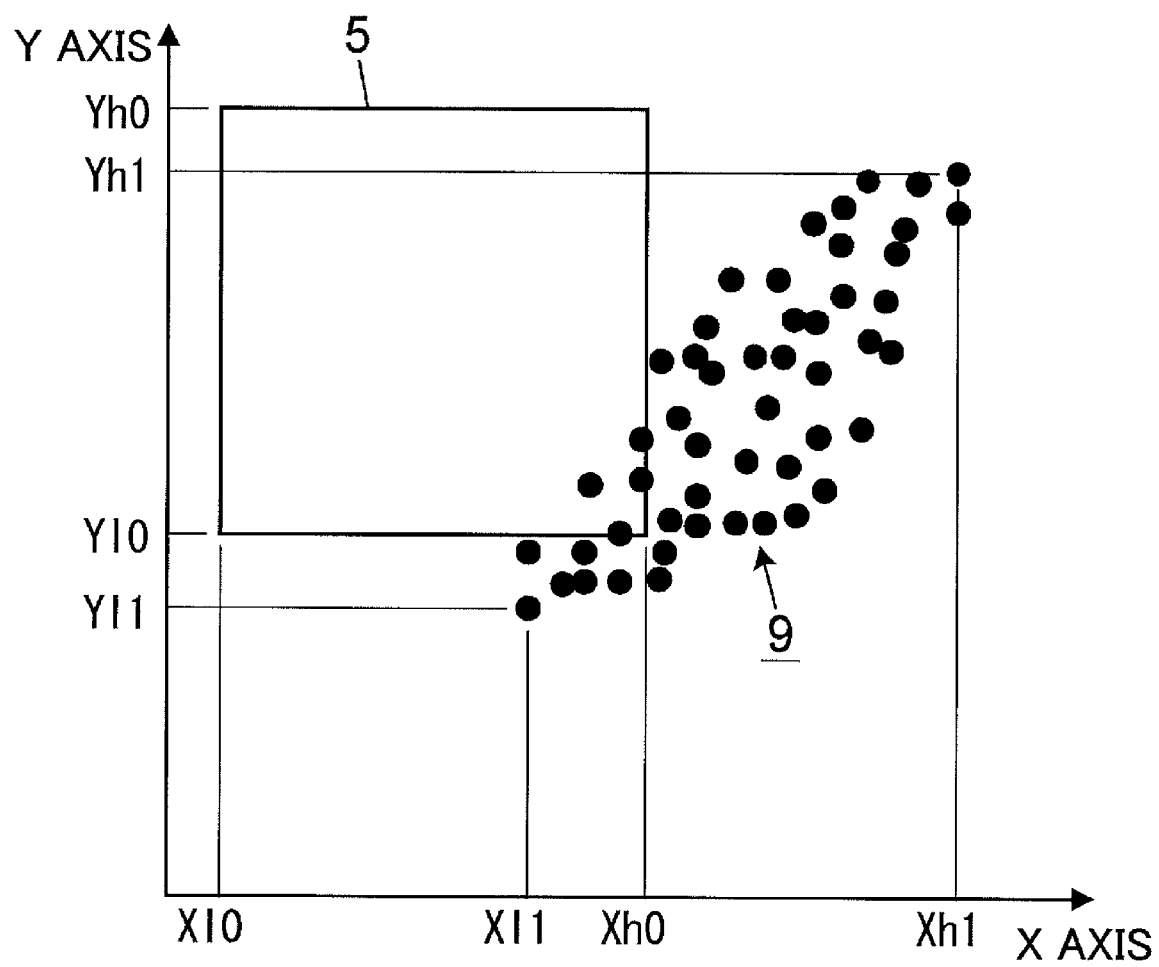
FIG. 13 is a drawing illustrating an example of a distribution range of the concentrated pattern defect distribution representative point area.

FIG. 13 illustrates an example of the distribution range of the concentrated defect distribution. From among the XY coordinate values of all the data points included in the concentrated pattern defect distribution, the information expressing the distribution range of the concentrated pattern defect distribution 9 is expressed by using the four values: the maximum value $Xh1$ and the minimum value $Xl1$ of the X axis and the maximum value $Yh1$ and the minimum value $Yl1$ of the Y axis. On the other hand, the range of the determination area 5 is expressed by the four values: the maximum value $Xh0$ and the minimum value $Xl0$ of the X axis and the maximum value $Yh0$ and the minimum value $Yl0$ of the Y axis.

In this case, the search conditions for making a short list of (narrow down, reducing the number of candidates (options)) the wafer information to be determined are: $Xh1>Xl0$, $Xl1<Xho$, $Yh1>Yl0$, and $Yl1<Yho$.

By setting the conditions in this way, it may become possible to select wafer information having the concentrated pattern defect distribution 9 illustrated in FIG. 13.

In this case, the four values, that is the maximum value $Xh1$ and the minimum value $Xl1$ of the X axis and the maximum value $Yh1$ and the minimum value $Yl1$ of the Y axis, are obtained by using all the data points included in the concentrated pattern defect distribution 9. However, alternatively, those maximum and minimum values may be obtained using only the representative points as the information expressing the distribution range of the concentrated pattern defect distribution 9.

Figure 14:
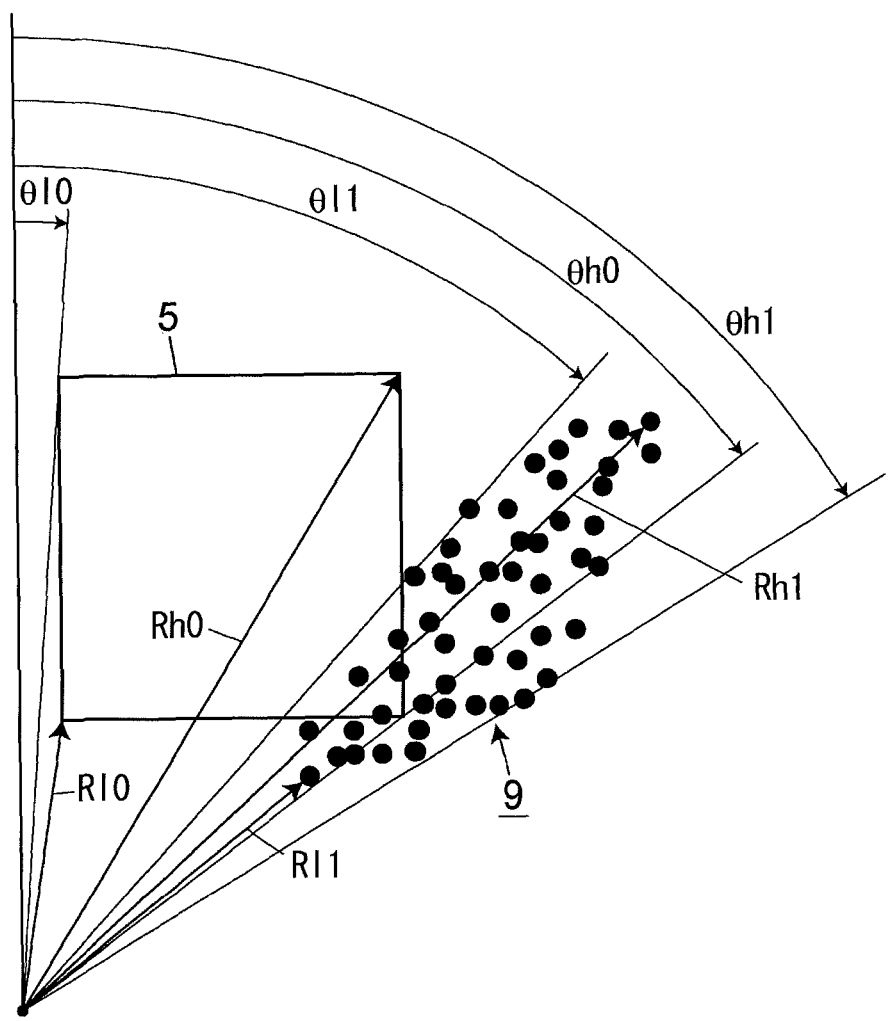
FIG. 14 is a drawing illustrating another example of the distribution range of the concentrated pattern defect distribution representative point area.

FIG. 14 illustrates another example of the distribution range of the concentrated pattern defect distribution 9.

In FIG. 13, the XY coordinate system is used. However, the polar coordinate system may alternatively be used to express the distribution range of the concentrated pattern defect distribution 9. as illustrated in FIG. 14.

When the polar coordinate system is used, from among the "R" values and "θ" values of all the data points included in the concentrated pattern defect distribution 9, the information expressing the distribution range of the concentrated pattern defect distribution 9 is expressed by the four values: the maximum value $Rh1$ and the minimum value $Rl1$ of the R values and the maximum value $\theta h1$ and the minimum value $\theta l1$ of the θ values. On the other hand, the range of the determination area 5 is expressed by the four values: the maximum value $Rh0$ and the minimum value $Rl0$ of the R values and the maximum value $\theta h0$ and the minimum value $\theta l0$ of the θ values.

In this case, the search conditions for making a short list of (narrow down) the wafer information to be determined are: $Rh1>Rl0$, $Rl1<Rho$, $\theta h1>\theta l0$, and $\theta l1<\theta ho$.

By setting the conditions in this way, it may become possible to select wafer information having the concentrated pattern defect distribution 9 illustrated in FIG. 14.

In this case, the four values, that is the maximum value $Rh1$ and the minimum value $Rl1$ of the R values and the maximum value $\theta h1$ and the minimum value $\theta l1$ of the θ values, are obtained by using all the data points included in the concentrated pattern defect distribution 9. However, alternatively, those maximum and minimum values may be obtained using only the representative points as the information expressing the distribution range of the concentrated pattern defect distribution 9.

Further, the area of the concentrated pattern defect distribution representative point area 11 is one of the information items expressing the feature of the concentrated pattern defect distribution 9. Therefore, by using the representative points selected in step S14, the area of the concentrated pattern defect distribution representative point area 11 is obtained (see FIG. 12). Then, in step S15, the area information is associated with the wafer information and registered in the database. Then, in step S18, the wafer information to be determined is selected based on the area of the concentrated pattern defect distribution representative point area 11. By doing in this way, in step S20 where the wafer information is determined, it may become possible to omit the determination process that the concentrated pattern defect distribution representative point area 11 having an area less than a threshold value is not the wafer information to be determined.

Further, the information expressing the feature of the shape of the concentrated pattern defect distribution representative point area 11 may be obtained and registered, so that the information is used for selecting the wafer information to be determined. For example, as a value expressing to what extent the shape of the concentrated pattern defect distribution representative point area 11 is similar to a circle, a value obtained by dividing the area of the concentrated pattern defect distribution representative point area 11 by the area of a circle having a circumference equal to a line length surrounding the concentrated pattern defect distribution representative point area 11 is obtained, and the value (hereinafter "roundness rate") is associated with the wafer information and registered in the database.

In this case, when line length surrounding the concentrated pattern defect distribution representative point area 11 is given as "L", the radius "r" of a circle having the circumference equal to "L" is given as "$L/2\pi$". Further, the area of the circle having the circumference equal to "L" is given as "$\pi r^2 = \pi(L/2\pi)^2 = L^2/4\pi$". When assuming that the area of the concentrated pattern defect distribution representative point area 11 is given as "S", the "roundness rate" is expressed as $S/(L^2/4\pi)=4\pi S/L^2$.

When the roundness rate approaches 1, the shape approaches a circle, and when the roundness rate approaches 0, the shape approaches a line. Therefore, by using this feature, the "roundness rate" may be used when the wafer information to be determined in the distribution identification target wafer selection step on as needed basis.

Further, the number of pattern defect data points in the concentrated pattern defect distribution representative point area 11, that is the distribution density, may also be one of the information items expressing the feature of the concentrated pattern defect distribution.

Figure 15:
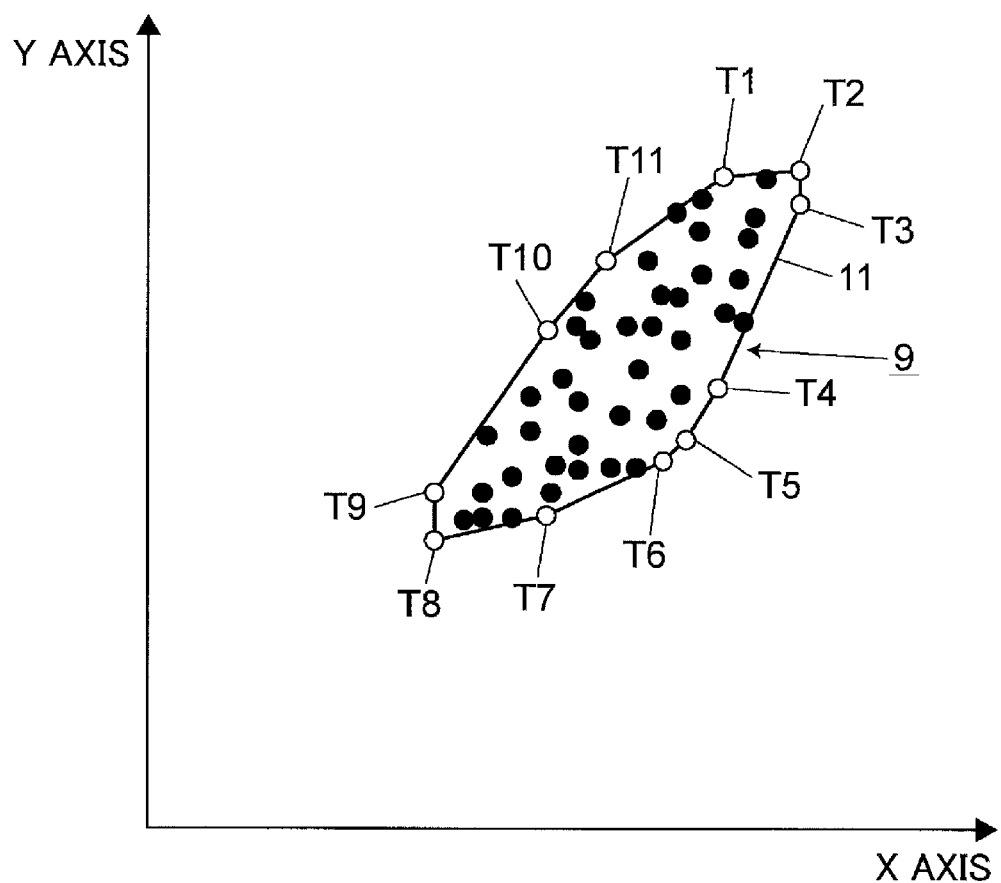
FIG. 15 is a drawing illustrating an example of a distribution density of the data points in the concentrated pattern defect distribution representative point area.
Figure 16:
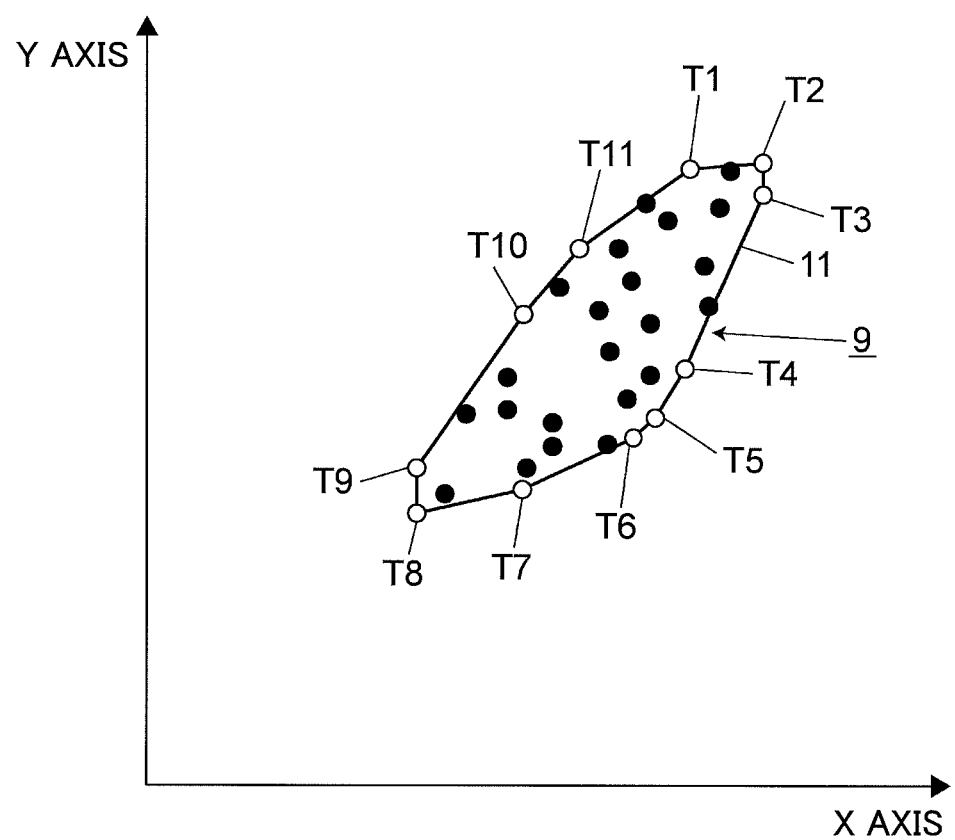
FIG. 16 is a drawing illustrating another example of a distribution density of the data points in the concentrated pattern defect distribution representative point area.

When the concentrated pattern defect distribution representative point area 11 of the concentrated pattern defect distribution 9 in FIG. 15 is compared with the concentrated pattern defect distribution representative point area 11 of the concentrated pattern defect distribution 9 in FIG. 16, the sizes of the concentrated pattern defect distribution representative point areas 11 are the same as each other; however, the numbers of the pattern defect data points differ from each other. Namely, the density of the pattern defect data points in FIG. 15 is higher than the density of the pattern defect data points in FIG. 16. Therefore, the data point distribution density of the data point distribution area of the concentrated pattern defect distribution representative point areas 11 may be obtained in advance, associated with the wafer information, and registered in the database. By doing this, it may become possible to exclude (remove) the concentrated pattern defect distribution 9 having a lower data point distribution density of the data point distribution area of the concentrated pattern defect distribution 9 as illustrated in FIG. 16 and select only the concentrated pattern defect distribution 9 having a higher data point distribution density of the data point distribution area of the concentrated pattern defect distribution 9 as illustrated in FIG. 15, so that this feature can be utilized in selecting the wafer information to be determined.

In the above embodiment, the data points indicating the pattern defect position are used. However, by using the data points indicating the particle positions (of foreign matters) based on the particle (contamination) inspection result, the processes similar to the processes in the above embodiment may be performed.

Further, the chip positions corresponding to data point positions indicating the pattern defect positions and particle positions may be regarded as the positions of defective chips. Then, by using the data indicating the defective chip positions, the processes similar to the processes in the above embodiment may be performed. However, there may be no concept of chips in the particle (contamination) inspection result data for a mirror surface wafer. In this case, "virtual" chips may be set (provided) on the wafer.

Figure 17:
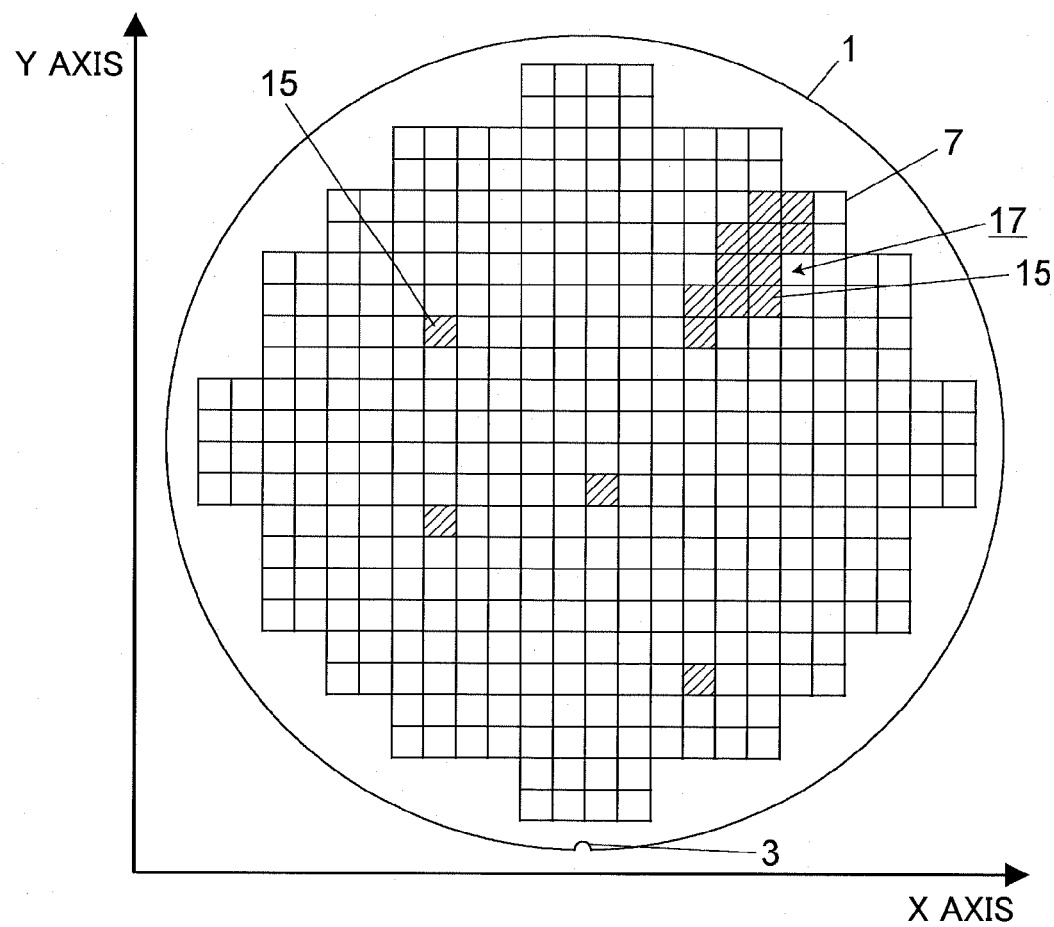
FIG. 17 is a drawing illustrating the wafer on which the pattern defect positions in FIG. 3 are replaced by defective chips.

For example, FIG. 17 illustrates a case where the pattern defect positions on the wafer of FIG. 3 are replaced by the defective chip positions. In FIG. 17, the defective chips are denoted by the reference numeral 15.

Similar to step S3 described with reference to FIG. 1, the defective chips 15 are grouped in a manner such that the defective chips 15 having the mutual distance less than a predetermined threshold value are determined to be included in the same group. However, a method of grouping the defective chips 15 is not limited to this method, and any other appropriate method may alternatively used. For example, the defective chips 15 may be grouped based on a method disclosed in Japanese Patent Application Publication No. 2009-10303.

Similar to step S4 described with reference to FIG. 1, for each of the groups of the defective chips 15, it is determined that the group is the concentrated pattern distribution when the number of the defective chips 15 is five or more. In the case of FIG. 17, the defective chip group 17 is determined to be the concentrated defect distribution.

Figure 18:
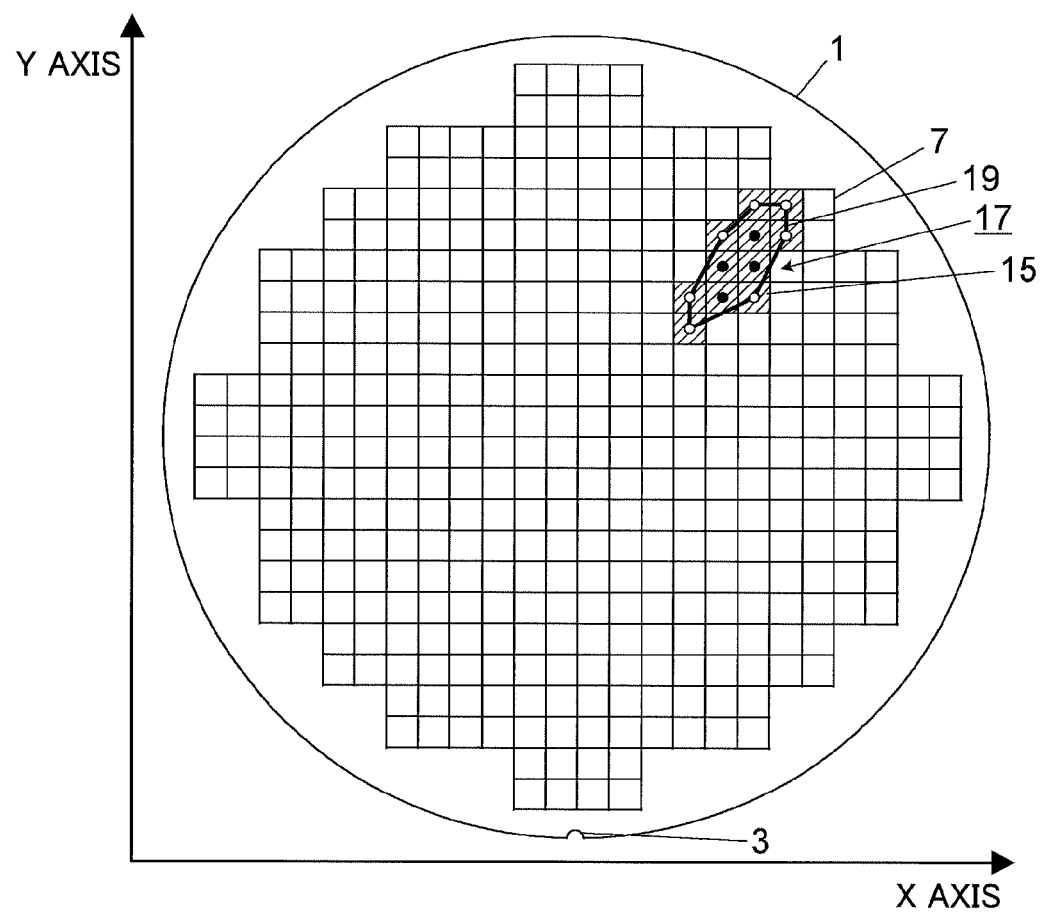
FIG. 18 is a drawing illustrating the representative points and the corresponding representative point distribution area.

Chip positional information refers to the information indicating the positions of the chips 7 on the wafer 1. Therefore, for example, the chip positional information may be replaced by the positional information expressing the center points of the chips 7. By using the positional information expressing the center points of the defective chips 15, the processes similar to the processes of step S5 described with reference to FIG. 1 and steps S5-1 through S5-4 described with reference to FIG. 4 are performed. As a result, as illustrated in FIG. 18, the representative points (white circles) of the concentrated defect distribution 17 are obtained. In FIG. 18, the black circles denote the center points of the defective chips 15 of the concentrated defect distribution 17. FIG. 18 further illustrates a concentrated defect distribution representative point area 19 that is formed by sequentially connecting the representative points of the concentrated defect distribution 17 with lines.

After that, similar to step S6 described with reference to FIG. 1, it is determined whether the wafer information corresponding to the concentrated defect distribution representative point area 19 is the wafer information to be determined based on whether there is the overlapping area where the concentrated defect distribution representative point area 19 overlaps the determination area.

In FIG. 17, as described above, the chip positional information is replaced by the positional information expressing the center points of the chips 7. On the other hand, the wafer test result data include chip positional information and the corresponding test results (PASS or FAIL) of the chips. Therefore, the processes similar to the processes described with reference to FIGS. 17 and 18 may also be performed on the wafer test result data.

Figure 19:
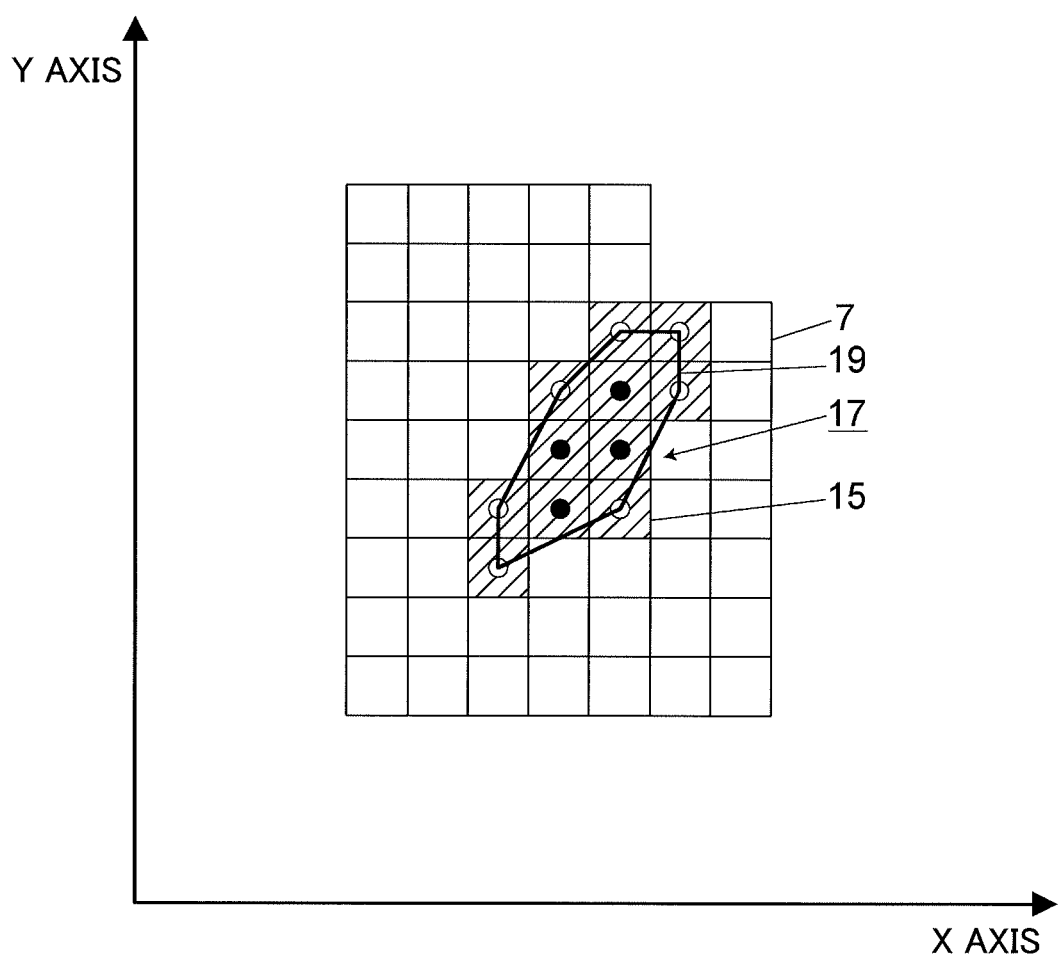
FIG. 19 is an enlarged view of the representative points of concentrated defect distribution and the corresponding representative point distribution area.

FIG. 19 is an enlarged view of the vicinity of the concentrated defect distribution 17 of FIG. 17.

In this case, when the concentrated defect distribution representative point area 19 corresponding to the concentrated defect distribution 17 is obtained by obtaining the representative points (white circles) using the center points (black circles and white circles) of the centers of the chips 7 and the defective chips 15, a large part of the area of the defective chips 15 of the concentrated defect distribution 17 may protrude from the area of the concentrated defect distribution representative point area 19.

When this is not desirable, the positional information indicating the chips 7 of the wafer test result data is replaced by the positional information indicating the four corners of the chips 7 and then the representative points of the concentrated defect distribution 17 are obtained.

Figure 20:
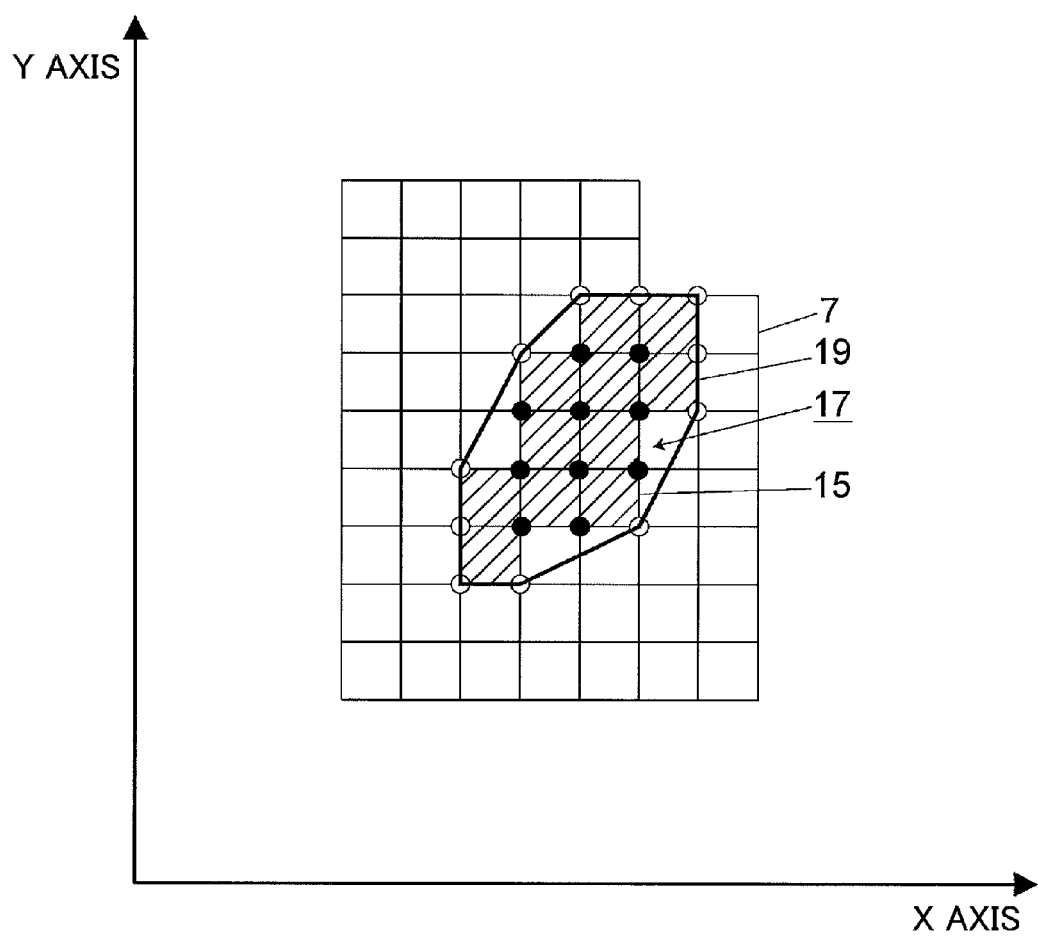
FIG. 20 is a drawing illustrating the representative points and the concentrated defect distribution representative point area when the positional information indicating the chips in FIG. 19 is replaced by the positional information indicating the four corners of the chips.

FIG. 20 illustrates the representative points and the concentrated defect distribution representative point area 19 when the positional information indicating the chips 7 of the wafer test result data in FIG. 19 is replaced by the positional information indicating the four corners of the chips 7.

As illustrated in FIG. 20, when the concentrated defect distribution representative point area 19 corresponding to the concentrated defect distribution 17 is obtained by obtaining the representative points (white circles) using the positional information (black circles and white circles) indicating the four corners of the defective chips 15, none of the areas of the defective chips 15 of the concentrated defect distribution 17 is out of the concentrated defect distribution representative point area 19.

On the other hand, for example, as illustrated in FIG. 20, there may be a case where three or more data points (i.e., positional information indicating the four corners of the defective chips 15) that can be the representative points are arranged on the same line. In the representative point selection step, in the arrangement of such data points, when a data point at one end is selected as the representative point and the representative point is set as the reference point, if the next representative point is selected, the remaining two or more data points may be selected as the representative points at the same time.

Figure 21:
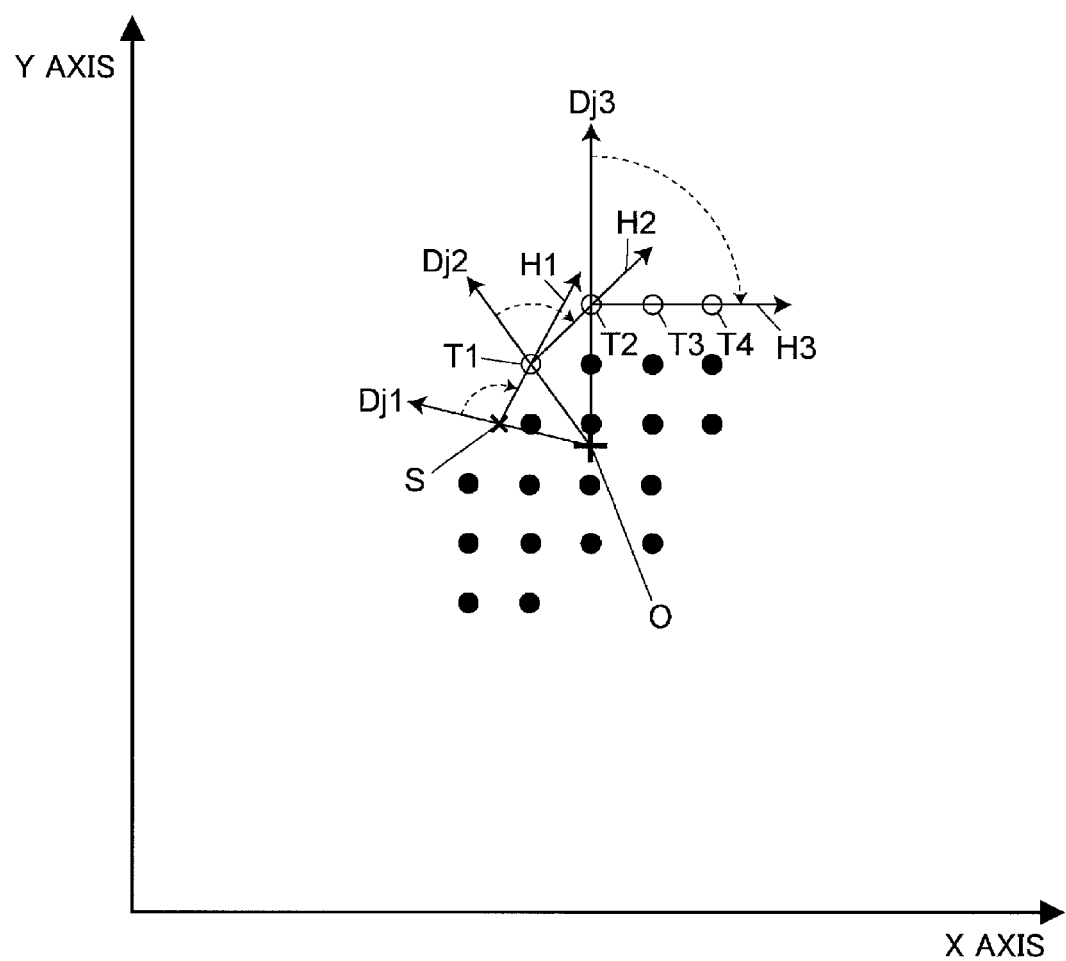
FIG. 21 is a drawing illustrating where plural data points are selected as the representative points at the same time in a representative point selection step.

For example, as illustrated in FIG. 21, it is assumed that the determination center point O is located at the gravity center of the data point distribution area of the data points (positional information indicating four corners of the defective chips 15) and that the first representative point selection reference point S is located at any position (other than the position of the determination center point O). Similar to step S5-2 described with reference to FIGS. 4 and 5, the first representative point T1 corresponding to the first representative point selection data point direction H1 is selected (determined), the first representative point selection data point direction H1 having the smallest angle relative to the first representative point selection direction Dj1 in the clockwise direction when viewed from the first representative point selection direction Dj1 (first representative point selecting step).

Next, similar to step S5-3 described with reference to FIGS. 4 and 6, the second representative point T2 corresponding to the second representative point selection data point direction H2 is selected (determined), the second representative point selection data point direction H2 having the smallest angle relative to the second representative point selection direction Dj2 in the clockwise direction when viewed from the second representative point selection direction Dj2 (representative point selection second step).

Next, similar to step S5-4 described with reference to FIGS. 4 and 7, the determination direction Dj3 is set, the second representative point T2 is set as the reference point, from among plural of the representative point selection data point directions extending from the reference point T2 to the respective data points, the representative point selection data point direction H3 having the smallest angle relative to the representative point selection direction Dj3 in the clockwise direction when viewed from the representative point selection direction Dj3 is determined, and the representative point corresponding to the representative point selection data point direction H3 is selected (third representative point selecting step). In this case, as illustrated in FIG. 21, three data points including the representative point T2 are arranged on the same line along the representative point selection data point direction H3 passing through the representative point T2. Therefore, when the representative point T2 is set as the reference point, the other two data points may be selected as the representative points T3 and T4 at the same time. Further, the selection of the plural data points as the representative points at the same time may also occur in the first representative point selecting step and the representative point selection second step.

In the above description, a case is described where all the data points that are arranged on the same line and that can be selected as the representative points are selected as the representative points. However, alternatively, among the plural data points, only two data points disposed at both ends of the arrangement of the data points may be selected as the representative points. In this case, an amount expressing the representative points may be reduced when compared with a case where all three or more data points arranged on the same line are selected as the representative points.

For example, in the case of FIG. 21, the data points corresponding to the representative points T2 and T4 are selected as the representative points, but the data point corresponding to the representative point T3 is not selected as the representative point. To that end, for example, after the representative point T2 is selected, the representative point T2 is set as the reference point. Then, from among plural representative point selection data point directions extending from the reference point T2 to the respective data points, the representative point selection data point direction H3 having the smallest angle relative to the representative point selection direction Dj3 in the clockwise direction when viewed from the representative point selection direction Dj3 is determined. Then, from among the representative points corresponding to the representative point selection data point direction H3, the representative point (T4) having the greatest distance from the reference point T2 is selected as the next representative point. By doing in this way, the data point having the symbol T3 may not be selected as the representative point.

In the above embodiment, as illustrated in, for example, FIG. 2, a case is described where the determination area 5 is set on a part of upper right-hand side along the frames of the chips 7 while the wafer 1 is set in a manner such that the notch 3 of the wafer 1 is arranged on the lower side. However, the determination area 5 may be set at any of the other positions and areas.

For example, the determination area 5 may be set as the upper half part or the right half part of the wafer 1 under a condition where the notch 3 is arranged on the lower (bottom) side.

Further, it is not always necessary that the determination area 5 has a frame shape. For example, the determination area 5 may have a shape other than the frame shape and may be expressed as an area defined by, for example, X>0 and Y>0 or an area defined by X<2 in the XY coordinate plane.

Figure 22:
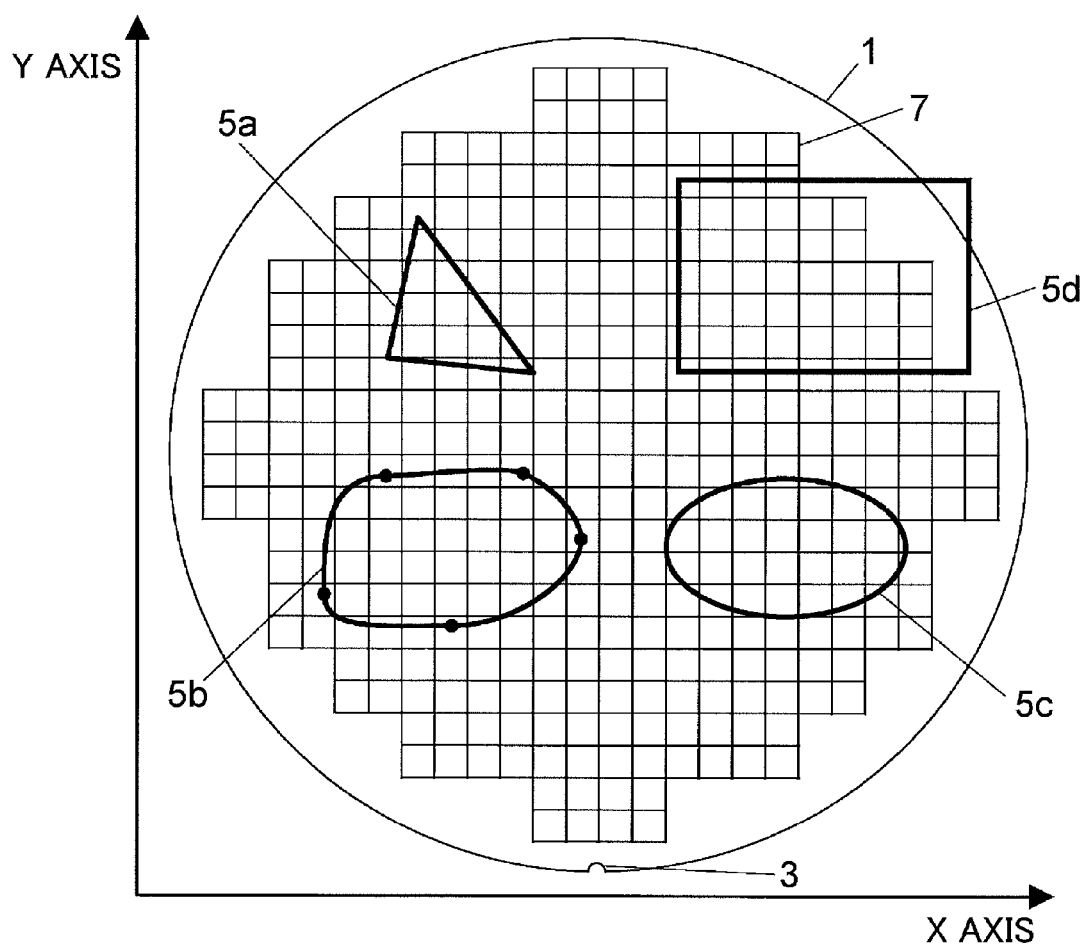
FIG. 22 is a drawing illustrating some examples of the determination areas.

FIG. 22 illustrates some examples of the determination area 5. As illustrated in FIG. 22, the determination area 5 may be a determination area 5a having a triangular shape, a determination area 5b formed by connecting the plural points with smooth curves, a determination area 5c having an elliptic shape, or a determination area 5d including an area protruding from the wafer 1 or the like.

Next, a specific use according to an embodiment of the present invention is described with reference to FIGS. 23 through 27.

Figure 23:
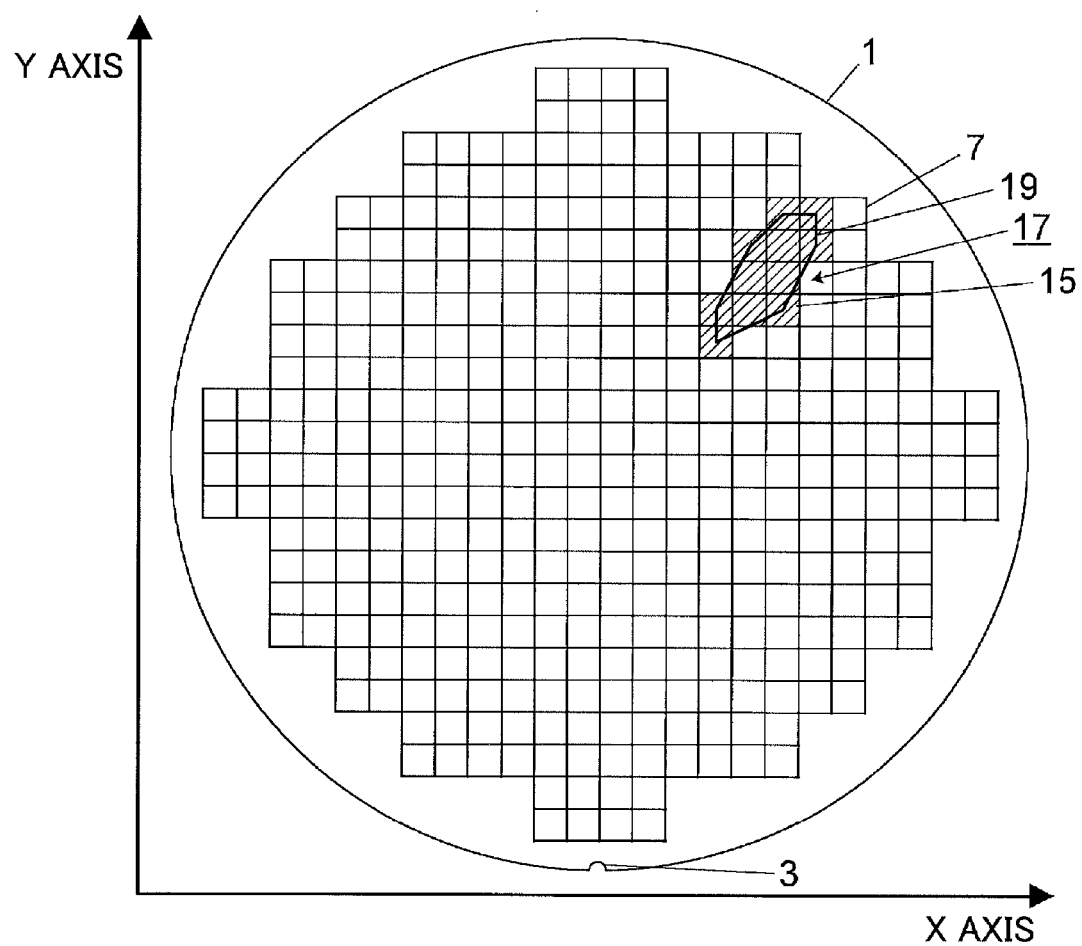
FIG. 23 is a drawing illustrating wafer test result data on the coordinate plane.

FIG. 23 illustrates the wafer test result data on the coordinate plane. Specifically, FIG. 23 illustrates the concentrated defect distribution 17 and the concentrated defect distribution representative point area 19 corresponding to the concentrated defect distribution 17, the concentrated defect distribution 17 including the plural defective chips 15.

Figure 24:
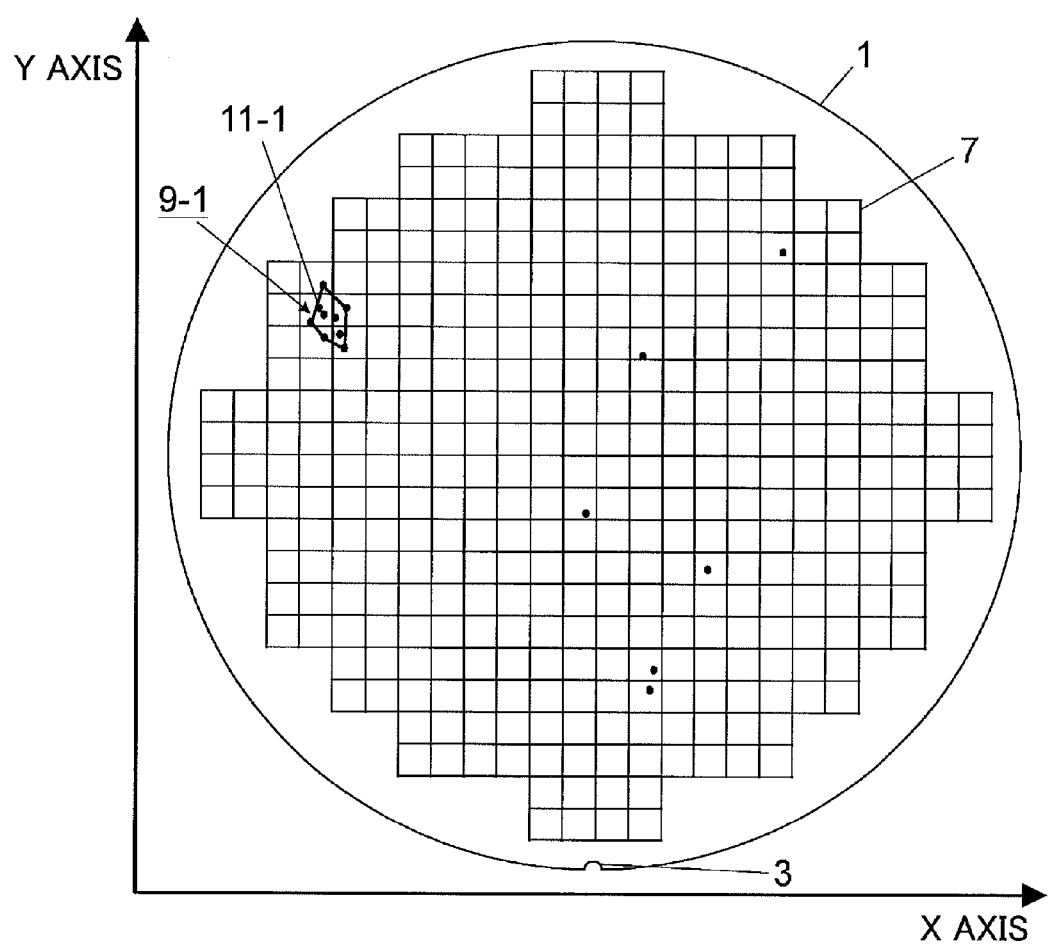
FIG. 24 is a drawing illustrating a defect inspection result of a metal 1 forming process on the coordinate plane.

FIG. 24 illustrates the defect inspection result data of a metal 1 forming process on the coordinate plane. Specifically, FIG. 24 illustrates data points (black circles) indicating the pattern defect positions, the concentrated pattern defect distribution 9-1, and the concentrated pattern defect distribution representative point area 11-1 corresponding to the concentrated pattern defect distribution 9-1.

Figure 25:
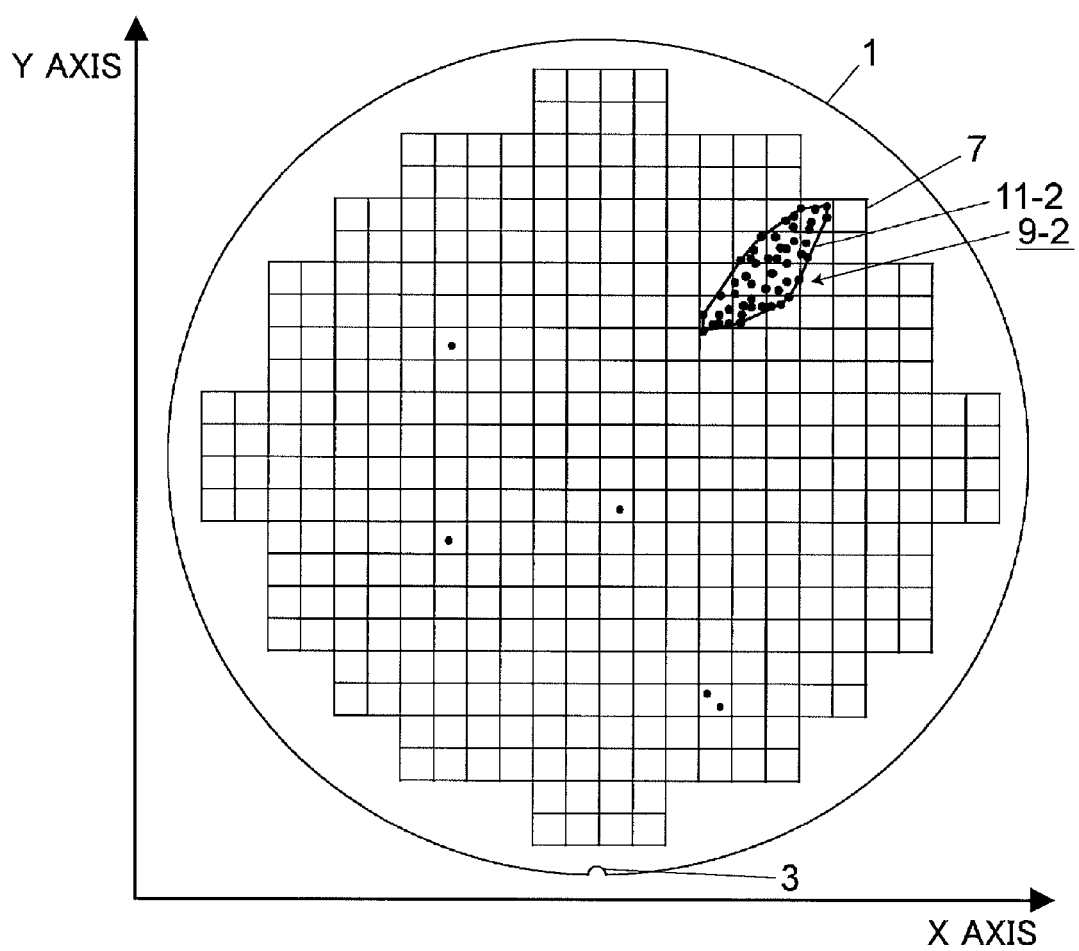
FIG. 25 is a drawing illustrating a defect inspection result of a metal 2 forming process on the coordinate plane.

FIG. 25 illustrates the defect inspection result data of a metal 2 forming process on the coordinate plane. Specifically, FIG. 25 illustrates data points (black circles) indicating the pattern defect positions, the concentrated pattern defect distribution 9-2, and the concentrated pattern defect distribution representative point area 11-2 corresponding to the concentrated pattern defect distribution 9-2.

Figure 26:
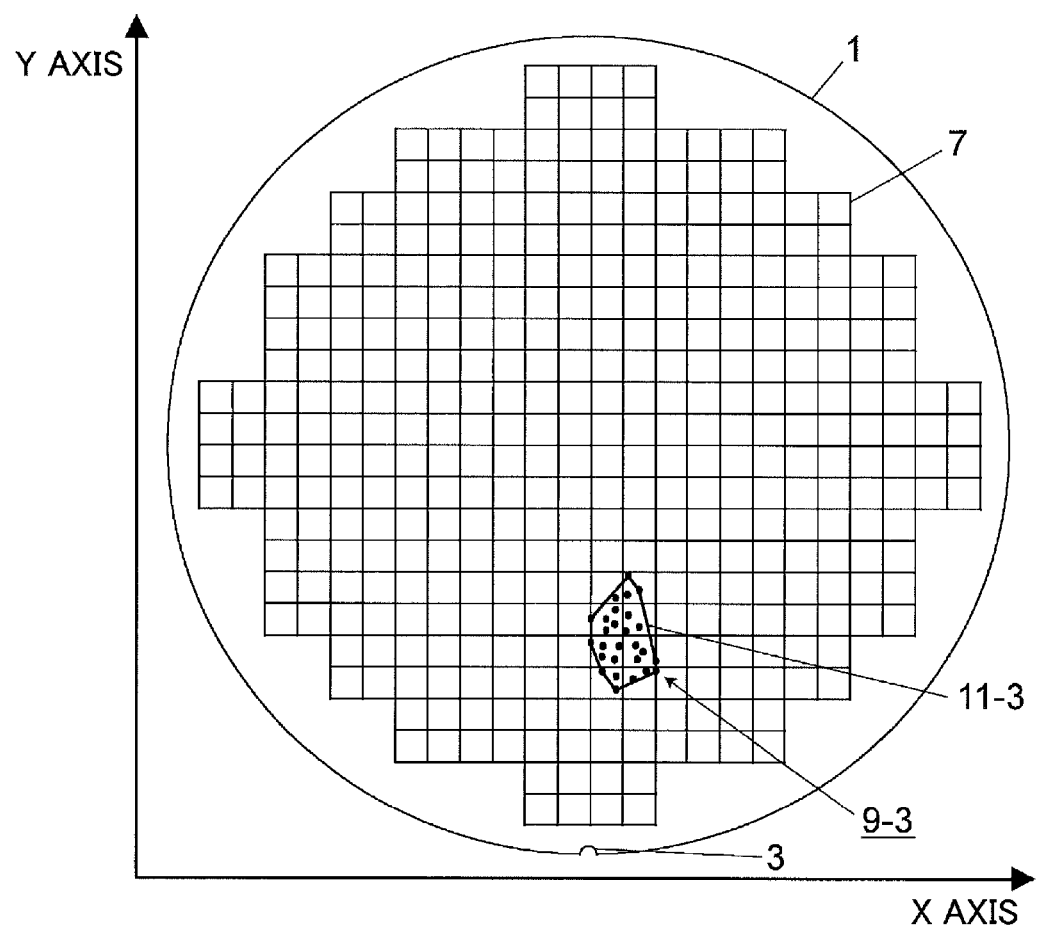
FIG. 26 is a drawing illustrating a defect inspection result of a metal 3 forming process on the coordinate plane.

FIG. 26 illustrates the defect inspection result data of a metal 3 forming process on the coordinate plane. Specifically, FIG. 26 illustrates data points (black circles) indicating the pattern defect positions, the concentrated pattern defect distribution 9-3, and the concentrated pattern defect distribution representative point area 11-3 corresponding to the concentrated pattern defect distribution 9-3.

Figure 27:
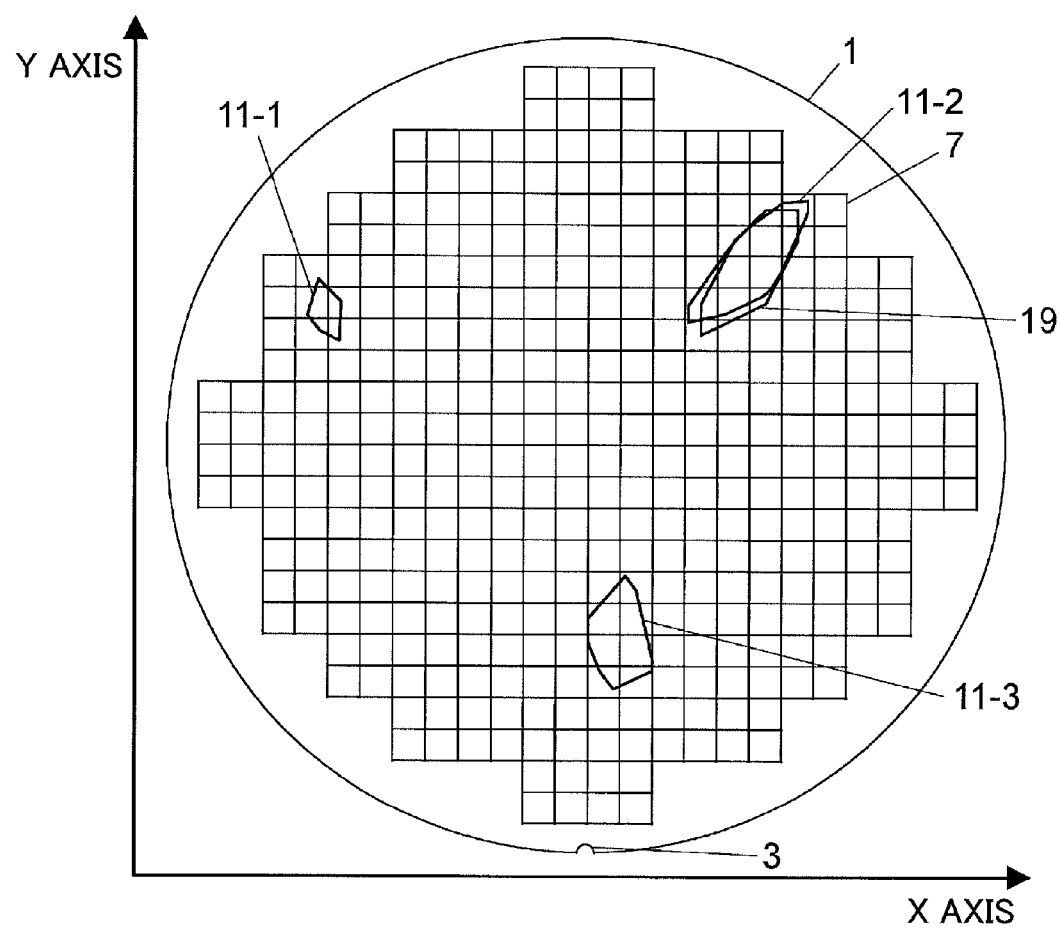
FIG. 27 is a drawing illustrating the concentrated pattern defect distribution representative point areas and the concentrated defective distribution representative point area of FIGS. 23, 24, 25, and 26 in a manner such that the areas are overlapped with each other.

In FIG. 27, the concentrated defect distribution representative point area 19 and the concentrated pattern defect distribution representative point areas 11-1, 11-2 and 11-3 of FIGS. 23, 24, 25, and 26, respectively, are illustrated in an overlapped manner.

In the wafer test result, when the concentrated defect distribution 17 as illustrated in FIG. 23 is obtained, by setting the concentrated defect distribution representative point area 19 corresponding to the concentrated defect distribution 17 as the determination area, it may be determined that the concentrated pattern defect distribution representative point area is the wafer information to be determined for each of the pattern defect inspection results of the metal forming processes. When the pattern defect inspection result of the metal forming processes is defective, the defective pattern defect inspection result includes the concentrated pattern defect distribution representative point area overlapping the concentrated defect distribution representative point area 19 (determination area 5) as the concentrated pattern defect distribution representative point area 11-2 of the metal 2 forming process. By using this feature, it may become possible to select the wafer information to be determined which includes the information indicating the cause of the occurrence of the concentrated defect distribution 17.

The steps of the embodiment described above may be realized by executing a program using a computer, the program being generated for the execution of the steps described above.

Further, as a function of the program, it may be preferable to draw the distributed defect distribution representative point areas or the concentrated pattern defect distribution representative point areas of the plural wafer information having been determined as the wafer information on one coordinate plane, and allow selecting unnecessary distributed defect distribution representative point areas or the concentrated pattern defect distribution representative point areas so as to remove those wafer information from all the wafer information. By having this function, it may become possible to adequately select the relevant wafer information.

Figure 28:
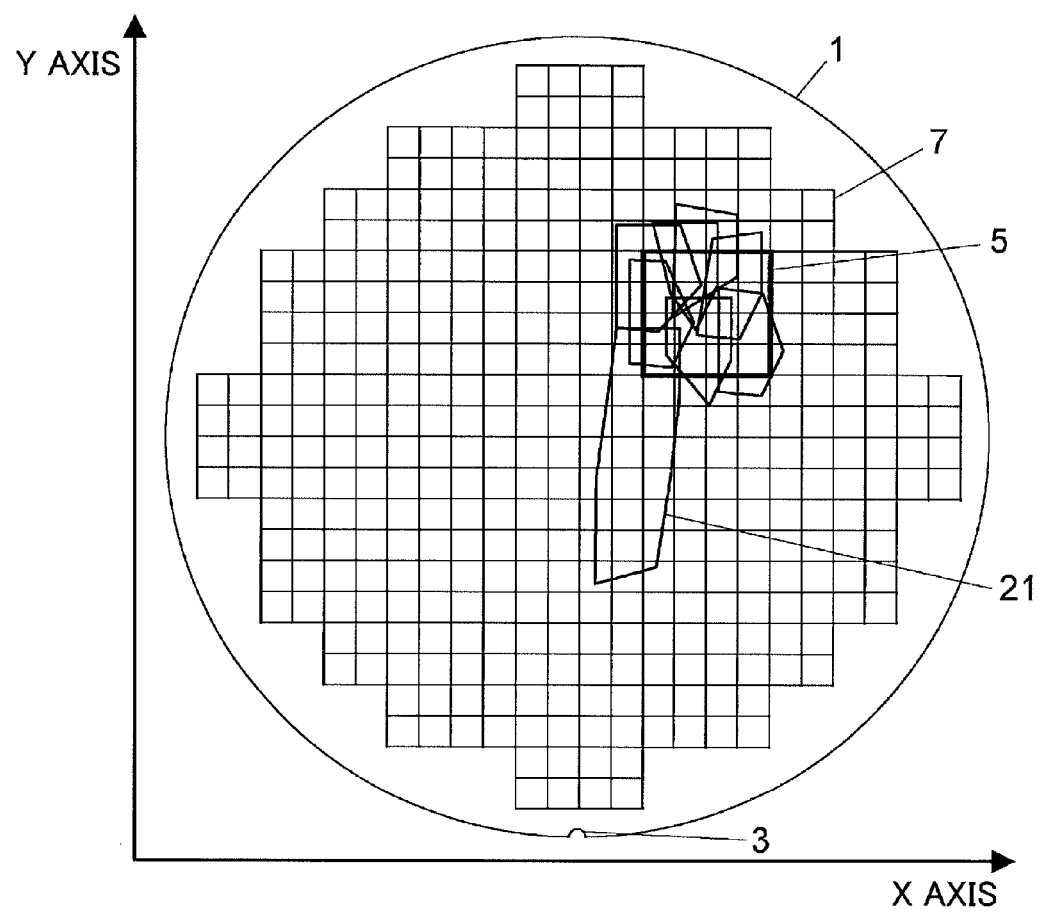
FIG. 28 is a drawing illustrating the concentrated pattern defective distribution representative point areas and the determination area on one coordinate plane, the concentrated pattern defective distribution representative point areas corresponding to the concentrated pattern defect distributions of plural wafer information.

Namely, as illustrated in FIG. 28, when it is desirable to remove the wafer information having the concentrated pattern defect distribution corresponding the concentrated pattern defect distribution representative point area having the distribution in an area far from the determination area 5, like the concentrated pattern defect distribution representative point area 21 in FIG. 28, from the wafer information, it may be preferable to display a figure illustrating the concentrated pattern defect distribution representative point areas of the plural wafer information on one coordinate plane, and allow selecting a peculiar concentrated pattern defect distribution representative point area using a mouse or the like so as to remove the wafer information having the concentrated pattern defect distribution corresponding to the selected peculiar concentrated pattern defect distribution representative point area. Further, when the first ratio threshold value and the second ratio threshold value described with reference to FIG. 10 are used, it may become possible to automatically remove the wafer information corresponding to the concentrated pattern defect distribution representative point area 21 in FIG. 28.

Next, a modified example of the representative point selection step is described.

In the above embodiment, a case is described where the selection process of selecting the representative points is terminated when determining that the determination direction is rotated from the initial determination direction Dj1 in the clockwise direction by an angle of 360 degrees or more in the representative point selection third step S5-4. However, alternatively, the selection process of selecting the representative points may continue until the same data point is selected as the representative point again, namely in the above embodiment until the data point corresponding to the representative point T1 is selected as the representative point again.

Further, in the case where the selection process of selecting the representative points is terminated when the same data point is selected as the representative point again, the last selected representative point having the same coordinate value as that of the previously selected representative point may be recognized (selected) as the representative point or may not be recognized as the representative point. When the last selected representative point is selected as the representative point, in the determination step, by connecting the representative points with lines in the selected order, a closed concentrated pattern defect distribution representative point area may be defined. On the other hand, when the last selected representative point is not selected as the representative point, in the determination step, by connecting the representative points with lines in the selected order and connecting the initially selected representative point to the last selected representative point with a line, a closed concentrated pattern defect distribution representative point area may be defined.

Further, in the above embodiment, a case is described where the concentrated pattern defect distribution representative point area 11 is defined by connecting the selected representative points with lines in the selected order. However, the present invention is not limited to this configuration. Alternatively, for example, the concentrated pattern defect distribution representative point area 11 may be defined by connecting one representative point to the rest of the representative points for each of the representative points.

Further, in the above embodiment, a case is described where, in the representative point selection second step S5-3 and the representative point selection third step S5-4, the determination directions Dj1 through Dj11 are used as the representative point selection directions. However, the representative point selection direction is not limited to the determination direction. On the other hand, it should be noted that when any direction is used as the representative point selection direction, there may be a case where, for example, the lines for defining the pattern defect distribution representative point area overlap each other; the pattern defect distribution representative point area is not closed; or there is a data point far from the pattern defect distribution representative point area even when the pattern defect distribution representative point area can be closed.

To prevent the above problems, for example, the representative point selection direction in the representative point selection second step is set within a range of 180 degrees in the clockwise direction (the first representative point selection rotation direction) from the direction extending from the initial reference point T1 to the first representative point selection reference point S. Further, the representative point selection direction in the representative point selection third step is set within a range of 180 degrees in the clockwise direction (the first representative point selection rotation direction) from the direction extending from the next reference point (the last representative point) to the reference point used for selecting the last representative point (hereinafter "last reference point"). Further, in the representative point selection third step, the last reference point is the representative point selected just before the last representative point is selected. Therefore, when the direction extending from the next reference point to the last reference point is set as the representative point selection direction, the data point of the last reference point is excluded from the selection target in the representative point selection third step.

Figure 29:
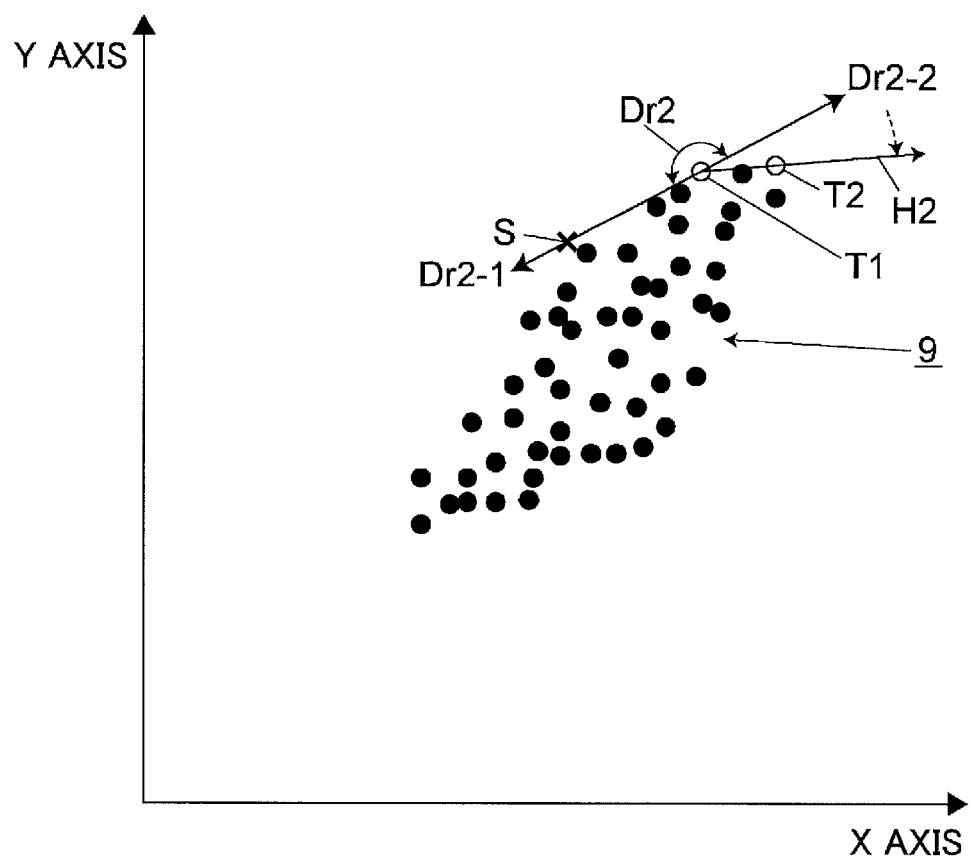
FIG. 29 is an enlarged view of the concentrated pattern defect distribution of FIG. 3, illustrating a range of representative point selections direction in a representative point selection second step.

FIG. 29 schematically illustrates the range of the representative point selection direction in the representative point selection second step S5-3.

The representative point selection direction is within a range Dr2 defined between the direction Dr2-1 and the direction Dr2-2, the direction Dr2-1 extending from the initial reference point (the first representative point) as the start point to the representative point selection reference point S, the direction Dr2-2 being provided by rotating the direction Dr2-1 in the clockwise direction (the first representative point selection rotation direction) by an angle of 180 degrees. In this case, the direction Dr2-2 is the same as the representative point selection data point direction H1 (see FIG. 5). Therefore, as described above, there are no data points in the range Dr2 defined by a straight line extending from the representative point T1 in the directions Dr2-1 and Dr2-2. Accordingly, the representative point selection direction in the representative point selection second step S5-3 may be any direction in the range Dr2.

Further, in the above embodiment, a case is described where the selection process of selecting the representative points is terminated when determining that any of the determination directions Dj1 through Dj12 is rotated from the initial determination direction Dj1 in the clockwise direction by an angle of 360 degrees or more in the representative point selection third step S5-4. However, instead of using the determination direction, the selection process of selecting the representative points in the representative point selection third step may be terminated when the same data point is selected as the representative point again or when two or more data points are selected as the representative points again.

However, in the above embodiment, the determination directions Dj1 through Dj11 are used as the representative point selection directions. Therefore, when no determination direction is used, it may be necessary to define the representative point selection directions. As the first representative point selection direction set in the first representative point selecting step, any direction may be selected.

On the other hand, as described above, the representative point selection direction set in the representative point selection second step is set within the range defined between the first direction and the second direction, the first direction extending from the initial reference point (the first representative point) to the representative point selection reference point S, the second direction being provided by rotating the first direction in the clockwise direction (the first representative point selection rotation direction) by an angle of 180 degrees.

Further, as described above, the representative point selection direction set in the representative point selection step is set within the range defined between the first direction and the second direction, the first direction extending from the next reference point (the last representative point) to the last reference point (the reference point used for selecting the last representative point), the second direction being provided by rotating the first direction in the clockwise direction (the first representative point selection rotation direction) by an angle of 180 degrees.

Further, in the above embodiment, a case is described where the representative point selection reference point S is set outside the region defined by connecting one data point to the rest of the data points for each of the data points (see FIG. 5). However, the representative point selection reference point S may be set at any position. For example, as illustrated in FIG. 30, the representative point selection reference point S may be accidentally or intentionally set (located) within the region defined by connecting one data point to the rest of the data points with lines for each of the data points.

Next, the processes in this case according to an embodiment of the present invention are described with reference to FIGS. 30 through 32.

Figure 30:
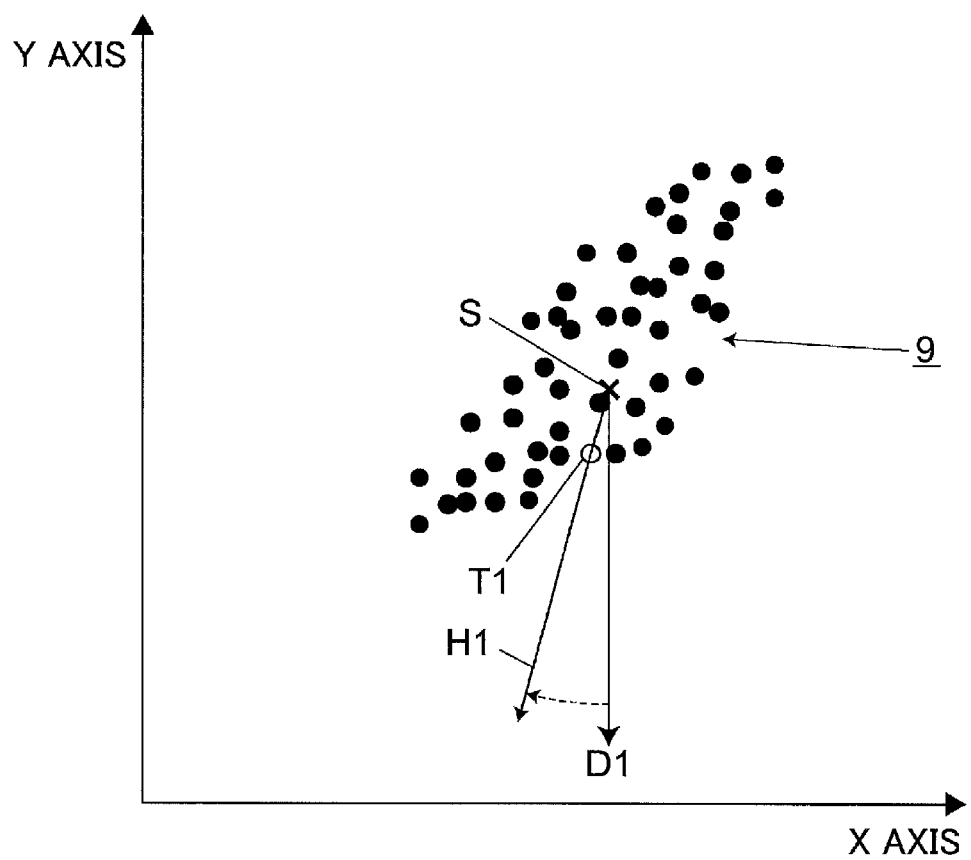
FIG. 30 is an enlarged view of the concentrated pattern defect distribution of FIG. 3, illustrating a process of selecting the first representative point when a first representative point selection reference point is located in an area defined by connecting one data point to the rest of the data points with lines for each of the data points.

FIG. 30 is an enlarged top view of the concentrated pattern defect distribution 9 of FIG. 3 on the coordinate plane. Further, FIG. 30 illustrates a process performed until the first representative point is obtained when the representative point selection reference point S is set (located) within the region defined by connecting one data point to the rest of the data points with lines for each of the data points. FIG. 31 is a top view illustrating the representative point selection reference point S, the representative point selection directions, the representative point selection data point directions, and the representative points used until the last representative point is obtained (determined) on the coordinate plane. FIG. 32 is a top view illustrating the corresponding pattern defect distribution representative point area 11 on the coordinate plane.

As described in FIG. 30, in the first representative point selection reference point setting step, the representative point selection reference point S is set. In this case, the representative point selection reference point S is accidentally set (located) within the region defined by connecting one data point to the rest of the data points with lines for each of the data points. Further, in the first representative point selection reference point setting step, when the representative point selection reference point S is intentionally set at, for example, the center or the gravity center of the distribution area of the data points, the representative point selection reference point S may be set (located) within the region defined by connecting one data point to the rest of the data points with lines for each of the data points. Herein, the center of the distribution area of the data points refers to the point having the coordinate value having a pair of values which are separately obtained by dividing the sum of the maximum value and the minimum value of the data points in the distribution area by two (2). For example, in the distribution area of the data points, when the maximum values and the minimum values of the two variables are Xmax, Xmin, Ymax, and Ymin, the coordinate value of center is given as ((Xmax+Xmin)/2, (Ymax+Ymin)/2).

In the first representative point selecting step, any one of the directions passing through the representative point selection reference point S is set as the first representative point selection direction D1. For example, the first representative point selection direction D1 is a direction parallel to the Y coordinate axis and extending toward the negative part (direction) of the Y coordinate axis. From among plural first representative point selection data point directions extending from the first representative point selection reference point S to the respective data points, the first representative point selection data point direction H1 having the smallest angle relative to the first representative point selection direction D1 in the clockwise direction when viewed from the first representative point selection direction D1 is determined, and the first representative point T1 corresponding to the first representative point selection data point direction H1 is selected (determined).

Figure 31:
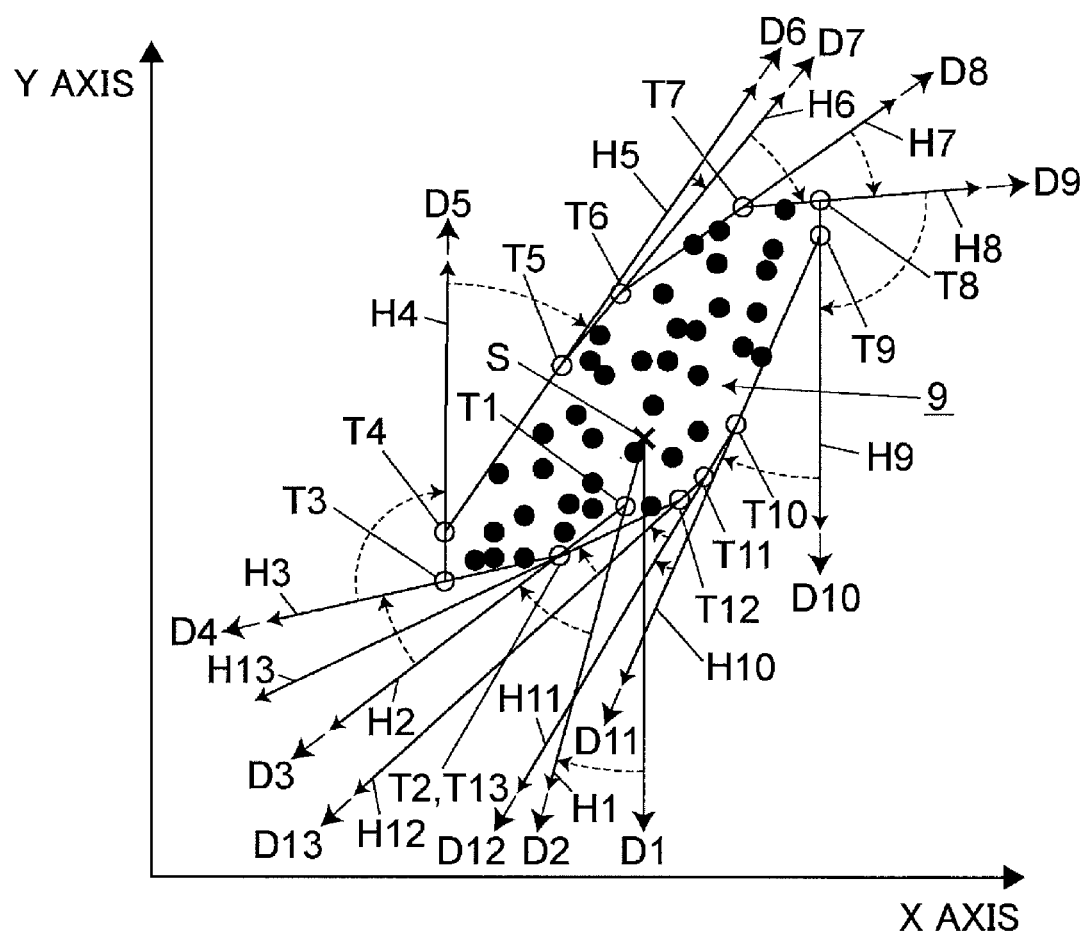
FIG. 31 is a drawing illustrating the first representative point selection reference point, representative point selection directions, data point directions, and the representative points that are used until the last representative point is selected on the coordinate plane.

In the representative point selection second step, the second representative point T2 is selected, and in the representative point selection third step, the representative points T3 through T13 are selected (see FIG. 31). In this case, the representative point selection rotation direction is the same as the clockwise direction, and the representative point selection directions D2 through D12 are the representative point selection data point directions H1 through H11, respectively, corresponding to the last selected representative points. After the representative point T12 is selected in the representative point selection third step, when the next representative point is selected by setting the representative point T12 as the next reference point (the last representative point) and setting the representative point selection data point direction H12 as the representative point selection direction D13, the representative point T13 corresponding to the representative point selection data point direction H13 is selected. The data point corresponding to the representative point T13 is already selected as the representative point T2, therefore, the selecting process of selecting the representative points is terminated.

In the determination step, the pattern defect distribution representative point area 11 is defined by sequentially connecting the representative points T1 through T13 in the selected order (see FIG. 12). In this case, the data point corresponding to the representative point T2 further corresponds to the representative point T13. Therefore, the representative point T12 is connected to the representative point T13.

As described above, even when the representative point selection reference point S is set (located) within the region defined by connecting one data point to the rest of the data points with lines for each of the data points, according to an embodiment of the present invention, it may become possible to define the pattern defect distribution representative point area 11 expressing (having) the contour of the distribution area of the data points.

Figure 32:
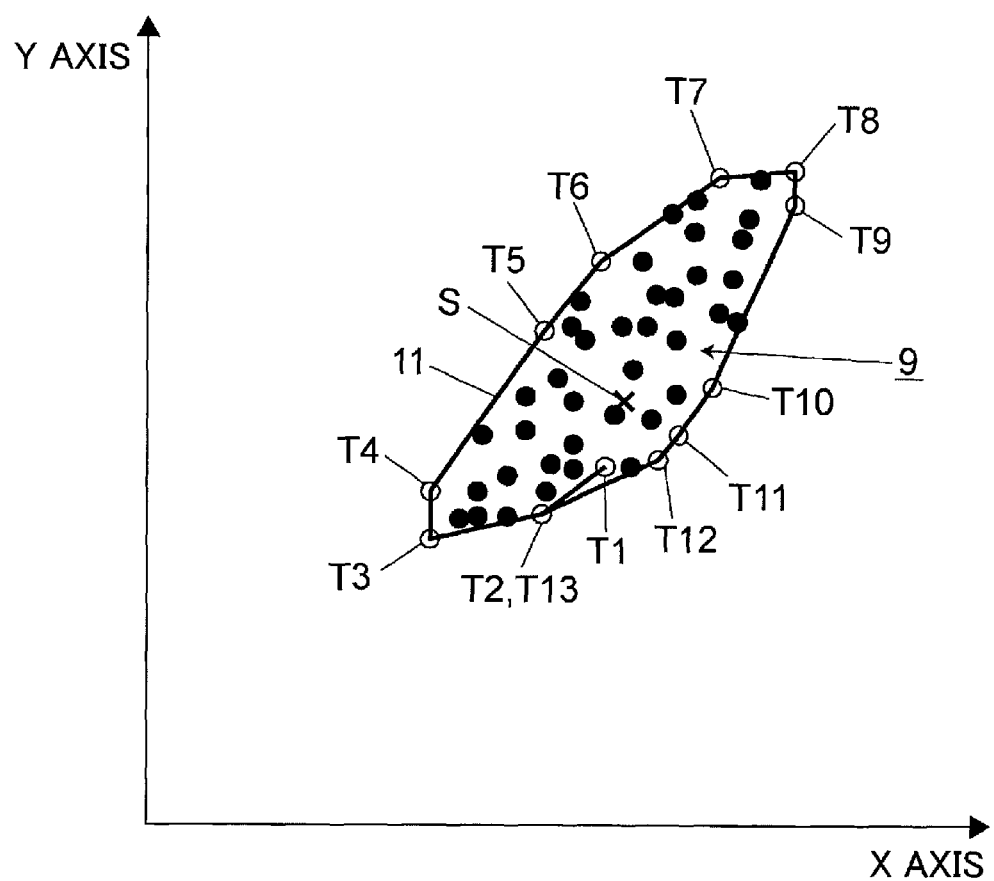
FIG. 32 is a drawing illustrating the distribution representative point area on the coordinate plane.
Figure 33:
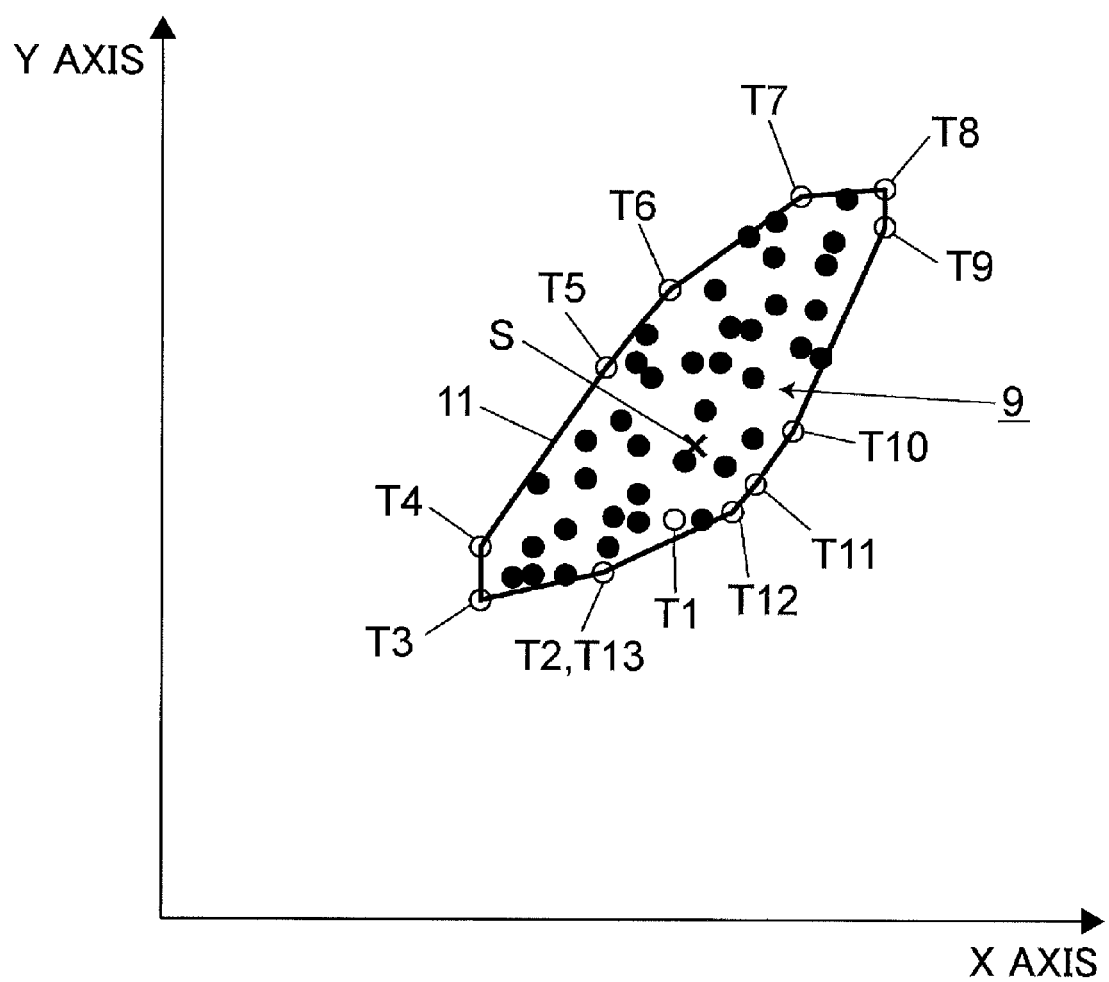
FIG. 33 is a drawing illustrating the distribution representative point area modified from the distribution representative point area of FIG. 32.

The pattern defect distribution representative point area 11 illustrated in FIG. 32 includes closed lines sequentially connecting the representative points T2 through T13 and a line connecting between the representative points T1 and T2. When it is not desirable to have such a pattern defect distribution representative point area 11, as illustrated in FIG. 33, the pattern defect distribution representative point area 11 may be defined without the line connecting between the representative points T1 and T2. By doing this, it may become possible to define the pattern defect distribution representative point area 11 expressing only the contour of the distribution area of the data points. A method of defining the contour without drawing the line between the representative points T1 and T2 may include a method of deleting the line between T1 and T2 and a method of defining the lines while excluding the representative point T1.

Further, the representative point corresponding to the part of the pattern defect distribution representative point area 11 or the representative point to be excluded when the pattern defect distribution representative point area 11 is defined has been selected before the representative point that is selected again in the representative point selection third step is initially selected. In the above embodiment described with reference to FIGS. 30 through 32, the first representative point T1 has been selected before the representative point T2 that is selected again as the representative point T13 is initially selected. Therefore, as illustrated in FIG. 33, the line connected to the first representative point T1 is deleted or the line to the first representative point T1 is not connected.

Further, according to an embodiment of the present invention, among the data points of the data group to be determined displayed on the coordinate plane, there are data points that are always to be selected as the representative points. In the XY coordinate system, the data point having the maximum X coordinate value, the data point having the minimum X coordinate value, the data point having the maximum Y coordinate value, the data point having the minimum Y coordinate value are always selected as the representative points. In the polar coordinate system, the data point having the maximum r value is always selected as the representative point.

Further, according to an embodiment of the present invention, the coordinate value (position) of the representative point selection reference point S may be set at any position, therefore, any one of the data points among the data group to be determined may be set as the representative point selection reference point S.

According to an embodiment of the present invention, in a case where the data points of the data group to be determined are expressed in (X, Y) of an orthogonal coordinate system or an oblique coordinate system, when any of the data points that are always to be selected as the representative point is set as the first representative point selection reference point S and any direction is set as a predetermined direction relative to the representative point selection reference point S, it may become possible to finally define the concentrated pattern defect distribution representative point areas 11 expressing only the contour of the distribution area of the data points. In this case, (1) when the coordinate value of the data point having the maximum X coordinate value is set as the representative point selection reference point S, the predetermined direction is any one of the directions extending from the data point to the points having an X coordinate value greater than the maximum X coordinate value. (2) When the coordinate value of the data point having the minimum X coordinate value is set as the representative point selection reference point S, the predetermined direction is any one of the directions extending from the data point to the points having an X coordinate value less than the maximum X coordinate value. (3) When the coordinate value of the data point having the maximum Y coordinate value is set as the representative point selection reference point S, the predetermined direction is any one of the directions extending from the data point to the points having a Y coordinate value greater than the maximum Y coordinate value. (4) When the coordinate value of the data point having the minimum Y coordinate value is set as the representative point selection reference point S, the predetermined direction is any one of the directions extending from the data point to the points having a Y coordinate value less than the maximum Y coordinate value.

Further, in a case where the data points of the data group to be determined are expressed in $(r,\theta)$ of a polar coordinate system, according to an embodiment of the present invention, among the data group to be determined, when the data point having the maximum r value is set as the first representative point selection reference point S and any direction is set as a predetermined direction relative to the representative point selection reference point S, it may become possible to finally define the concentrated pattern defect distribution representative point areas 11 expressing only the contour of the distribution area of the data points. The predetermined direction is any one of the directions extending in a range between −90 degrees and +90 degrees of the $\theta$ coordinate value of the data point having the maximum r value.

Figure 34:
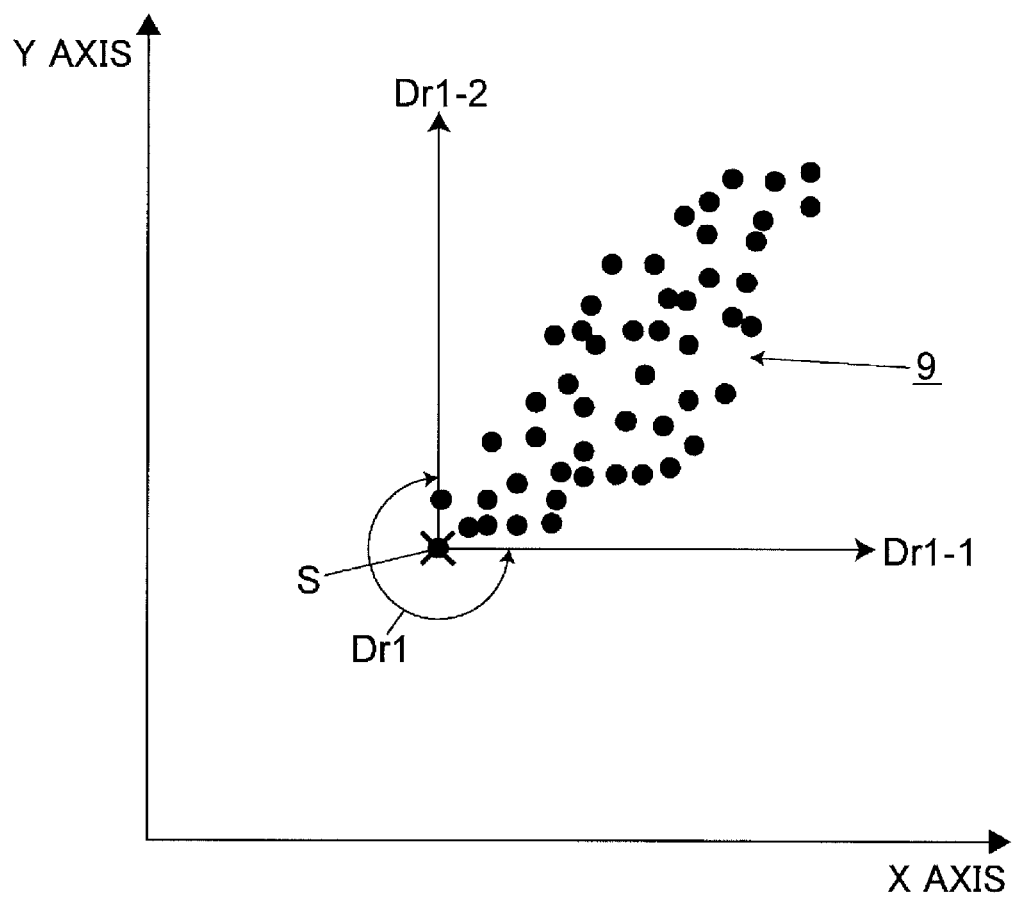
FIG. 34 is a drawing illustrating an example of a position of the first representative point selection reference point and a range of directions relative to the reference point.

For example, a case is described where, among plural of the data points of the data group to be determined in the XY coordinate system as illustrated in FIG. 34, the data point having the minimum X value and the minimum Y value is selected as the first representative point selection reference point S, and the coordinate value of the first representative point selection reference point S is (Sx, Sy). In this case, there is no data point in a range of X<Sx and a range of Y<Sy. Therefore, any direction to be set in the first representative point selecting step is in a directional range Dr1 between a direction Dr1-1 and a direction Dr1-2 in the clockwise direction, the direction Dr1-1 extending parallel to the X axis direction and toward the positive part (direction) of the X axis, the direction Dr1-2 rotated from the direction Dr1-1 around the first representative point selection reference point S and extending parallel to the Y axis direction and toward the positive part (direction) of the Y axis. Further, the directional range Dr1 includes the directions Dr1-1 and Dr1-2.

By positioning the first representative point selection reference point S at such a position, the data point inside the concentrated pattern defect distribution representative point area 11 finally defined may no longer be selected as the representative point in the representative point selection first step, the representative point selection second step, and the representative point selection third step. As a result, it may become possible to define the concentrated pattern defect distribution representative point area 11 expressing only the contour of the distribution area of the data points.

Further, the data point at the coordinate position of the first representative point selection reference point S is always selected as the representative point. Therefore, the data point may be set as the representative point before the representative point selection third step. By doing this, the representative point is selected as the representative point again in the representative point selection third step, and the selection process of selecting the representative points may be terminated. In this case, the data point at the coordinate position of the first representative point selection reference point S may be selected as the representative point at any time before the data point is selected as the representative point in the representative point selection third step.

Further, according to an embodiment of the present invention, as described above, the first representative point selection reference point S may be located at any position. Therefore, when any one of the data points of the data group to be determined is set as the first representative point selection reference point S, the position (coordinate value) of the first representative point selection reference point S is not limited to any of the positions (coordinate values) of the data points that are always to be selected as the representative points.

Further, in the above embodiment, a case is described where the representative point selection first step includes the first representative point selection reference point setting step and the first representative point selecting step. However, the representative point selection first step of the present invention is not limited to this configuration.

For example, in the representative point selection first step, any one of data points of the data group to be determined may be directly set as the first representative point. In this case, the representative point selection direction in the representative point selection second step is any one of the directions passing through the first representative point (initial reference point).

Further, in a case where the data points of the data group to be determined are expressed in (X, Y) of an orthogonal coordinate system or an oblique coordinate system, when any one of the data points that are always to be selected as the representative point is set as the first representative point in the representative point selection first step, and the representative point selection direction is set as the predetermined direction, it may become possible to finally define the concentrated pattern defect distribution representative point areas 11 expressing only the contour of the distribution area of the data points. In this case, (1) when the data point having the maximum X coordinate value is set as the first representative point, the predetermined direction is any one of the directions extending from the data point to the points having an X coordinate value greater than the maximum X coordinate value. (2) When the data point having the minimum X coordinate value is set as first representative point, the predetermined direction is any one of the directions extending from the data point to the points having an X coordinate value less than the maximum X coordinate value. (3) When the data point having the maximum Y coordinate value is set as first representative point, the predetermined direction is any one of the directions extending from the data point to the points having a Y coordinate value greater than the maximum Y coordinate value. (4) When the data point having the minimum Y coordinate value is set as first representative point, the predetermined direction is any one of the directions extending from the data point to the points having a Y coordinate value less than the maximum Y coordinate value. However, the data point to be selected as the first representative point and the representative point selection direction are not limited to the configuration described above.

For example, as illustrated in FIG. 34, when the data point having the minimum X coordinate value and the minimum Y coordinate value (i.e., the data point indicated by a symbol "S") is set as the first representative point, the representative point selection direction set in the representative point selection second step is any one of the directions in the directional range Dr1 between the direction Dr1-1 and the direction Dr1-2 in the clockwise direction, the direction Dr1-1 extending parallel to the X axis direction and toward the positive part (direction) of the X axis, the direction Dr1-2 rotated from the direction Dr1-1 around the first representative point selection reference point S and extending parallel to the Y axis direction and toward the positive part (direction) of the Y axis. In this case as well, the directional range Dr1 includes the directions Dr1-1 and Dr1-2.

Further, in a case where the data points of the data group to be determined are expressed in (r,θ) of a polar coordinate system, among the data group to be determined, the data point having the maximum r value is set as the first representative point in the representative point selection first step and any one of the directions extending in a range between −90 degrees and +90 degrees of the θ coordinate value of the data point of the first representative point in the representative point selection second step.

In the above embodiment, in the representative point selection second step and the representative point selection third step, the data point corresponding to the representative point selection data point direction having the minimum angle between the representative point selection direction and the representative point selection data point direction is selected. However, alternatively, the data point corresponding to the representative point selection data point direction having the maximum angle between the representative point selection direction and the representative point selection data point direction may be selected. In this case, in the representative point selection third step, any one of the directions extending in a range between a first direction and a second direction is selected, the first direction passing through the next reference point toward the last reference point, the second direction being rotated from the first direction in the rotation direction opposite to the rotation direction of the representative point selection direction by an angle of 180 degrees. Even in this case, it may become possible to define the concentrated pattern defect distribution representative point area 11 expressing only the contour of the distribution area of the data points.

According to an embodiment of the present invention, there is provided an identification method of identifying a data point distribution area on a coordinate plane. The identification method includes: a representative point selection first step of selecting any one of data points as a first representative point of a data point distribution area on a coordinate plane where data of a data group to be determined are expressed as points, the data group to be determined including plural data including two variables as a pair; a representative point selection second step of selecting one of a clockwise direction and a counterclockwise direction as a selection rotation direction, setting the first representative point as an initial reference point, setting any one of directions passing through the initial reference point as an initial representative point selection direction, from among a plurality of initial data point directions passing through the initial reference point and extending toward the data points, selecting the initial data point direction having a smallest angle relative to the initial representative point selection direction in the selection rotation direction when viewed from the initial representative point selection direction, and selecting a data point corresponding to the initial data point direction as a second representative point of the data point distribution area; a representative point selection third step of repeating processes including selecting a last representative point as a next reference point, the last representative point being either the second representative point or a representative point selected in this representative point selection third step and being selected last, setting a reference point as a last reference point, the reference point being used in selecting the last representative point, selecting any one of the directions extending in a range between a first direction and a second direction as a next representative point selection direction, the first direction passing through the next reference point and extending toward the last reference point, the second direction being rotated from the first direction in the selection rotation direction by an angle of 180 degrees, from among a plurality of next data point directions passing through the next reference point and extending toward the data points other than the last representative point, selecting the next data point direction having a smallest angle relative to the next representative point selection direction in the selection rotation direction when viewed from the next representative point selection direction, and selecting a next data point corresponding to the next data point direction as a next representative point of the data point distribution area; area; and a determination step of determining whether there is an overlapping area where a distribution representative point area overlaps a determination area, the distribution representative point area being defined by connecting the representative points with lines, the determination area being a specific area set on the coordinate plane, and determining, when determining that there is the overlapping area, that the data group to be determined is a relevant data group.

Herein, the coordinate plane may be any appropriate coordinate plane including, for example, an orthogonal coordinate plane, an oblique coordinate plane, and a polar coordinate plane.

Further, the representative point that is selected just before the initially selected representative point in the representative point selection third step is the second representative point selected in the representative point selection second step.

In the identification method of the embodiment of the present invention, the data group to be determined may be any one of pattern defect inspection result data, particle inspection result data, and wafer test result data in a semiconductor device manufacturing process. However, the data group to be determined is not limited to those data.

The identification method may further include a representative point information registration step of associating and registering information of the representative points acquired in the representative point selection first step, the representative point selection second step, and representative point selection third step with information to be used to identify the data group to be determined into a database. Further, the representative point information registration step may be performed before the determination step is performed, and in the determination step, it may be determined whether there is the overlapping area by reading the information of the representative points associated with the information to be used to identify the data group to be determined from the database.

Further, in the representative point information registration step, characteristic information may be associated with the information to be used to identify the data group to be determined and stored in the database, the characteristic information including a distribution range of the data point distribution area, a distribution range of the distribution representative point area, and at least one of an area, a roundness rate, and a data point distribution density of the distribution representative point area. Further in the determination step, after making a short list of the data groups to be determined based on the characteristic information, it may be determined whether there is the overlapping area.

Herein, the information indicating the distribution range of the data point distribution area is expressed by the maximum value and the minimum value in the X axis and the maximum value and the minimum value in the Y axis from among the XY coordinate values of the data points included in the data point distribution area or by the maximum r value, the minimum r value, the maximum θ value, and the minimum θ value of the data point distribution area of the polar coordinate values.

Further, the information indicating the distribution range of the distribution representative point area is expressed by the maximum value and the minimum value in the X axis and the maximum value and the minimum value in the Y axis from among the XY coordinate values of the data points included in the distribution representative point area or by the maximum r value, the minimum r value, the maximum θ value, and the minimum θ value of the distribution representative point area of the polar coordinate values.

Further, in the identification method of the embodiment of the present invention, in the determination step, it may be determined whether an area of the distribution representative point area is equal to or greater than a predetermined distribution representative point area threshold value, and when determining that the area of the distribution representative point area is less than the distribution representative point area threshold value, it may be determined that the data group to be determined is not the relevant data group.

This step of determining whether an area of the distribution representative point area is equal to or greater than a predetermined distribution representative point area threshold value may be performed before or after the step of determining whether there is the overlapping area.

Further, in the determination step, it may be further determined whether an area of the overlapping area is equal to or greater than a predetermined overlapping area threshold value, and when determining that the area of the overlapping area is equal to or greater than the overlapping area threshold value, it may be determined that the data group to be determined is the relevant data group.

Further, in the determination step, it may be further determined whether a ratio of an area of the overlapping area to an area of the determination area is equal to or greater than a predetermined first ratio threshold value, and when determining that the ratio of the area of the overlapping area to the area of the determination area is equal to or greater than the predetermined first ratio threshold value, it may be determined that the data group to be determined is the relevant data group.

Further, in the determination step, it may be further determined whether a ratio of an area of the overlapping area to an area of the distribution representative point area is equal to or greater than a predetermined second ratio threshold value, and when determining that the ratio of the area of the overlapping area to the area of the distribution representative point area is equal to or greater than the predetermined second ratio threshold value, it may be determined that the data group to be determined is the relevant data group.

Further, among the processes of determining whether an area of the distribution representative point area is equal to or greater than a predetermined distribution representative point area threshold value, the process of determining whether an area of the overlapping area is equal to or greater than a predetermined overlapping area threshold value, the process of determining whether a ratio of an area of the overlapping area to an area of the determination area is equal to or greater than a predetermined first ratio threshold value, and the process of determining whether a ratio of an area of the overlapping area to an area of the distribution representative point area is equal to or greater than a predetermined second ratio threshold value, some or all of the processes may be selected and performed.

In the identification method of the method of the present invention, as the method of selecting the first representative point in the representative point selection first step, any appropriate method may alternatively used. In the representative point selection first step, as the first representative point, any one of the data points may be directly selected, or any one of the data points may be indirectly selected through several steps.

As an example of the representative point selection first step having several steps, the representative point selection first step may include a first representative point selection reference point setting step of setting any one point on the coordinate plane as a first representative point selection reference point and a first representative point selecting step of selecting one of the clockwise direction and the counterclockwise direction as a first representative point selection rotation direction, setting any one of directions passing through the first representative point selection reference point as a first representative point selection direction, from among a plurality of first representative point selection data point directions passing through the first representative point selection reference point and extending toward the data points, selecting the first representative point selection data point direction having a smallest angle relative to the first representative point selection direction in the first representative point selection rotation direction when viewed from the first representative point selection direction, and selecting a data point corresponding to the first representative point selection data point direction as the first representative point.

Further, in this case, in the representative point selection second step, any one of the directions may be set as the initial representative point selection direction, the directions extending in a range between a third direction and a fourth direction, the third direction passing through the initial reference point and extending toward the first representative point selection reference point, the fourth direction being rotated from the third direction in the first representative point selection rotation direction by an angle of 180 degrees.

Further, in this case, the first representative point selection rotation direction in the first representative point selecting step may be the same as or opposite to the representative point selection data point direction in the representative point selection second step and the representative point selection third step.

When the representative point selection first step includes the first representative point selection reference point setting step and the first representative point selecting step, in the first representative point selection reference point setting step of the representative point selection first step, any one point in an area may be set as the first representative point selection reference point, the area being defined by connecting one data point to the rest of the data points with lines for each of the data points.

Further, in this case, in the representative point selection second step, the second representative point may be selected by setting the direction passing through the first representative point selection reference point and extending toward the initial reference point as the initial representative point selection direction, and in the representative point selection third step, the next representative point may be selected by setting the direction passing through the last reference point and extending toward the next reference point as the next representative point selection direction.

In this case, the first representative point selection direction in the representative point selection second step (i.e., the direction passing through the first representative point selection reference point and extending toward the initial reference point) is the direction rotated relative to the direction passing through the initial reference point and extending toward the first representative point selection reference point in the first representative point selection rotation direction by an angle of 180 degrees.

Further, the next representative point selection direction in the representative point selection third step (i.e., the direction passing through the last reference point and extending toward the next reference point) is the direction relative to the direction passing through the next reference point and extending toward the last reference point in the selection rotation direction by an angle of 180 degrees.

In an embodiment of the present invention, the area defined by connecting one data point to the rest of the data points with lines for each of the data points includes the area on the lines between data points. Further, in the present invention, it is not always necessary to obtain (define) the area. For example, when the first representative point selection reference point is located at the coordinate value of any of the data points, at the coordinate value on the lines between the data points, at the coordinate value within an area surrounded by three data points, it is not always necessary to obtain (define) the area.

Further, when the representative point selection first step includes the first representative point selection reference point setting step and the first representative point selecting step, the identification method may further include a determination center point setting step of setting a point as a determination center point, the point having a coordinate value different from the coordinate value of the first representative point selection reference point and being located in the area defined by connecting one data point to the rest of the data points with lines for each of the data points, the determination center point being used in determining a termination of a selecting process of selecting the representative points in the representative point selection third step.

In this case, in the representative point selection first step, the first representative point may be selected by setting a direction passing through the determination center point and extending toward the first representative point selection reference point as the first representative point selection direction, and in the representative point selection third step, the first representative point selection direction may be set as an initial determination direction, and the selecting process of selecting the next representative point may be terminated when determining that a determination direction passing through the determination center point and extending toward the representative point is rotated relative to the initial determination direction in the selection rotation direction by an angle of 360 degrees or more.

Further, in a case where the representative point selection first step includes the first representative point selection reference point setting step and the first representative point selecting step and when the data of the data group to be determined are expressed in (X, Y) of an orthogonal coordinate system or an oblique coordinate system, in the first representative point selection reference point setting step of the representative point selection first step, a coordinate value of one data point having at least one of the maximum value or the minimum value of X coordinate value and the maximum value or the minimum value of Y coordinate value among the data points of the data group to be determined may be set as the first representative point selection reference point.

In this case, in the first representative point selecting step of the representative point selection first step, (1) when the coordinate value of the data point having the maximum X coordinate value is set as the representative point selection reference point, the first representative point selection direction may be a direction extending from the coordinate value of a data point to a coordinate value having an X coordinate value greater than the maximum X coordinate value, (2) when the coordinate value of the data point having the minimum X coordinate value is set as the representative point selection reference point, the first representative point selection direction may be a direction extending from the coordinate value of a data point to a coordinate value having an X coordinate value less than the minimum X coordinate value, (3) when the coordinate value of the data point having the maximum Y coordinate value is set as the representative point selection reference point, the first representative point selection direction may be a direction extending from the coordinate value of data point to a coordinate value having a Y coordinate value greater than the maximum Y coordinate value, and (4) when the coordinate value of the data point having the minimum Y coordinate value is set as the representative point selection reference point, the first representative point selection direction may be a direction extending from the coordinate value of data point to a coordinate value having a Y coordinate value less than the minimum Y coordinate value.

Further, in the identification method of the embodiment of the present invention, when the data of the data group to be determined are expressed in (X, Y) of an orthogonal coordinate system or an oblique coordinate system, in the representative point selection first step, a coordinate value of one data point having at least one of the maximum value or the minimum value of X coordinate value and the maximum value or the minimum value of Y coordinate value among the data points of the data group to be determined may be set as the first representative point.

In this case, in the representative point selection second step, (1) when the coordinate value of a data point having the maximum X coordinate value is set as the initial reference point, the initial representative point selection direction may be a direction extending from the coordinate value of the data point to a coordinate value having an X coordinate value greater than the maximum X coordinate value, (2) when the coordinate value of a data point having the minimum X coordinate value is set as the initial reference point, the initial representative point selection direction may be a direction extending from the coordinate value of the data point to a coordinate value having an X coordinate value less than the minimum X coordinate value, (3) when the coordinate value of a data point having the maximum Y coordinate value is set as the initial reference point, the initial representative point selection direction may be a direction extending from the coordinate value of the data point to a coordinate value having a Y coordinate value greater than the maximum Y coordinate value, and (4) when the coordinate value of a data point having the minimum Y coordinate value is set as the initial reference point, the initial representative point selection direction may be a direction extending from the coordinate value of the data point to a coordinate value having a Y coordinate value less than the minimum Y coordinate value.

In the identification method of the embodiment of the present invention, the selection step of selecting the representative points in the representative point selection third step may be terminated at any appropriate timing. Namely, when the identification method includes the determination center point setting step, a case is described where the selection step of selecting the representative points is terminated when determining that a determination direction passing through the determination center point and extending toward the representative point is rotated relative to the initial determination direction in the selection rotation direction by an angle of 360 degrees or more. However, the present invention is not limited to this configuration. Namely, in the representative point selection third step, the termination timing of the selection step of selecting the representative points is not limited to the timing described above.

For example, in the representative point selection third step, the selecting process of selecting the next representative point may be terminated when a same data point is selected as the representative point again.

As another example, in the representative point selection third step, the selecting process of selecting the next representative point may be terminated when at least two data points are selected as the representative points again.

Further, in the identification method of the present invention, in the determination step, the distribution representative point area may be defined by sequentially connecting the representative points with lines in the selected order.

However, alternatively, the distribution representative point area may be defined by connecting one data point to the rest of the data points with lines for each of the data points.

Further, in the identification method of the embodiment of the present invention, in the representative point selection second step and the representative point selection third step, not the data point corresponding to the data point direction having the smallest angle but a data point corresponding to the data point direction having the greatest angle may be selected as the representative point.

In this case, in the representative point selection third step, any one of the directions extending in a range between a first direction and a second direction may be selected as the next representative point selection direction, the first direction passing through the next reference point and extending toward the last reference point, the second direction being rotated from the first direction in the direction opposite to the selection rotation direction by an angle of 180 degrees.

According to an embodiment of the present invention, there is provided a program encoded and stored in a computer readable format to cause a computer to execute the steps described above.

Further, according to an embodiment of the present invention, there is provided a non-transitory computer-readable recording medium, comprising a program encoded and stored in a computer readable format to cause a computer to execute the steps described above.

According to an embodiment of the present invention, there an identification method of identifying a data point distribution area on a coordinate plane, the identification method including the representative point selection first step, the representative point selection second step, and the representative point selection third step. By executing those step, it may become possible to select the representative points necessary for defining the contour of the data point distribution area when the data group to be determined is displayed on the coordinate plane, the data group to be determined including a plurality of data points having two variables as a pair. Further, the identification method of the embodiment of the present invention includes the determination step where it is determined whether there is the overlapping area where the distribution representative point area overlaps the determination area, the distribution representative point area being defined by connecting the representative points with lines, the determination area being a specific area set on the coordinate plane, and when determining that there is the overlapping area, it is determined that the data group to be determined is a relevant data group.

By doing in this way, it may become possible to determine whether the data point distribution area of the data group to be determined is distributed in a specific determination area while the data point distribution area is replaced by the distribution representative point area, in other words, while the amount of information indicating the data point distribution area is reduced.

In an identification method of the embodiment of the present invention, as the data group to be determined, when any one of pattern defect inspection result data, particle inspection result data, and wafer test result data in a semiconductor device manufacturing process is used, it may become possible to extract a lot having a wafer having a pattern defect distribution state, a particle (foreign matter) distribution state, a defective chip distribution state or the like, and estimate the cause of the failure derived from the manufacturing apparatus and the manufacturing process.

Further, the identification method of the embodiment of the present invention may further include a representative point information registration step of associating and registering information of the representative points acquired in the representative point selection first step, the representative point selection second step, and representative point selection third step with information to be used to identifying the data group to be determined into a database. Further, the representative point information registration step may be performed before the determination step is performed, and in the determination step, it is determined whether there is the overlapping area by reading the information of the representative points associated with the information to be used to identify the data group to be determined from the database.

By doing in this way, it may become possible to reduce the processing time because it becomes no longer necessary to separately perform the process of the representative point selection step to perform the determination step for the pattern defect inspection result data, particle inspection result data, wafer test result data and the like.

Further, in the representative point information registration step, characteristic information may be associated with the information to be used to identify the data group to be determined and stored in the database, the characteristic information including a distribution range of the data point distribution area, a distribution range of the distribution representative point area, and at least one of an area, a roundness rate, and a data point distribution density of the distribution representative point area; and in the determination step, after making a short list of the data groups to be determined based on the characteristic information, it may be determined whether there is the overlapping area. By doing in this way, it may become possible to reduce the processing time because the number of the data groups to be determined on which the determination process is to be performed may be reduced.

In the identification method of the embodiment of the present invention, in the determination step, it may be determined whether an area of the distribution representative point area is equal to or greater than a predetermined distribution representative point area threshold value, and when determining that the area of the distribution representative point area is less than the distribution representative point area threshold value, it may be determined that the data group to be determined is not the relevant data group. By doing this, when it is not desirable to determine that the data group to be determined has a small distribution representative point area and, furthermore, a small data point distribution area as the relevant data group, it may become possible to exclude the data group to be determined.

Further, by performing the determination step of determining whether an area of the distribution representative point area is equal to or greater than the predetermined distribution representative point area threshold value before performing the determination step of determining whether there is an overlapping area where the distribution representative point area overlaps the determination area, it may become possible to perform the determination step of determining whether there is an overlapping area for the data group to be determined that has a small distribution representative point area and that is to be excluded.

Further, in the determination step, it may be further determined whether an area of the overlapping area is equal to or greater than a predetermined overlapping area threshold value, and when determining that the area of the overlapping area is equal to or greater than the overlapping area threshold value, it may be determined that the data group to be determined is the relevant data group. By doing this, when it is not desirable to determine that the data group to be determined having a small overlapping area is the relevant data group, it may become possible to exclude the data group to be determined.

Further, in the determination step, it may be further determined whether a ratio of an area of the overlapping area to an area of the determination area is equal to or greater than a predetermined first ratio threshold value, and when determining that the ratio of the area of the overlapping area to the area of the determination area is equal to or greater than the predetermined first ratio threshold value, it may be determined that the data group to be determined is the relevant data group. By doing this, when it is not desirable to determine that the data group to be determined having a small ratio of the area of the overlapping area to the area of the determination area is the relevant data group, it may become possible to exclude the data group to be determined.

Further, in the determination step, it may be further determined whether a ratio of an area of the overlapping area to an area of the distribution representative point area is equal to or greater than a predetermined second ratio threshold value, and when determining that the ratio of the area of the overlapping area to the area of the distribution representative point area is equal to or greater than the predetermined second ratio threshold value, it may be determined that the data group to be determined is the relevant data group. By doing this, when it is not desirable to determine that the data group to be determined having a small ratio of the area of the overlapping area to the area of the distribution representative point area is the relevant data group, it may become possible to exclude the data group to be determined.

In the identification method of the embodiment of the present invention, when the representative point selection first step may include the first representative point selection reference point setting step of setting the first representative point selection reference point and the first representative point selecting step of selecting the first representative point selection rotation direction, it may become possible to select the first representative point by directly selecting any one of the data points.

Further, in the representative point selection second step, any one of the directions may be set as the initial representative point selection direction, the directions extending in a range between a third direction and a fourth direction, the third direction passing through the initial reference point and extending toward the first representative point selection reference point, the fourth direction being rotated from the third direction in the first representative point selection rotation direction by an angle of 180 degrees. By doing this, it may become possible to set the range for the initial representative point selection direction.

Further, in the first representative point selection reference point setting step of the representative point selection first step, any one point in an area may be set as the first representative point selection reference point, the area being defined by connecting one data point to the rest of the data points with lines for each of the data points; in the representative point selection second step, the second representative point may be selected by setting the direction passing through the first representative point selection reference point and extending toward the initial reference point as the initial representative point selection direction; and in the representative point selection third step, the next representative point may be selected by setting the direction passing through the last reference point and extending toward the next reference point as the next representative point selection direction. By doing this, even when any direction is set as the first representative point selection direction in the first representative point selection step, before the same data point is selected again in the representative point selection third step, it may become possible to select all the representative points necessary for defining the distribution representative point area corresponding to the contour of the data point distribution area. This method may be specifically effective in a case where the selection process of selecting the representative points is terminated when the same data point is selected again in the representation point selection third step as the representative point.

Further, in a case where the representative point selection first step includes the first representative point selection reference point setting step and the first representative point selecting step, and when the identification method may further include a determination center point setting step of setting a point as a determination center point, the point having a coordinate value different from the coordinate value of the first representative point selection reference point and being located in the area defined by connecting one data point to the rest of the data points with lines for each of the data points, the determination center point is used in determining a termination of a selecting process of selecting the representative points in the representative point selection third step. Further, in this case, in the representative point selection first step, the first representative point may be selected by setting a direction passing through the determination center point and extending toward the first representative point selection reference point as the first representative point selection direction; and, in the representative point selection third step, the first representative point selection direction may be set as an initial determination direction, and the selecting process of selecting the next representative point may be terminated when determining that a determination direction passing through the determination center point and extending toward the representative point is rotated relative to the initial determination direction in the selection rotation direction by an angle of 360 degrees or more. By doing this, it may become possible to determine when the selection step of selecting the representative points is terminated.

Further, in a case where the representative point selection first step includes the first representative point selection reference point setting step and the first representative point selecting step and when the data of the data group to be determined are expressed in (X, Y) of an orthogonal coordinate system or an oblique coordinate system, in the first representative point selection reference point setting step of the representative point selection first step, a coordinate value of one data point having at least one of the maximum value or the minimum value of X coordinate value and the maximum value or the minimum value of Y coordinate value among the data points of the data group to be determined is set as the first representative point selection reference point; and in the first representative point selecting step of the representative point selection first step, (1) when the coordinate value of the data point having the maximum X coordinate value is set as the representative point selection reference point, the first representative point selection direction may be a direction extending from the coordinate value of data point to a coordinate value having an X coordinate value greater than the maximum X coordinate value, (2) when the coordinate value of the data point having the minimum X coordinate value is set as the representative point selection reference point, the first representative point selection direction may be a direction extending from the coordinate value of data point to a coordinate value having an X coordinate value less than the minimum X coordinate value, (3) when the coordinate value of the data point having the maximum Y coordinate value is set as the representative point selection reference point, the first representative point selection direction may be a direction extending from the coordinate value of data point to a coordinate value having a Y coordinate value greater than the maximum Y coordinate value, and (4) when the coordinate value of the data point having the minimum Y coordinate value is set as the representative point selection reference point, the first representative point selection direction may be a direction extending from the coordinate value of data point to a coordinate value having a Y coordinate value less than the minimum Y coordinate value. By doing this, it may become possible to select only the representative points necessary for defining the distribution representative point area corresponding to the contour of the data point distribution area.

Further, in the identification method of the embodiment of the present invention, when the data of the data group to be determined are expressed in (X, Y) of an orthogonal coordinate system or an oblique coordinate system, in the representative point selection first step, a coordinate value of one data point having at least one of the maximum value or the minimum value of X coordinate value and the maximum value or the minimum value of Y coordinate value among the data points of the data group to be determined may be set as the first representative point, and in the representative point selection second step, (1) when the coordinate value of a data point having the maximum X coordinate value is set as the initial reference point, the initial representative point selection direction may be a direction extending from the coordinate value of the data point to a coordinate value having an X coordinate value greater than the maximum X coordinate value, (2) when the coordinate value of a data point having the minimum X coordinate value is set as the initial reference point, the initial representative point selection direction may be a direction extending from the coordinate value of the data point to a coordinate value having an X coordinate value less than the minimum X coordinate value, (3) when the coordinate value of a data point having the maximum Y coordinate value is set as the initial reference point, the initial representative point selection direction may be a direction extending from the coordinate value of the data point to a coordinate value having a Y coordinate value greater than the maximum Y coordinate value, and (4) when the coordinate value of a data point having the minimum Y coordinate value is set as the initial reference point, the initial representative point selection direction may be a direction extending from the coordinate value of the data point to a coordinate value having a Y coordinate value less than the minimum Y coordinate value. By doing this, it may become possible to select only the representative points necessary for defining the distribution representative point area corresponding to the contour of the data point distribution area.

Further, in the identification method of the embodiment of the present invention, in the representative point selection third step, the selecting process of selecting the next representative point may be terminated when a same data point is selected as the representative point again. By doing this, it may become possible to determine when the selection step of selecting the representative points in the representative point selection third step is terminated.

On the other hand, in a case where one of the representative points necessary for defining the distribution representative point region indicating the contour of the data point distribution area is selected as the first representative point in the representative point selection first step and when the representative point selection direction is set so as to cross the data point distribution area when viewed from the initial reference point (i.e., the first representative point) in the representative point selection second step, in the representative point selection third step, the data point of the first representative point may be selected again as the representative point before all the representative points necessary for defining the distribution representative point area corresponding to all the data points are selected. In this case, in the representative point selection third step, the selection process of selecting the next representative point is set to be terminated when the same representative point is selected as the representative point again, and it may become possible to define the distribution representative point area corresponding only to a part of the data points among plural of the data points included in the data group to be determined. Such a distribution representative point area may also be thought to represent the data point distribution area. However, it may be preferable that the distribution representative point area corresponds to the all the data points included in the data group to be determined.

To that end, in the representative point selection third step, the selecting process of selecting the next representative point may be terminated when at least two data points are selected as the representative points again. By doing this, in the representative point selection third step, even after the case as described above where the data point of the first representative point is selected again as the representative point in the representative point selection third step, the selection process of selecting the next representative point may be continued so that all the representative points may be selected that are necessary for defining an appropriate distribution representative point corresponding to all the data points included in the data group to be determined.

Further, in the representative point selection third step, the selection process of selecting the next representative points may be set to be terminated when two data points have been selected as the representative points again, and it may become possible to define an appropriate distribution representative point area. However, alternatively, the selection process of selecting the next representative points may be set to be terminated when three or more data points have been selected as the representative points again.

In the identification method of the embodiment of the present invention, in the determination step, the distribution representative point area may be defined by sequentially connecting the representative points with lines in the selected order.

However, even when the distribution representative point area is defined by connecting one data point to the rest of the data points with lines for each of the data points, the distribution representative point area corresponding to the data point distribution area may also be defined.

Further, in a case where the selection process of selecting the next representative point is determined to be terminated when the determination direction is rotated relative to the initial determination direction in the selection rotation direction by an angle of 360 degrees or more, there may be a case where the representative point initially selected is not the same as the last selected representative point. In this case, in the determination step, when the distribution representative point area is defined by sequentially connecting the representative points with lines in the selected order, the initially selected representative point may be connected to the last selected representative point with a line. By doing this, a closed distribution representative point area may be defined.

Further, in the identification method of the embodiment of the present invention, in the representative point selection second step and the representative point selection third step, not the data point corresponding to the data point direction having the smallest angle but a data point corresponding to the data point direction having the greatest angle may be selected as the representative point, and in the representative point selection third step, any one of the directions extending in a range between a first direction and a second direction may be selected as the next representative point selection direction, the first direction passing through the next reference point and extending toward the last reference point, the second direction being rotated from the first direction in the direction opposite to the selection rotation direction by an angle of 180 degrees. By doing this, it may become possible to express the contour of the data point distribution area by using the distribution representative point area.

According to an embodiment of the present invention, there is a program encoded and stored in a computer readable format to cause a computer to execute the steps described above. Therefore, by executing the program, it may become possible to perform the steps described above.

The present invention may also be applied to processes other than the processes performed on the information in semiconductor manufacturing. For example, the present invention may also be applied to detect an area having a specific shape in acquired image data.

A specific technical field where the present invention may be used is, for example, to detect an alignment mark of two-dimensional bar code and detect an alignment mark when sizes are measured in semiconductor manufacturing process.

As described above, the present invention may also be applied to processes other than the processes performed on the information in a semiconductor manufacturing.

The steps in the embodiments described above may be realized by creating a program for executing the steps and causing the computer to execute the created program.

Although the invention has been described with respect to specific embodiments for a complete and clear disclosure, the appended claims are not to be thus limited but are to be construed as embodying all modifications and alternative constructions that may occur to one skilled in the art that fairly fall within the basic teachings herein set forth.

For example, in the above description, a case is described where the representative point selection direction rotates in the clockwise direction. However, the representative point selection direction may rotate in the counterclockwise direction.

Further, the figures are used for the description of the embodiments of the present invention. However, the figures may not be always necessary in any of the steps. Namely, with the information of the determination area and the information of the data group of the plural data having two variables as a pair, the steps may be performed.

Further, in the above embodiment, the reference points, the determination center point, the representative point selection directions, the representative point selection data point directions and the like are described in the figures. However, in the step according to an embodiment of the present invention, it may not be always necessary to draw the figures.

Further, in the above embodiments, an XY orthogonal coordinate plane is used. However, in the present invention, any of the orthogonal coordinate plane, the oblique coordinate plane, and the polar coordinate plane may be used.

The present invention may also be used for identifying whether the data group is distributed in a specific area, the data group including plural data points having two variables as a pair.

What is claimed is:

1. A method performed by a computer executing a program of instructions embodied in non-transitory computer readable media, to identify a data point distribution area on a coordinate plane, the method comprising:
a representative point selection first step of selecting any one of data points as a first representative point of the data point distribution area on the coordinate plane where data of a data group to be determined are expressed as points, the data group to be determined including plural of the data points including two variables as a pair;
a representative point selection second step of selecting one of a clockwise direction and a counterclockwise direction as a selection rotation direction, setting the first representative point as an initial reference point, setting any one of directions passing through the initial reference point as an initial representative point selection direction, from among a plurality of initial data point directions passing through the initial reference point and extending toward the data points, selecting the initial data point direction having a smallest angle relative to the initial representative point selection direction in the selection rotation direction when viewed from the initial representative point selection direction, and selecting a data point corresponding to the initial data point direction as a second representative point of the data point distribution area;
a representative point selection third step of repeating processes including selecting a last representative point as a next reference point, the last representative point being either the second representative point or a representative point selected in this representative point selection third step and being selected last, setting a reference point as a last reference point, the reference point being used in selecting the last representative point, selecting any one of the directions extending in a range between a first direction and a second direction as a next representative point selection direction, the first direction passing through the next reference point and extending toward the last reference point, the second direction being rotated from the first direction in the selection rotation direction by an angle of 180 degrees, from among a plurality of next data point directions passing through the next reference point and extending toward the data points other than the last representative point, selecting the next data point direction having a smallest angle relative to the next representative point selection direction in the selection rotation direction when viewed from the next representative point selection direction, and selecting a next data point corresponding to the next data point direction as a next representative point of the data point distribution area; and
a determination step of determining whether there is an overlapping area where a distribution representative point area overlaps a determination area, the distribution representative point area being defined by connecting the representative points with lines, the determination area being a specific area set on the coordinate plane, and determining, when determining that there is the overlapping area, that the data group to be determined is a relevant data group.

2. The method according to claim 1, wherein
the data group to be determined is any one of pattern defect inspection result data, particle inspection result data, and wafer test result data in a semiconductor device manufacturing process.

3. The method according to claim 1, further comprising:
a representative point information registration step of associating and registering information of the representative points acquired in the representative point selection first step, the representative point selection second step, and representative point selection third step with information to be used to identify the data group to be determined into a database, wherein
the representative point information registration step is performed before the determination step is performed, and
in the determination step, it is determined whether there is the overlapping area by reading the information of the representative points associated with the information to be used to identify the data group to be determined from the database.

4. The method according to claim 3, wherein
in the representative point information registration step, characteristic information is associated with the information to be used to identify the data group to be determined and stored in the database, the characteristic information including a distribution range of the data point distribution area, a distribution range of the distribution representative point area, and at least one of an area, a roundness rate, and a data point distribution density of the distribution representative point area, and
in the determination step, after making a short list of the data groups to be determined based on the characteristic information, it is determined whether there is the overlapping area.

5. The method according to claim 1, wherein
in the determination step, it is determined whether an area of the distribution representative point area is equal to or greater than a predetermined distribution representative point area threshold value, and
when determining that the area of the distribution representative point area is less than the distribution representative point area threshold value, it is determined that the data group to be determined is not the relevant data group.

6. The method according to claim 1, wherein
in the determination step, it is further determined whether an area of the overlapping area is equal to or greater than a predetermined overlapping area threshold value, and
when determining that the area of the overlapping area is equal to or greater than the overlapping area threshold value, it is determined that the data group to be determined is the relevant data group.

7. The method according to claim 1, wherein
in the determination step, it is further determined whether a ratio of an area of the overlapping area to an area of the determination area is equal to or greater than a predetermined first ratio threshold value, and
when determining that the ratio of the area of the overlapping area to the area of the determination area is equal to or greater than the predetermined first ratio threshold value, it is determined that the data group to be determined is the relevant data group.

8. The method according to claim 1, wherein
in the determination step, it is further determined whether a ratio of an area of the overlapping area to an area of the distribution representative point area is equal to or greater than a predetermined second ratio threshold value, and
when determining that the ratio of the area of the overlapping area to the area of the distribution representative point area is equal to or greater than the predetermined second ratio threshold value, it is determined that the data group to be determined is the relevant data group.

9. The method according to claim 1, wherein
the representative point selection first step includes a first representative point selection reference point setting step of setting any one point on the coordinate plane as a first representative point selection reference point and a first representative point selecting step of selecting one of the clockwise direction and the counterclockwise direction as a first representative point selection rotation direction, setting any one of directions passing through the first representative point selection reference point as a first representative point selection direction, from among a plurality of first representative point selection data point directions passing through the first representative point selection reference point and extending toward the data points, selecting the first representative point selection data point direction having a smallest angle relative to the first representative point selection direction in the first representative point selection rotation direction when viewed from the first representative point selection direction, and selecting a data point corresponding to the first representative point selection data point direction as the first representative point, and
in the representative point selection second step, any one of the directions is set as the initial representative point selection direction, the directions extending in a range between a third direction and a fourth direction, the third direction passing through the initial reference point and extending toward the first representative point selection reference point, the fourth direction being rotated from the third direction in the first representative point selection rotation direction by an angle of 180 degrees.

10. The method according to claim 9, wherein
in the first representative point selection reference point setting step of the representative point selection first step, any one point in an area is set as the first representative point selection reference point, the area being defined by connecting one data point to the rest of the data points with lines for each of the data points,
in the representative point selection second step, the second representative point is selected by setting the direction passing through the first representative point selection reference point and extending toward the initial reference point as the initial representative point selection direction, and
in the representative point selection third step, the next representative point is selected by setting the direction passing through the last reference point and extending toward the next reference point as the next representative point selection direction.

11. The method according to claim 9, the identification method further comprising:
a determination center point setting step of setting a point as a determination center point, the point having a coordinate value different from the coordinate value of the first representative point selection reference point and being located in the area defined by connecting one data point to the rest of the data points with lines for each of the data points, the determination center point being used in determining a termination of a selecting process of selecting the representative points in the representative point selection third step, wherein
in the representative point selection first step, the first representative point is selected by setting a direction passing through the determination center point and extending toward the first representative point selection reference point as the first representative point selection direction, and
in the representative point selection third step, the first representative point selection direction is set as an initial determination direction, and the selecting process of selecting the next representative point is terminated when determining that a determination direction passing through the determination center point and extending toward the representative point is rotated relative to the initial determination direction in the selection rotation direction by an angle of 360 degrees or more.

12. The method according to claim 9, wherein
the data points of the data group to be determined are expressed in (X, Y) of an orthogonal coordinate system or an oblique coordinate system, in the first representative point selection reference point setting step of the representative point selection first step, a coordinate value of one of the data points having at least one of the maximum value or the minimum value of X coordinate value and the maximum value or the minimum value of Y coordinate value among the data points of the data group to be determined is set as the first representative point selection reference point, and in the first representative point selecting step of the representative point selection first step, (1) when the coordinate value of the data point having the maximum X coordinate value is set as the representative point selection reference point, the first representative point selection direction is a direction extending from the coordinate value of data point to a coordinate value having an X coordinate value greater than the maximum X coordinate value, (2) when the coordinate value of the data point having the minimum X coordinate value is set as the representative point selection reference point, the first representative point selection direction is a direction extending from the coordinate value of data point to a coordinate value having an X coordinate value less than the minimum X coordinate value, (3) when the coordinate value of the data point having the maximum Y coordinate value is set as the representative point selection reference point, the first representative point selection direction is a direction extending from the coordinate value of data point to a coordinate value having a Y coordinate value greater than the maximum Y coordinate value, and (4) when the coordinate value of the data point having the minimum Y coordinate value is set as the representative point selection reference point, the first representative point selection direction is a direction extending from the coordinate value of data point to a coordinate value having a Y coordinate value less than the minimum Y coordinate value.

13. The method according to claim 1, wherein the data points of the data group to be determined are expressed in (X, Y) of an orthogonal coordinate system or an oblique coordinate system, in the representative point selection first step, a coordinate value of one data point having at least one of the maximum value or the minimum value of X coordinate value and the maximum value or the minimum value of Y coordinate value among the data points of the data group to be determined is set as the first representative point, and in the representative point selection second step, (1) when the coordinate value of a data point having the maximum X coordinate value is set as the initial reference point, the initial representative point selection direction is a direction extending from the coordinate value of the data point to a coordinate value having an X coordinate value greater than the maximum X coordinate value, (2) when the coordinate value of a data point having the minimum X coordinate value is set as the initial reference point, the initial representative point selection direction is a direction extending from the coordinate value of the data point to a coordinate value having an X coordinate value less than the minimum X coordinate value, (3) when the coordinate value of a data point having the maximum Y coordinate value is set as the initial reference point, the initial representative point selection direction is a direction extending from the coordinate value of the data point to a coordinate value having a Y coordinate value greater than the maximum Y coordinate value, and (4) when the coordinate value of a data point having the minimum Y coordinate value is set as the initial reference point, the initial representative point selection direction is a direction extending from the coordinate value of the data point to a coordinate value having a Y coordinate value less than the minimum Y coordinate value.

14. The method according to claim 1, wherein in the representative point selection third step, the selecting process of selecting the next representative point is terminated when a same data point is selected as the representative point again.

15. The method according to claim 1, wherein in the representative point selection third step, the selecting process of selecting the next representative point is terminated when at least two data points are selected as the representative point again.

16. The method according to claim 1, wherein in the determination step, the distribution representative point area is defined by sequentially connecting the representative points with lines in the selected order.

17. The method according to claim 1, wherein in the representative point selection second step and the representative point selection third step, not the data point corresponding to the data point direction having the smallest angle but a data point corresponding to the data point direction having the greatest angle is selected as the representative point, and in the representative point selection third step, any one of the directions extending in the range between the first direction and the second direction is selected as the next representative point selection direction, the first direction passing through the next reference point and extending toward the last reference point, the second direction being rotated from the first direction in the direction opposite to the selection rotation direction by an angle of 180 degrees.

18. A non-transitory computer-readable recording medium, comprising a program encoded and stored in a computer readable format to cause a computer to perform a method for identifying a data point distribution area on a coordinate plane, the method comprising:

a representative point selection first step of selecting any one of data points as a first representative point of the data point distribution area on the coordinate plane where data of a data group to be determined are expressed as points, the data group to be determined including plural of the data points including two variables as a pair;

a representative point selection second step of selecting one of a clockwise direction and a counterclockwise direction as a selection rotation direction, setting the first representative point as an initial reference point, setting any one of directions passing through the initial reference point as an initial representative point selection direction, from among a plurality of initial data point directions passing through the initial reference point and extending toward the data points, selecting the initial data point direction having a smallest angle relative to the initial representative point selection direction in the selection rotation direction when viewed from the initial representative point selection direction, and selecting a data point corresponding to the initial data point direction as a second representative point of the data point distribution area;

a representative point selection third step of repeating processes including selecting a last representative point as a next reference point, the last representative point being either the second representative point or a representative point selected in this representative point selection third step and being selected last, setting a reference point as a last reference point, the reference point being used in selecting the last representative point, selecting any one of the directions extending in a range between a first direction and a second direction as a next representative point selection direction, the first direction passing through the next reference point and extending toward the last reference point, the second direction being rotated from the first direction in the selection rotation direction by an angle of 180 degrees, from among a plurality of next data point directions passing through the next reference point and extending toward the data points other than the last representative point, selecting the next data point direction having a smallest angle relative to the next representative point selection direction in the selection rotation direction when viewed from the next representative point selection direction, and selecting a next data point corresponding to the next data point direction as a next representative point of the data point distribution area; and a determination step of determining whether there is an overlapping area where a distribution representative point area overlaps a determination area the distribution representative point area being defined by connecting the representative points with lines, the determination area being a specific area set on the coordinate plane, and determining, when determining that there is the overlapping area that the data group to be determined is a relevant data group.

19. A method performed by a computer executing a program of instructions embodied in non-transitory computer readable media, to determine defective chips on a wafer, the method comprising:

a representative point selection first step of selecting any one of data points as a first representative point of a data point distribution area on a coordinate plane on a surface of the wafer, where data of a data group to be determined are expressed as points, the data group to be determined including plural of the data points including two variables as a pair;

a representative point selection second step of selecting one of a clockwise direction and a counterclockwise direction as a selection rotation direction, setting the first representative point as an initial reference point, setting any one of directions passing through the initial reference point as an initial representative point selection direction, from among a plurality of initial data point directions passing through the initial reference point and extending toward the data points, selecting the initial data point direction having a smallest angle relative to the initial representative point selection direction in the selection rotation direction when viewed from the initial representative point selection direction, and selecting a data point corresponding to the initial data point direction as a second representative point of the data point distribution area;

a representative point selection third step of repeating processes including selecting a last representative point as a next reference point, the last representative point being either the second representative point or a representative point selected in this representative point selection third step and being selected last, setting a reference point as a last reference point, the reference point being used in selecting the last representative point, selecting any one of the directions extending in a range between a first direction and a second direction as a next representative point selection direction, the first direction passing through the next reference point and extending toward the last reference point, the second direction being rotated from the first direction in the selection rotation direction by an angle of 180 degrees, from among a plurality of next data point directions passing through the next reference point and extending toward the data points other than the last representative point, selecting the next data point direction having a smallest angle relative to the next representative point selection direction in the selection rotation direction when viewed from the next representative point selection direction, and selecting a next data point corresponding to the next data point direction as a next representative point of the data point distribution area;

a determination step of determining whether there is an overlapping area where a distribution representative point area overlaps a determination area, the distribution representative point area being defined by connecting the representative points with lines, the determination area being a specific area set on the coordinate plane; and employing, in a case that the determination step determines that there is the overlapping area, the distribution representative point area in the process to determine defective chips on the wafer.

* * * * *